US009777213B2

(12) United States Patent
Hong et al.

(10) Patent No.: US 9,777,213 B2
(45) Date of Patent: Oct. 3, 2017

(54) PHOSPHOR, PHOSPHOR-CONTAINING COMPOSITION AND LIGHT-EMITTING UNIT USING PHOSPHOR, AND IMAGE DISPLAY DEVICE AND LIGHTING DEVICE USING LIGHT-EMITTING UNIT

(71) Applicant: MITSUBISHI CHEMICAL CORPORATION, Tokyo (JP)

(72) Inventors: Byungchul Hong, Kanagawa (JP); Atsushi Oishi, Kanagawa (JP)

(73) Assignee: MITSUBISHI CHEMICAL CORPORATION, Tokyo (JP)

( * ) Notice: Subject to any disclaimer, the term of this patent is extended or adjusted under 35 U.S.C. 154(b) by 187 days.

(21) Appl. No.: 14/751,789

(22) Filed: Jun. 26, 2015

(65) Prior Publication Data

US 2015/0291879 A1 Oct. 15, 2015

Related U.S. Application Data

(63) Continuation of application No. PCT/JP2013/084764, filed on Dec. 25, 2013.

(30) Foreign Application Priority Data

Dec. 26, 2012 (JP) ................................ 2012-283161
Mar. 7, 2013 (JP) ................................ 2013-045718
Mar. 26, 2013 (JP) ................................ 2013-064724

(51) Int. Cl.
*C09K 11/08* (2006.01)
*C09K 11/66* (2006.01)
*C09K 11/64* (2006.01)
*H01L 33/50* (2010.01)

(52) U.S. Cl.
CPC ............ *C09K 11/666* (2013.01); *C09K 11/64* (2013.01); *C09K 11/646* (2013.01); *H01L 33/502* (2013.01); *H01L 2224/48091* (2013.01); *H01L 2224/48247* (2013.01); *H01L 2924/181* (2013.01)

(58) Field of Classification Search
CPC ..... C09K 11/666; C09K 11/64; C09K 11/646; H10L 33/502; H10L 2224/48091; H10L 2224/48247; H10L 2924/181
See application file for complete search history.

(56) References Cited

U.S. PATENT DOCUMENTS

| | | | |
|---|---|---|---|
| 3,576,756 | A | 4/1971 | Russo |
| 7,497,973 | B2 | 3/2009 | Radkov et al. |
| 7,648,649 | B2 | 1/2010 | Radkov et al. |
| 2006/0169986 | A1 | 8/2006 | Radkov et al. |
| 2006/0169998 | A1 | 8/2006 | Radkov et al. |
| 2007/0114562 | A1 | 5/2007 | Radkov et al. |
| 2007/0205712 | A1 | 9/2007 | Radkov et al. |
| 2012/0261704 | A1 | 10/2012 | Meyer et al. |
| 2012/0305972 | A1 | 12/2012 | Meyer et al. |
| 2013/0264937 | A1 | 10/2013 | Sakuta et al. |
| 2015/0372199 | A1 | 12/2015 | Meyer et al. |

FOREIGN PATENT DOCUMENTS

| | | | |
|---|---|---|---|
| CN | 102782086 | A | 11/2012 |
| CN | 102827601 | A | 12/2012 |
| JP | 63-239156 | A | 10/1988 |
| WO | WO 2007/100824 | A2 | 9/2007 |
| WO | WO 2011/073871 | * | 6/2011 |
| WO | WO 2011/073871 | A2 | 6/2011 |
| WO | WO 2012/050199 | A1 | 4/2012 |

OTHER PUBLICATIONS

Combined Chinese Office Action and Search Report issued Apr. 5, 2016 in Patent Application No. 201380068143.X (with English language translation and English translation of categories of cited documents).
International Search Report issued in PCT/JP2013/084764, mailed Feb. 18, 2014, with English translation, 4 pp.
B. Di Bartolo, et al., "Nonradiative energy transfer without lifetime quenching in doped Mn-based crystals", Physical Review B, Apr. 15, 1987, vol. 35, No. 12, 6386-6394.
Office Action issued Dec. 15, 2016 in Chinese Patent Application No. 201380068143.X (with English language translation).

* cited by examiner

*Primary Examiner* — Carol M Koslow
(74) *Attorney, Agent, or Firm* — Oblon, McClelland, Maier & Neustadt, L.L.P.

(57) ABSTRACT

The phosphor of the present invention comprises a crystal phase having a chemical composition represented by the following formula [2], the crystal phase having no garnet structure, and the phosphor having an emission peak in a wavelength range of 600 nm to 650 nm by being activated by at least $Mn^{4+}$, $$A^2_{aii}B^2_{bii}C^2_{cii}D^2_{dii}X^2_{xii} \quad \text{formula [2].}$$

18 Claims, 14 Drawing Sheets

PHOSPHOR, PHOSPHOR-CONTAINING COMPOSITION AND LIGHT-EMITTING UNIT USING PHOSPHOR, AND IMAGE DISPLAY DEVICE AND LIGHTING DEVICE USING LIGHT-EMITTING UNIT

TECHNICAL FIELD

The present invention relates to a phosphor that emit red fluorescence, a method of production thereof, a phosphor-containing composition and a light-emitting unit using the phosphor, and an image display device and a lighting device using the light-emitting unit.

BACKGROUND ART

A white light-emitting unit configured to include a GaN (gallium nitride) semiconductor light-emitting device (hereinafter, “semiconductor light-emitting device” also will be referred to as “LED”) coupled to a wavelength conversion material phosphor has attracted interest as a light source of image display devices and lighting devices for its low power consumption and long life. A representative example of such a light-emitting unit is a white light-emitting unit that uses an InGaN blue LED in combination with a Ce-activated yttrium-aluminum-garnet yellow phosphor.

Such white light-emitting units have potential use in novel applications such as in display backlights, and there has been research and development of phosphors for use with semiconductor light-emitting devices.

For example, Patent Literature 1 discloses an oxide phosphor activated with $Mn^{4+}$. Patent Literatures 2 to 5 disclose $Mn^{4+}$-activated fluorine-containing phosphors, and light-emitting units in which these phosphors are coupled to a semiconductor light-emitting device. The fluorine-containing phosphors exemplified in Patent Literatures 2 to 5 basically contain monovalent alkali metal ions, and trivalent, tetravalent, or pentavalent ions as the coordination center metal ions of fluoride ions.

CITATION LIST

Patent Literature

PTL 1: JP-A-2011-36303
PTL 2: U.S. Pat. No. 3,576,756
PTL 3: U.S. Pat. No. 7,497,973
PTL 4: U.S. Pat. No. 7,648,649
PTL 5: WO2011/073871

SUMMARY OF INVENTION

Technical Problem

The oxide phosphor of Patent Literature 1 has an emission wavelength of 700 nm or more, too long to provide a good luminosity factor. The luminance is accordingly very low, and there is no practicality as a red phosphor. Generally, the luminosity factor severely deteriorates in a wavelength region of 650 nm or more, and red phosphors with the main emission wavelengths in a wavelength region of 650 nm or more lack practicality. The luminescence of phosphors having the main emission wavelengths in a wavelength region of 600 nm or less is typically perceived as orange, not red. Such phosphors are thus of very poor quality in terms of red color purity, and lack practicality as red phosphors.

The $Mn^{4+}$-activated fluorine-containing phosphors described in Patent Literatures 2 to 5 have the main emission wavelengths between 600 and 650 nm, and attracted interest as red phosphors with high color purity. However, studies by the present inventors revealed that the high alkali metal ion content lowers waterfastness, and tends to deteriorate the phosphors over time, making the products unusable in practical applications.

In order to realize a practically usable light-emitting unit with a $Mn^{4+}$-activated fluorine-containing phosphor, it is desirable to improve the waterfastness of the $Mn^{4+}$-activated fluorine-containing phosphor.

The present invention has been made in view of these problems, and it is an object of the invention to provide a red phosphor of excellent luminescence characteristics having a main emission wavelength in a wavelength region that provides a desirable luminosity factor, specifically a halogen-containing phosphor that excels in waterfastness and long time durability. The invention is also intended to provide phosphor-containing compositions and a light-emitting unit using the phosphor, and an image display device and a lighting device using the light-emitting unit.

Solution to Problem

In view of these problems, the present inventors conducted detailed studies of compositions of halogen-containing phosphors. The studies found that solubility to water can be reduced, and waterfastness and time-dependent deterioration can improve when the phosphors contain large numbers of alkaline earth metal elements, and Group 13 elements such as Al. The present invention was completed on the basis of this finding. The invention is also based on the finding that the phosphors can preferably be used for applications such as in display devices and lighting devices.

The gist of the present invention resides in the following (1) to (18).

(1) A phosphor comprising a crystal phase having a chemical composition represented by the following formula [1], and having an emission peak in a wavelength range of 600 nm to650 nm, $$A_aB_bC_cD_dX_x:R \qquad \text{formula [1],}$$

wherein

A represents one or more alkali metal elements,

B represents one or more alkaline earth metal elements,

C represents one or more elements selected from the group consisting of Group 3 elements and Group 13 elements of the periodic table, D represents one or more elements selected from the group consisting of Group 4 elements and Group 14 elements of the periodic table, X represents one or more halogen elements that include at least F, R represents an element that includes at least a tetravalent Mn, and a, b, c, d, and x each represent a number that satisfies $0<a<2$, $0<b<1$, $0<c<1$, $0<d\leq1$, $0.8\leq c+d\leq1.2$, and $5.0\leq x\leq7.0$.

(2) A phosphor comprising a crystal phase having a chemical composition represented by the following formula [2], the crystal phase having no garnet structure, and the phosphor having an emission peak in a wavelength range of 600 nm to 650 nm by being activated by at least $Mn^{4+}$, $$A^2{}_{aii}B^2{}_{bii}C^2{}_{cii}D^2{}_{dii}X^2{}_{xii} \qquad \text{formula [2],}$$

wherein
$A^2$ represents one or more alkali metal elements,
$B^2$ represents one or more alkaline earth metal elements,
$C^2$ represents one or more elements selected from the group consisting of Group 3 elements and Group 13 elements of the periodic table,
$D^2$ represents one or more elements selected from the group consisting of Group 4 elements and Group 14 elements of the periodic table,
$X^2$ represents one or more halogen elements, and
aii, bii, cii, dii, and xii each represent a number that satisfies $0 \leq aii < 1$, $0 < bii < 1$, $0 < cii < 1$, $0 \leq dii < 1$, $0 < xii < 1$, and $aii+bii+cii+dii+xii=1$.

(3) The phosphor according to the (2) above, wherein the ratio (Z2/Z8) of the number (Z2) of the alkaline earth metal elements contained as $B^2$ with respect to the total number (Z8) of elements contained in the phosphor is 0.05 or more, and wherein the ratio (Z3/Z8) of the number (Z3) of the elements $C^2$ with respect to the total number (Z8) of elements contained in the phosphor is 0.02 or more.

(4) The phosphor according to the (2) or (3) above, wherein $B^2$ is one or more elements selected from the group consisting of Mg, Ca, Sr, and Ba,
$C^2$ is one or more elements selected from the group consisting of Al, Ga, In, Sc, and Y, and
$X^2$ is one or more halogen elements that include at least F.

(5) The phosphor according to any one of the (2) to (4) above,
wherein $C^2$ is one or more elements that include at least Al, and
the ratio (Z4/Z8) of the number (Z4) of Al elements contained as $C^2$ with respect to the total number (Z8) of elements contained in the phosphor is 0.01 or more.

(6) A phosphor comprising a crystal phase having a chemical composition represented by the following formula [3], the crystal structure having no garnet structure, and the phosphor having an emission peak in a wavelength range of 600 nm to 650 nm, $$A^3_{aiii}B^3_{biii}C^3_{ciii}D^3_{diii}X^3_{xiii}Y^3_{diii}:R^3 \quad \text{formula [3],}$$

wherein
$A^3$ represents one or more alkali metal elements,
$B^3$ represents one or more alkaline earth metal elements,
$C^3$ represents one or more elements selected from the group consisting of Group 3 elements and Group 13 elements of the periodic table,
$D^3$ represents one or more elements selected from the group consisting of Group 4 elements and Group 14 elements of the periodic table,
$X^3$ represents one or more halogen elements that include at least F,
$Y^3$ represents one or more Group 16 elements of the periodic table,
$R^3$ represents an element that includes at least a tetravalent Mn, and
aiii, biii, ciii, diii, and xiii each represent a number that satisfies $0.8 \leq aiii \leq 1.2$, $0.8 \leq biii \leq 1.2$, $0 \leq ciii \leq 1.2$, $0 \leq diii \leq 1$, $0.8 \leq ciii+diii \leq 1.2$, $5.0 \leq xiii \leq 7.0$, and $5.0 \leq xiii+diii \leq 7.0$.

(7) The phosphor according to the (6) above,
wherein $A^3$ is one or more elements selected from the group consisting of Li, Na, K, Rb, and Cs,
$B^3$ is one or more elements selected from the group consisting of Mg, Ca, Sr, and Ba,
$C^3$ is one or more elements selected from the group consisting of Al, Ga, In, Sc, and Y, and
$X^3$ is one or more halogen elements that include at least F.

(8) The phosphor according to the (6) or (7) above,
wherein $D^3$ is one or more elements selected from the group consisting of Ti, Zr, Hf, Si, Ge, and Sn, and
$Y^3$ includes at least O.

(9) The phosphor according to the (6) above, wherein the chemical composition represented by the formula [3] is represented by the following formula [4], $$(A^4_{aiv}B^4_{biv})_2(C^4_{civ}D^4_{div}E^4_{eiv})_2(X^4_{xiv}Y^4_{yiv})_7:R^4 \quad \text{formula [4]}$$

wherein
$A^4$ represents one or more alkali metal elements,
$B^4$ represents one or more alkaline earth metal elements,
$C^4$ represents one or more alkaline earth metal elements different from $B^4$,
$D^4$ represents one or more elements selected from the group consisting of Group 3 elements and Group 13 elements of the periodic table,
$E^4$ represents one or more elements selected from the group consisting of Group 4 elements and Group 14 elements of the periodic table,
$X^4$ represents one or more halogen elements that include at least F,
$Y^4$ represents one or more Group 16 elements of the periodic table,
$R^4$ represents an element that includes at least a tetravalent Mn, and
aiv, biv, civ, div, eiv, xiv, and yiv each represent a number that satisfies $0 < aiv \leq 2.0$, $0 \leq biv \leq 1.0$, $0 < aiv+biv \leq 2.5$, $0 < civ \leq 2.0$, $0 < div \leq 2.0$, $0 \leq eiv \leq 1.0$, $0.5 \leq civ+div+eiv \leq 2.5$, $0 < xiv \leq 2.0$, $0 \leq yiv \leq 1.0$, and $0.5 \leq xiv+yiv \leq 2.5$.

(10) The phosphor according to the (9) above,
wherein $A^4$ is one or more elements selected from the group consisting of Li, Na, K, Rb, and Cs,
$B^4$ is an element that mainly includes one or more selected from the group consisting of Ca, Sr, and Ba,
$C^4$ is an element that mainly includes Mg,
$D^4$ is one or more elements selected from the group consisting of Al, Ga, In, Sc, and Y, and
$X^4$ is one or more halogen elements that include at least F.

(11) The phosphor according to the (9) or (10) above, wherein $C^4$ is Mg.

(12) The phosphor according to any one of the (9) to (11) above,
wherein $E^4$ is one or more elements selected from the group consisting of Ti, Zr, Hf, Si, Ge, and Sn, and
$Y^4$ includes at least O.

(13) The phosphor according to any one of the (10) to (13) above, wherein the phosphor comprises a crystal phase having a pyrochlore structure.

(14) A phosphor-containing composition comprising the phosphor of any one of the (1) to (13) above, and a liquid medium.

(15) A light-emitting unit comprising a first illuminant, and a second illuminant that emits visible light upon exposure to light from the first illuminant,
wherein the second illuminant contains a first phosphor that includes one or more of the phosphor of any one of the (1) to (13) above.

(16) The light-emitting unit according to the (15) above, wherein the second illuminant contains a second phosphor that includes one or more phosphors having an emission peak wavelength different from the emission peak wavelength of the first phosphor.

(17) A lighting device comprising the light-emitting unit of the (15) or (16) above.

(18) An image display device comprising the light-emitting unit of the (15) or (16) above.

Advantageous Effects of Invention

The present invention enables improving the waterfastness and durability of a fluorine-containing phosphor while maintaining the practical color purity and luminance.

The phosphor of the present invention can be used to provide a high-efficiency and high-color-rendering light-emitting unit, image display device, and lighting device.

DESCRIPTION OF EMBODIMENTS

Figure 1:
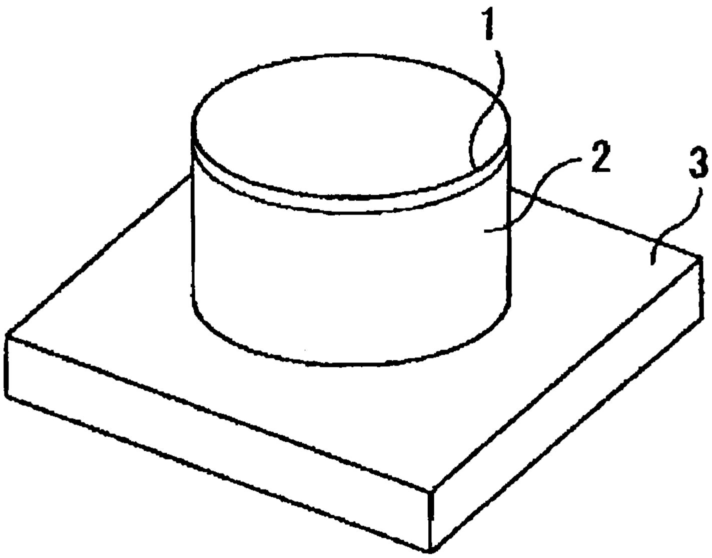
FIG. 1 is a schematic perspective view representing an embodiment of a semiconductor light-emitting unit of the present invention.

Embodiments of the present invention are described below in detail. It should be noted, however, that the present invention is not limited by the following embodiments, and may be implemented in various modifications within the scope of the invention.

As used herein, numerical ranges with the preposition "to" are intended to be inclusive of the numbers defining the lower and upper limits of the ranges. The periodic table as used herein means the long form periodic table.

In the phosphor composition formulae used herein, a plurality of elements given with commas in brackets are intended to mean that the elements may be contained either alone or in any combination and composition of two or more. For example, the composition formula (Ca,Sr,Ba) $Al_2O_4$:Eu is intended to encompass $CaAl_2O_4$:Eu, $SrAl_2O_4$:Eu, $BaAl_2O_4$:Eu, $Ca_{1-x}Sr_xAl_2O_4$:Eu, $Sr_{1-x}Ba_xAl_2O_4$:Eu, $Ca_{1-x}Ba_xAl_2O_4$:Eu, and $Ca_{1-x-y}Sr_xBa_yAl_2O_4$:Eu. (In the formulae, $0<x<1$, $0<y<1$, $0<x+y<1$.)

As used herein, "tetravalent Mn" and "$Mn^{4+}$" are synonymous with each other.

In the following, a phosphor containing a crystal phase of a chemical composition Represented by formula [1] will be referred to as "phosphor [1] of the present invention." Phosphors with other formula numbers will be referred to in an analogous manner. When referring to the phosphors of the present invention as a whole, the phosphors will be collectively referred to as "phosphor of the present invention".

[1. Phosphor]

[1-1. Phosphor Composition]

(Phosphor of Formula [1])

The phosphor of the present invention contains a crystal phase of a chemical composition represented by the following formula [1], and has an emission peak in a 600 nm to 650 nm wavelength range (hereinafter, the phosphor also will be referred to as "phosphor [1] of the present invention"), $$A_aB_bC_cD_dX_x{:}R \quad \text{formula [1],}$$

wherein

A represents one or more alkali metal elements,

B represents one or more alkaline earth metal elements,

C represents one or more elements selected from the group consisting of Group 3 elements and Group 13 elements of the periodic table, D represents one or more elements selected from the group consisting of Group 4 elements and Group 14 elements of the periodic table, X represents one or more halogen elements that include at least F, R represents an element that includes at least a tetravalent Mn, and a, b, c, d, and x represent numbers that satisfy $0<a<2$, $0<b<1$, $0<c<1$, $0<d\leq1$, $0.8\leq c+d\leq1.2$, and $5.0\leq x\leq7.0$.

The phosphor particle of the phosphor [1] of the present invention has a chemical composition represented by the formula [1]. As used herein, "phosphor particle" means a single particle.

In the formula [1], A represents at least one monovalent element selected from alkali metal elements. As used herein, alkali metal elements are Li, Na, K, Rb, Cs, and Fr, preferably Li, Na, K, Rb, and Cs. Element A may contain these alkali metal elements either alone or in a combination of two or more in any proportions. Element A may be partly substituted with an $NH_4$ group, provided that such substitution is not detrimental to the luminescence characteristics. Preferably, at least Li, Na, or K is contained as element A.

In the formula [1], B represents at least one bivalent element selected from alkaline earth metal elements. As used herein, alkaline earth metal elements are Mg, Ca, Sr, Ba, and Ra, preferably Mg, Ca, Sr, and Ba, particularly preferably Sr, Ca, and Ba. Element B may contain these alkali metal elements either alone or in a combination of two or more in any proportions.

In the formula [1], C represents at least one trivalent element selected from the group consisting of Group 3 elements and Group 13 elements of the periodic table. As used herein, the group consisting of Group 3 elements and Group 13 elements of the periodic table means Sc, Y, La, rare-earth elements, B, Al, Ga, and In. Element C contains preferably at least Al, Ga, In, Sc, or Y, more preferably Al, Ga, or Y, further preferably Al or Y, particularly preferably at least Al. Element C may contain Al either alone or in combination with elements other than Al in any proportions. The proportion of Al in element C is preferably 50 mol % or more, more preferably 70 mol % or more, further preferably 90 mol % or more.

In the formula [1], D represents at least one tetravalent element selected from the group consisting of Group 4 elements and Group 14 elements of the periodic table. As used herein, the group consisting of Group 4 elements and Group 14 elements of the periodic table means Ti, Zr, Hf, C, Si, Ge, Sn, and Pb. Element D may contain these elements either alone or in a combination of two or more in any proportions. Preferably, Ti, Si, or Ge is contained as element D.

In the formula [1], X represents one or more halogen elements that include at least F. As used herein, halogen elements other than F mean Cl, Br, and I. Element X may contain F either alone or in combination with elements other than F in any proportions. Element X may be partly substituted with an OH group, provided that such substitution is not detrimental to the luminescence characteristics. The proportion of F in element X is preferably 50 mol % or more, more preferably 70 mol % or more, further preferably 90 mol % or more.

R represents an element that includes at least a tetravalent Mn. The tetravalent Mn is an activating element that resides in the crystals by typically substituting element C or D. Other than the tetravalent Mn, R may contain Cu and Zn. The content of Cu or Zn other than the tetravalent Mn is not particularly limited, as long as it is not detrimental to the luminescence characteristics. The Cu or Zn content is preferably at most about the same as the content of the tetravalent Mn because a heterophase of a chemical composition different from the phosphor of the present invention tends to increase when the Cu or Zn content is excessively high.

More specifically, the concentration of the activating element (activating ion) $Mn^{4+}$ in the phosphor [1] of the present invention is typically 0.01 mol % or more, preferably 0.05 mol % or more, further preferably 1 mol % or more, particularly preferably 3 mol % or more, and is typically 50 mol % or less, preferably 40 mol % or less, further preferably 30 mol % or less, particularly preferably 20 mol % or less with respect to the total of the substituted elements C and D.

Concentration quenching is unlikely to occur, and a heterophase of a chemical composition different from the phosphor of the present invention does not easily generate in these concentration ranges, and these ranges are preferable in terms of providing desirable luminescence characteristics.

In the formula [1], "a" represents the molar ratio of element A (one or more alkali metal elements). The subscript "a" is a number that satisfies $0<a<2$, and is preferably 1.70 or more, more preferably 1.80 or more, and is preferably 1.95 or less, more preferably 1.90 or less, particularly preferably 1.85 or less.

In the formula [1], "b" represents the molar ratio of element B (one or more alkaline earth metal elements). The subscript "b" is a number that satisfies $0<b<1$, and is preferably 0.05 or more, more preferably 0.10 or more, further preferably 0.15 or more, and is preferably 0.50 or less, more preferably 0.40 or less, particularly preferably 0.30 or less.

In the formula [1], "c" represents the molar ratio of element C (one or more elements selected from the group consisting of Group 3 elements and Group 13 elements of the periodic table). The subscript "c" is a number that satisfies $0<c<1$, and is preferably0.05 or more, more preferably 0.10 or more, and is preferably 0.50 or less, more preferably 0.40 or less.

In the formula [1], "d" represents the molar ratio of element D (one or more elements selected from the group consisting of Group 4 elements and Group 14 elements of the periodic table). The subscript "d" is a number that satisfies $0<d\leq1$, and is preferably 0.50 or more, more preferably 0.60 or more, further preferably 0.80 or more, particularly preferably 0.85 or more, most preferably 0.88 or more, and is preferably 0.995 or less, more preferably 0.95 or less, further preferably 0.90 or less.

The numbers c and d falling in the foregoing ranges satisfy $0.8\leq c+d\leq1.2$, and are preferably 0.85 or more, more preferably 0.90 or more, and are preferably 1.15 or less, more preferably 1.10 or less, further preferably 1.05 or less.

These ranges are preferable in terms of providing excellent luminescence characteristics and improving waterfastness.

In the formula [1], "x" represents the molar ratio of element X (one or more halogen elements that include at least F). The subscript "x" is a number that satisfies $5\leq x\leq7$, and is preferably 5.5 or more, more preferably 5.8 or more, and is preferably 6.5 or less, more preferably 6.2 or less, particularly preferably 6.1 or less.

The following are specific examples of the preferred phosphors represented by formula [1] of the present invention. The present invention, however, is not limited to the following.

$Li_{1.5}Mg_{0.5}Al_{0.5}Si_{0.5}F_6$, $Li_{1.95}Mg_{0.05}Al_{0.05}Si_{0.95}F_6$, $Li_{1.5}Ca_{0.5}Al_{0.5}Si_{0.5}F_6$, $Li_{1.95}Ca_{0.05}Al_{0.05}Si_{0.95}F_6$, $Li_{1.5}Sr_{0.5}Al_{0.5}Si_{0.5}F_6$, $Li_{1.95}Sr_{0.05}Al_{0.05}Si_{0.95}F_6$, $Li_{1.5}Ba_{0.5}Al_{0.5}Si_{0.5}F_6$, $Li_{1.95}Ba_{0.05}Al_{0.05}Si_{0.95}F_6$, $Na_{1.5}Mg_{0.5}Al_{0.5}Si_{0.5}F_6$, $Na_{1.95}Mg_{0.05}Al_{0.05}Si_{0.95}F_6$, $Na_{1.5}Ca_{0.5}Al_{0.05}Si_{0.5}F_6$, $Na_{1.95}Ca_{0.05}Al_{0.05}Si_{0.95}F_6$, $Na_{1.5}Sr_{0.5}Al_{0.5}Si_{0.5}F_6$, $Na_{1.95}Sr_{0.05}Al_{0.05}Si_{0.95}F_6$, $Na_{1.5}Ba_{0.5}Al_{0.5}Si_{0.5}F_6$, $Na_{1.95}Ba_{0.05}Al_{0.05}Si_{0.95}F_6$, $K_{1.5}Mg_{0.5}Al_{0.5}Si_{0.5}F_6$, $K_{1.95}Mg_{0.05}Al_{0.05}Si_{0.95}F_6$, $K_{1.5}Ca_{0.5}Al_{0.5}Si_{0.5}F_6$, $K_{1.95}Ca_{0.05}Al_{0.05}Si_{0.95}F_6$, $K_{1.5}Sr_{0.5}Al_{0.5}Si_{0.5}F_6$, $K_{1.95}Sr_{0.05}Al_{0.05}Si_{0.95}F_6$, $K_{1.5}Ba_{0.5}Al_{0.5}Si_{0.5}F_6$, $K_{1.95}Ba_{0.05}Al_{0.05}Si_{0.95}F_6$, $Rb_{1.5}Mg_{0.5}Al_{0.5}Si_{0.5}F_6$, $Rb_{1.95}Mg_{0.05}Al_{0.05}Si_{0.95}F_6$, $Rb_{1.5}Ca_{0.5}Al_{0.5}Si_{0.5}F_6$, $Rb_{1.95}Ca_{0.05}Al_{0.05}Si_{0.95}F_6$, $Rb_{1.5}Sr_{0.5}Al_{0.5}Si_{0.5}F_6$, $Rb_{1.95}Sr_{0.05}Al_{0.05}Si_{0.95}F_6$, $Rb_{1.5}Ba_{0.5}Al_{0.5}Si_{0.5}F_6$, $Rb_{1.95}Ba_{0.05}Al_{0.05}Si_{0.95}F_6$, $Cs_{1.5}Mg_{0.5}Al_{0.5}Si_{0.5}F_6$, $Cs_{1.95}Mg_{0.05}Al_{0.05}Si_{0.95}F_6$, $Cs_{1.5}Ca_{0.5}Al_{0.5}Si_{0.5}F_6$, $Cs_{1.95}Ca_{0.05}Al_{0.05}Si_{0.95}F_6$, $Cs_{1.5}Sr_{0.5}Al_{0.5}Si_{0.5}F_6$, $Cs_{1.95}Sr_{0.05}Al_{0.05}Si_{0.95}F_6$, $Cs_{1.5}Ba_{0.5}Al_{0.5}Si_{0.5}F_6$, $Cs_{1.95}Ba_{0.05}Al_{0.05}Si_{0.95}F_6$, $Li_{1.5}Mg_{0.5}Al_{0.5}Ge_{0.5}F_6$, $Li_{1.95}Mg_{0.05}Al_{0.05}Ge_{0.95}F_6$, $Li_{1.5}Ca_{0.5}Al_{0.5}Ge_{0.5}F_6$, $Li_{1.95}Ca_{0.05}Al_{0.05}Ge_{0.95}F_6$, $Li_{1.5}Sr_{0.5}Al_{0.5}Ge_{0.5}F_6$, $Li_{1.95}Sr_{0.05}Al_{0.05}Ge_{0.95}F_6$, $Li_{1.5}Ba_{0.5}Al_{0.5}Ge_{0.5}F_6$, $Li_{1.95}Ba_{0.05}Al_{0.05}Ge_{0.95}F_6$, $Na_{1.5}Mg_{0.5}Al_{0.5}Ge_{0.5}F_6$, $Na_{1.95}Mg_{0.05}Al_{0.05}Ge_{0.95}F_6$, $Na_{1.5}Ca_{0.5}Al_{0.5}Ge_{0.5}F_6$, $Na_{1.95}Ca_{0.05}Al_{0.05}Ge_{0.95}F_6$, $Na_{1.5}Sr_{0.5}Al_{0.5}Ge_{0.5}F_6$, $Na_{1.95}Sr_{0.05}Al_{0.05}Ge_{0.95}F_6$, $Na_{1.5}Ba_{0.5}Al_{0.5}Ge_{0.5}F_6$, $Na_{1.95}Ba_{0.05}Al_{0.05}Ge_{0.95}F_6$, $K_{1.5}Mg_{0.5}Al_{0.5}Ge_{0.5}F_6$, $K_{1.95}Mg_{0.05}Al_{0.05}Ge_{0.95}F_6$, $K_{1.5}Ca_{0.5}Al_{0.5}Ge_{0.5}F_6$, $K_{1.95}Ca_{0.05}Al_{0.05}Ge_{0.95}F_6$, $K_{1.5}Sr_{0.5}Al_{0.5}Ge_{0.5}F_6$, $K_{1.95}Sr_{0.05}Al_{0.05}Ge_{0.95}F_6$, $K_{1.5}Ba_{0.5}Al_{0.5}Ge_{0.5}F_6$, $K_{1.95}Ba_{0.05}Al_{0.05}Ge_{0.95}F_6$, $Rb_{1.5}Mg_{0.5}Al_{0.5}Ge_{0.5}F_6$, $Rb_{1.95}Mg_{0.05}Al_{0.05}Ge_{0.95}F_6$, $Rb_{1.5}Ca_{0.5}Al_{0.5}Ge_{0.5}F_6$, $Rb_{1.95}Ca_{0.05}Al_{0.05}Ge_{0.95}F_6$, $Rb_{1.5}Sr_{0.5}Al_{0.5}Ge_{0.5}F_6$, $Rb_{1.95}Sr_{0.05}Al_{0.05}Ge_{0.95}F_6$, $Rb_{1.5}Ba_{0.5}Al_{0.5}Ge_{0.5}F_6$, $Rb_{1.95}Ba_{0.05}Al_{0.05}Ge_{0.95}F_6$, $Cs_{1.5}Mg_{0.5}Al_{0.5}Ge_{0.5}F_6$, $Cs_{1.95}Mg_{0.05}Al_{0.05}Ge_{0.95}F_6$, $Cs_{1.5}Ca_{0.5}Al_{0.5}Ge_{0.5}F_6$, $Cs_{1.95}Ca_{0.05}Al_{0.05}Ge_{0.95}F_6$, $Cs_{1.5}Sr_{0.5}Al_{0.5}Ge_{0.5}F_6$, $Cs_{1.95}Sr_{0.05}Al_{0.05}Ge_{0.95}F_6$, $Cs_{1.5}Ba_{0.5}Al_{0.5}Ge_{0.5}F_6$, $Cs_{1.95}Ba_{0.05}Al_{0.05}Ge_{0.95}F_6$, $Li_{1.5}Mg_{0.5}Al_{0.5}Ti_{0.5}F_6$, $Li_{1.95}Mg_{0.05}Al_{0.05}Ti_{0.95}F_6$, $Li_{1.5}Ca_{0.5}Al_{0.5}Ti_{0.5}F_6$, $Li_{1.95}Ca_{0.05}Al_{0.05}Ti_{0.95}F_6$, $Li_{1.5}Sr_{0.5}Al_{0.5}Ti_{0.5}F_6$, $Li_{1.95}Sr_{0.05}Al_{0.05}Ti_{0.95}F_6$, $Li_{1.5}Ba_{0.5}Al_{0.5}Ti_{0.5}F_6$, $Li_{1.95}Ba_{0.05}Al_{0.05}Ti_{0.95}F_6$, $Na_{1.5}Mg_{0.5}Al_{0.5}Ti_{0.5}F_6$, $Na_{1.95}Mg_{0.05}Al_{0.5}Ti_{0.95}F_6$, $Na_{1.5}Ca_{0.5}Al_{0.5}Ti_{0.5}F_6$, $Na_{1.95}Ca_{0.05}Al_{0.05}Ti_{0.95}F_6$, $Na_{1.5}Sr_{0.5}Al_{0.5}Ti_{0.5}F_6$, $Na_{1.95}Sr_{0.05}Al_{0.05}Ti_{0.95}F_6$, $Na_{1.5}Ba_{0.5}Al_{0.5}Ti_{0.5}F_6$, $Na_{1.95}Ba_{0.05}Al_{0.05}Ti_{0.95}F_6$, $K_{1.5}Mg_{0.5}Al_{0.5}Ti_{0.5}F_6$, $K_{1.95}Mg_{0.05}Al_{0.05}Ti_{0.95}F_6$, $K_{1.5}Ca_{0.5}Al_{0.5}Ti_{0.5}F_6$, $K_{1.95}Ca_{0.05}Al_{0.05}Ti_{0.95}F_6$, $K_{1.5}Sr_{0.5}Al_{0.5}Ti_{0.5}F_6$, $K_{1.95}Sr_{0.05}Al_{0.05}Ti_{0.95}F_6$, $K_{1.5}Ba_{0.5}Al_{0.5}Ti_{0.5}F_6$, $K_{1.95}Ba_{0.05}Al_{0.05}Ti_{0.95}F_6$, $Rb_{1.5}Mg_{0.5}Al_{0.5}Ti_{0.5}F_6$, $Rb_{1.95}Mg_{0.05}Al_{0.05}Ti_{0.95}F_6$, $Rb_{1.5}Ca_{0.5}Al_{0.5}Ti_{0.5}F_6$, $Rb_{1.95}Ca_{0.05}Al_{0.05}Ti_{0.95}F_6$, $Rb_{1.5}Sr_{0.5}Al_{0.5}Ti_{0.5}F_6$, $Rb_{1.95}Sr_{0.05}Al_{0.05}Ti_{0.95}F_6$, $Rb_{1.5}Ba_{0.5}Al_{0.5}Ti_{0.5}F_6$, $Rb_{1.95}Ba_{0.05}Al_{0.05}Ti_{0.95}F_6$, $Cs_{1.5}Mg_{0.5}Al_{0.5}Ti_{0.5}F_6$, $Cs_{1.95}Mg_{0.05}Al_{0.05}Ti_{0.95}F_6$, $Cs_{1.5}Ca_{0.5}Al_{0.5}Ti_{0.5}F_6$, $Cs_{1.95}Ca_{0.05}Al_{0.05}Ti_{0.95}F_6$, $Cs_{1.5}Sr_{0.5}Al_{0.5}Ti_{0.5}F_6$, $Cs_{1.95}Sr_{0.05}Al_{0.05}Ti_{0.95}F_6$, $Cs_{1.5}Ba_{0.5}Al_{0.05}Ti_{0.5}F_6$, $Cs_{1.95}Ba_{0.05}Al_{0.05}Ti_{0.95}F_6$, $Li_{1.5}Mg_{0.5}Al_{0.5}Zr_{0.5}F_6$, $Li_{1.95}Mg_{0.05}Al_{0.05}Zr_{0.95}F_6$, $Li_{1.5}Ca_{0.5}Al_{0.5}Zr_{0.5}F_6$, $Li_{1.95}Ca_{0.05}Al_{0.05}Zr_{0.95}F_6$, $Li_{1.5}Sr_{0.5}Al_{0.5}Zr_{0.5}F_6$, $Li_{1.95}Sr_{0.05}Al_{0.05}Zr_{0.95}F_6$, $Li_{1.5}Ba_{0.5}Al_{0.5}Zr_{0.5}F_6$, $Li_{1.95}Ba_{0.05}Al_{0.05}Zr_{0.95}F_6$, $Na_{1.5}Mg_{0.5}Al_{0.5}Zr_{0.5}F_6$, $Na_{1.95}Mg_{0.05}Al_{0.05}Zr_{0.95}F_6$, $Na_{1.5}Ca_{0.5}Al_{0.5}Zr_{0.5}F_6$, $Na_{1.95}Ca_{0.05}Al_{0.05}Zr_{0.95}F_6$, $Na_{1.5}Sr_{0.5}Al_{0.5}Zr_{0.5}F_6$, $Na_{1.95}Sr_{0.05}Al_{0.05}Zr_{0.95}F_6$, $Na_{1.5}Ba_{0.5}Al_{0.5}Zr_{0.5}F_6$, $Na_{1.95}Ba_{0.05}Al_{0.05}Zr_{0.95}F_6$, $K_{1.5}Mg_{0.5}Al_{0.5}Zr_{0.5}F_6$, $K_{1.95}Mg_{0.05}Al_{0.05}Zr_{0.95}F_6$, $K_{1.5}Ca_{0.5}Al_{0.5}Zr_{0.5}F_6$, $K_{1.95}Ca_{0.05}Al_{0.05}Zr_{0.95}F_6$, $K_{1.5}Sr_{0.5}Al_{0.5}Zr_{0.5}F_6$, $K_{1.95}Sr_{0.05}Al_{0.05}Zr_{0.95}F_6$, $K_{1.5}Ba_{0.5}Al_{0.5}Zr_{0.5}F_6$, $K_{1.95}Ba_{0.05}Al_{0.05}Zr_{0.95}F_6$, $Rb_{1.5}Mg_{0.5}Al_{0.5}Zr_{0.5}F_6$, $Rb_{1.95}Mg_{0.05}Al_{0.05}Zr_{0.95}F_6$, $Rb_{1.5}Ca_{0.5}Al_{0.5}Zr_{0.5}F_6$, $Rb_{1.95}Ca_{0.05}Al_{0.05}Zr_{0.95}F_6$, $Rb_{1.5}Sr_{0.5}Al_{0.5}Zr_{0.5}F_6$, $Rb_{1.95}Sr_{0.05}Al_{0.05}Zr_{0.95}F_6$, $Rb_{1.5}Ba_{0.5}Al_{0.5}Zr_{0.5}F_6$, $Rb_{1.95}Ba_{0.05}Al_{0.05}Zr_{0.95}F_6$, $Cs_{1.5}Mg_{0.5}Al_{0.5}Zr_{0.5}F_6$, $Cs_{1.95}Mg_{0.05}Al_{0.05}Zr_{0.95}F_6$, $Cs_{1.5}Ca_{0.5}Al_{0.5}Zr_{0.5}F_6$, $Cs_{1.95}Ca_{0.05}Al_{0.05}Zr_{0.95}F_6$, $Cs_{1.5}Sr_{0.5}Al_{0.5}Zr_{0.5}F_6$, $Cs_{1.95}Sr_{0.05}Al_{0.05}Zr_{0.95}F_6$, $Cs_{1.5}Ba_{0.5}Al_{0.5}Zr_{0.5}F_6$, $Cs_{1.95}Ba_{0.05}Al_{0.05}Zr_{0.95}F_6$, $Li_{1.5}Mg_{0.5}Al_{0.5}Sn_{0.5}F_6$, $Li_{1.95}Mg_{0.05}Al_{0.05}Sn_{0.95}F_6$, $Li_{1.5}Ca_{0.5}Al_{0.5}Sn_{0.5}F_6$, $Li_{1.95}Ca_{0.05}Al_{0.05}Sn_{0.95}F_6$, $Li_{1.5}Sr_{0.5}Al_{0.5}Sn_{0.5}F_6$, $Li_{1.95}Sr_{0.05}Al_{0.05}Sn_{0.95}F_6$, $Li_{1.5}Ba_{0.5}Al_{0.5}Sn_{0.5}F_6$, $Li_{1.95}Ba_{0.05}Al_{0.05}Sn_{0.95}F_6$, $Na_{1.5}Mg_{0.5}Al_{0.05}Sn_{0.5}F_6$, $Na_{1.95}Mg_{0.05}Al_{0.05}Sn_{0.95}F_6$, $Na_{1.5}Ca_{0.5}Al_{0.5}Sn_{0.5}F_6$, $Na_{1.95}Ca_{0.05}Al_{0.05}Sn_{0.95}F_6$, $Na_{1.5}Sr_{0.5}Al_{0.5}Sn_{0.5}F_6$, $Na_{1.95}Sr_{0.05}Al_{0.05}Sn_{0.95}F_6$, $Na_{1.5}Ba_{0.5}Al_{0.5}Sn_{0.5}F_6$, $Na_{1.95}Ba_{0.05}Al_{0.05}Sn_{0.95}F_6$, $K_{1.5}Mg_{0.5}Al_{0.5}Sn_{0.5}F_6$, $K_{1.95}Mg_{0.05}Al_{0.5}Sn_{0.95}F_6$, $K_{1.5}Ca_{0.5}Al_{0.5}Sn_{0.5}F_6$, $K_{1.95}Ca_{0.05}Al_{0.05}Sn_{0.95}F_6$, $K_{1.5}Sr_{0.5}Al_{0.5}Sn_{0.5}F_6$, $K_{1.95}Sr_{0.05}Al_{0.05}Sn_{0.95}F_6$, $K_{1.5}Ba_{0.5}Al_{0.5}Sn_{0.5}F_6$, $K_{1.95}Ba_{0.05}Al_{0.05}Sn_{0.95}F_6$, $Rb_{1.5}Mg_{0.5}Al_{0.5}Sn_{0.5}F_6$, $Rb_{1.95}Mg_{0.05}Al_{0.05}Sn_{0.95}F_6$, $Rb_{1.5}Ca_{0.5}Al_{0.5}Sn_{0.5}F_6$, $Rb_{1.95}Ca_{0.05}Al_{0.05}Sn_{0.95}F_6$, $Rb_{1.5}Sr_{0.5}Al_{0.5}Sn_{0.5}F_6$, $Rb_{1.95}Sr_{0.05}Al_{0.05}Sn_{0.95}F_6$, $Rb_{1.5}Ba_{0.5}Al_{0.5}Sn_{0.5}F_6$, $Rb_{1.95}Ba_{0.05}Al_{0.05}Sn_{0.95}F_6$, $Cs_{1.5}Mg_{0.5}Al_{0.5}Sn_{0.5}F_6$, $Cs_{1.95}Mg_{0.05}Al_{0.05}Sn_{0.95}F_6$, $Cs_{1.5}Ca_{0.5}Al_{0.5}Sn_{0.5}F_6$, $Cs_{1.95}Ca_{0.05}Al_{0.05}Sn_{0.95}F_6$, $Cs_{1.5}Sr_{0.5}Al_{0.5}Sn_{0.5}F_6$, $Cs_{1.95}Sr_{0.05}Al_{0.05}Sn_{0.95}F_6$, $Cs_{1.5}Ba_{0.5}Al_{0.5}Sn_{0.5}F_6$, $Cs_{1.95}Ba_{0.05}Al_{0.05}Sn_{0.95}F_6$, $Li_{1.85}Mg_{0.15}Al_{0.15}Si_{0.85}F_6$, $Li_{1.995}Mg_{0.005}Al_{0.005}Si_{0.995}F_6$, $Li_{1.85}Ca_{0.15}Al_{0.15}Si_{0.85}F_6$, $Li_{1.995}Ca_{0.005}Al_{0.005}Si_{0.995}F_6$, $Li_{1.85}Sr_{0.15}Al_{0.15}Si_{0.85}F_6$, $Li_{1.995}Sr_{0.005}Al_{0.005}Si_{0.995}F_6$, $Li_{1.85}Ba_{0.15}Al_{0.15}Si_{0.85}F_6$, $Li_{1.995}Ba_{0.005}Al_{0.005}Si_{0.995}F_6$, $Na_{1.85}Mg_{0.15}Al_{0.15}Si_{0.85}F_6$, $Na_{1.995}Mg_{0.005}Al_{0.005}Si_{0.995}F_6$, $Na_{1.85}Ca_{0.15}Al_{0.15}Si_{0.85}F_6$, $Na_{1.995}Ca_{0.005}Al_{0.005}Si_{0.995}F_6$, $Na_{1.85}Sr_{0.15}Al_{0.15}Si_{0.85}F_6$, $Na_{1.995}Sr_{0.005}Al_{0.005}Si_{0.995}F_6$, $Na_{1.85}Ba_{0.15}Al_{0.15}Si_{0.85}F_6$, $Na_{1.995}Ba_{0.005}Al_{0.005}Si_{0.995}F_6$, $K_{1.85}Mg_{0.15}Al_{0.15}Si_{0.85}F_6$, $K_{1.995}Mg_{0.005}Al_{0.005}Si_{0.995}F_6$, $K_{1.85}Ca_{0.15}Al_{0.15}Si_{0.85}F_6$, $K_{1.995}Ca_{0.005}Al_{0.005}Si_{0.995}F_6$, $K_{1.85}Sr_{0.15}Al_{0.15}Si_{0.85}F_6$, $K_{1.995}Sr_{0.005}Al_{0.005}Si_{0.995}F_6$, $K_{1.85}Ba_{0.15}Al_{0.15}Si_{0.85}F_6$, $K_{1.995}Ba_{0.005}Al_{0.005}Si_{0.995}F_6$, $Rb_{1.85}Mg_{0.15}Al_{0.15}Si_{0.85}F_6$, $Rb_{1.995}Mg_{0.005}Al_{0.005}Si_{0.995}F_6$, $Rb_{1.85}Ca_{0.15}Al_{0.15}Si_{0.85}F_6$, $Rb_{1.995}Ca_{0.005}Al_{0.005}Si_{0.995}F_6$, $Rb_{1.85}Sr_{0.15}Al_{0.15}Si_{0.85}F_6$, $Rb_{1.995}Sr_{0.005}Al_{0.005}Si_{0.995}F_6$, $Rb_{1.85}Ba_{0.15}Al_{0.15}Si_{0.85}F_6$, $Rb_{1.995}Ba_{0.005}Al_{0.005}Si_{0.995}F_6$, $Cs_{1.85}Mg_{0.15}Al_{0.15}Si_{0.85}F_6$, $Cs_{1.995}Mg_{0.005}Al_{0.005}Si_{0.995}F_6$, $Cs_{1.85}Ca_{0.15}Al_{0.15}Si_{0.85}F_6$, $Cs_{1.995}Ca_{0.005}Al_{0.005}Si_{0.995}F_6$, $Cs_{1.85}Sr_{0.15}Al_{0.15}Si_{0.85}F_6$, $Cs_{1.995}Sr_{0.005}Al_{0.005}Si_{0.995}F_6$, $Cs_{1.85}Ba_{0.15}Al_{0.15}Si_{0.85}F_6$, $Cs_{1.995}Ba_{0.005}Al_{0.005}Si_{0.995}F_6$, $Li_{1.85}Mg_{0.15}Al_{0.15}Ge_{0.85}F_6$, $Li_{1.995}Mg_{0.005}Al_{0.005}Ge_{0.995}F_6$, $Li_{1.85}Ca_{0.15}Al_{0.15}Ge_{0.85}F_6$, $Li_{1.995}Ca_{0.005}Al_{0.005}Ge_{0.995}F_6$, $Li_{1.85}Sr_{0.15}Al_{0.15}Ge_{0.85}F_6$, $Li_{1.995}Sr_{0.005}Al_{0.005}Ge_{0.995}F_6$, $Li_{1.85}Ba_{0.15}Al_{0.15}Ge_{0.85}F_6$, $Li_{1.995}Ba_{0.005}Al_{0.005}Ge_{0.995}F_6$, $Na_{1.85}Mg_{0.15}Al_{0.15}Ge_{0.85}F_6$, $Na_{1.995}Mg_{0.005}Al_{0.005}Ge_{0.995}F_6$, $Na_{1.85}Ca_{0.15}Al_{0.15}Ge_{0.85}F_6$, $Na_{1.995}Ca_{0.005}Al_{0.005}Ge_{0.995}F_6$, $Na_{1.85}Sr_{0.15}Al_{0.15}Ge_{0.85}F_6$, $Na_{1.995}Sr_{0.005}Al_{0.005}Ge_{0.995}F_6$, $Na_{1.85}Ba_{0.15}Al_{0.15}Ge_{0.85}F_6$, $Na_{1.995}Ba_{0.005}Al_{0.005}Ge_{0.995}F_6$, $K_{1.85}Mg_{0.15}Al_{0.15}Ge_{0.85}F_6$, $K_{1.995}Mg_{0.005}Al_{0.005}Ge_{0.995}F_6$, $K_{1.85}Ca_{0.15}Al_{0.15}Ge_{0.85}F_6$, $K_{1.995}Ca_{0.005}Al_{0.005}Ge_{0.995}F_6$, $K_{1.85}Sr_{0.15}Al_{0.15}Ge_{0.85}F_6$, $K_{1.995}Sr_{0.005}Al_{0.005}Ge_{0.995}F_6$, $K_{1.85}Ba_{0.15}Al_{0.15}Ge_{0.85}F_6$, $K_{1.995}Ba_{0.005}Al_{0.005}Ge_{0.995}F_6$, $Rb_{1.85}Mg_{0.15}Al_{0.15}Ge_{0.85}F_6$, $Rb_{1.995}Mg_{0.005}Al_{0.005}Ge_{0.995}F_6$, $Rb_{1.85}Ca_{0.15}Al_{0.15}Ge_{0.85}F_6$, $Rb_{1.995}Ca_{0.005}Al_{0.005}Ge_{0.995}F_6$, $Rb_{1.85}Sr_{0.15}Al_{0.15}Ge_{0.85}F_6$, $Rb_{1.995}Sr_{0.005}Al_{0.005}Ge_{0.995}F_6$, $Rb_{1.85}Ba_{0.15}Al_{0.15}Ge_{0.85}F_6$, $Rb_{1.995}Ba_{0.005}Al_{0.005}Ge_{0.995}F_6$, $Cs_{1.85}Mg_{0.15}Al_{0.15}Ge_{0.85}F_6$, $Cs_{1.995}Mg_{0.005}Al_{0.005}Ge_{0.995}F_6$, $Cs_{1.85}Ca_{0.15}Al_{0.15}Ge_{0.85}F_6$, $Cs_{1.995}Ca_{0.005}Al_{0.005}Ge_{0.995}F_6$, $Cs_{1.85}Sr_{0.15}Al_{0.15}Ge_{0.85}F_6$, $Cs_{1.995}Sr_{0.005}Al_{0.005}Ge_{0.995}F_6$, $Cs_{1.85}Ba_{0.15}Al_{0.15}Ge_{0.85}F_6$, $Cs_{1.995}Ba_{0.005}Al_{0.005}Ge_{0.995}F_6$, $Li_{1.85}Mg_{0.15}Al_{0.15}Ti_{0.85}F_6$, $Li_{1.95}Mg_{0.005}Al_{0.005}Ti_{0.995}F_6$, $Li_{1.85}Ca_{0.15}Al_{0.15}Ti_{0.85}F_6$, $Li_{1.995}Ca_{0.005}Al_{0.005}Ti_{0.995}F_6$, $Li_{1.85}Sr_{0.15}Al_{0.15}Ti_{0.85}F_6$, $Li_{1.995}Sr_{0.005}Al_{0.005}Ti_{0.995}F_6$, $Li_{1.85}Ba_{0.15}Al_{0.15}Ti_{0.85}F_6$, $Li_{1.995}Ba_{0.005}Al_{0.005}Ti_{0.995}F_6$, $Na_{1.85}Mg_{0.15}Al_{0.15}Ti_{0.85}F_6$, $Na_{1.995}Mg_{0.005}Al_{0.005}Ti_{0.995}F_6$, $Na_{1.85}Ca_{0.15}Al_{0.15}Ti_{0.85}F_6$, $Na_{1.995}Ca_{0.005}Al_{0.005}Ti_{0.995}F_6$, $Na_{1.85}Sr_{0.15}Al_{0.15}Ti_{0.85}F_6$, $Na_{1.995}Sr_{0.005}Al_{0.005}Ti_{0.995}F_6$, $Na_{1.85}Ba_{0.15}Al_{0.15}Ti_{0.85}F_6$, $Na_{1.995}Ba_{0.005}Al_{0.005}Ti_{0.995}F_6$, $K_{1.85}Mg_{0.15}Al_{0.15}Ti_{0.85}F_6$, $K_{1.995}Mg_{0.005}Al_{0.005}Ti_{0.995}F_6$, $K_{1.85}Ca_{0.15}Al_{0.15}Ti_{0.85}F_6$, $K_{1.995}Ca_{0.005}Al_{0.005}Ti_{0.995}F_6$, $K_{1.85}Sr_{0.15}Al_{0.15}Ti_{0.85}F_6$, $K_{1.995}Sr_{0.005}Al_{0.005}Ti_{0.995}F_6$, $K_{1.85}Ba_{0.15}Al_{0.15}Ti_{0.85}F_6$, $K_{1.995}Ba_{0.005}Al_{0.005}Ti_{0.995}F_6$, $Rb_{1.85}Mg_{0.15}Al_{0.15}Ti_{0.85}F_6$, $Rb_{1.995}Mg_{0.005}Al_{0.005}Ti_{0.995}F_6$, $Rb_{1.85}Ca_{0.15}Al_{0.15}Ti_{0.85}F_6$, $Rb_{1.995}Ca_{0.005}Al_{0.05}Ti_{0.995}F_6$, $Rb_{1.85}Sr_{0.15}Al_{0.15}Ti_{0.85}F_6$, $Rb_{1.995}Sr_{0.005}Al_{0.005}Ti_{0.995}F_6$, $Rb_{1.85}Ba_{0.15}Al_{0.15}Ti_{0.85}F_6$, $Rb_{1.995}Ba_{0.005}Al_{0.005}Ti_{0.995}F_6$, $Cs_{1.85}Mg_{0.15}Al_{0.15}Ti_{0.85}F_6$, $Cs_{1.995}Mg_{0.005}Al_{0.005}Ti_{0.995}F_6$, $Cs_{1.85}Ca_{0.15}Al_{0.15}Ti_{0.85}F_6$, $Cs_{1.995}Ca_{0.005}Al_{0.005}Ti_{0.995}F_6$, $Cs_{1.85}Sr_{0.15}Al_{0.15}Ti_{0.85}F_6$, $Cs_{1.995}Sr_{0.005}Al_{0.005}Ti_{0.995}F_6$, $Cs_{1.85}Ba_{0.15}Al_{0.15}Ti_{0.85}F_6$, $Cs_{1.995}Ba_{0.005}Al_{0.005}Ti_{0.995}F_6$, $Li_{1.5}Mg_{0.15}Al_{0.15}Zr_{0.85}F_6$, $Li_{1.995}Mg_{0.005}Al_{0.005}Zr_{0.995}F_6$, $Li_{1.85}Ca_{0.15}Al_{0.15}Zr_{0.85}F_6$, $Li_{1.995}Ca_{0.005}Al_{0.005}Zr_{0.995}F_6$, $Li_{1.85}Sr_{0.15}Al_{0.15}Zr_{0.85}F_6$, $Li_{1.995}Sr_{0.005}Al_{0.005}Zr_{0.995}F_6$, $Li_{1.85}Ba_{0.15}Al_{0.15}Zr_{0.85}F_6$, $Li_{1.995}Ba_{0.005}Al_{0.005}Zr_{0.995}F_6$, $Na_{1.85}Mg_{0.15}Al_{0.15}Zr_{0.85}F_6$, $Na_{1.995}Mg_{0.005}Al_{0.005}Zr_{0.995}F_6$, $Na_{1.85}Ca_{0.15}Al_{0.15}Zr_{0.85}F_6$, $Na_{1.995}Ca_{0.005}Al_{0.005}Zr_{0.995}F_6$, $Na_{1.85}Sr_{0.15}Al_{0.15}Zr_{0.85}F_6$, $Na_{1.995}Sr_{0.005}Al_{0.005}Zr_{0.995}F_6$, $Na_{1.85}Ba_{0.15}Al_{0.15}Zr_{0.85}F_6$, $Na_{1.995}Ba_{0.005}Al_{0.005}Zr_{0.995}F_6$, $K_{1.85}Mg_{0.15}Al_{0.15}Zr_{0.85}F_6$, $K_{1.995}Mg_{0.005}Al_{0.005}Zr_{0.995}F_6$, $K_{1.85}Ca_{0.15}Al_{0.15}Zr_{0.85}F_6$, $K_{1.995}Ca_{0.005}Al_{0.005}Zr_{0.995}F_6$, $K_{1.85}Sr_{0.15}Al_{0.15}Zr_{0.85}F_6$, $K_{1.995}Sr_{0.005}Al_{0.005}Zr_{0.995}F_6$, $K_{1.85}Ba_{0.15}Al_{0.15}Zr_{0.85}F_6$, $K_{1.995}Ba_{0.005}Al_{0.005}Zr_{0.995}F_6$, $Rb_{1.85}Mg_{0.15}Al_{0.15}Zr_{0.85}F_6$, $Rb_{1.995}Mg_{0.005}Al_{0.005}Zr_{0.995}F_6$, $Rb_{1.85}Ca_{0.15}Al_{0.15}Zr_{0.85}F_6$, $Rb_{1.995}Ca_{0.005}Al_{0.005}Zr_{0.995}F_6$, $Rb_{1.85}Sr_{0.15}Al_{0.15}Zr_{0.85}F_6$, $Rb_{1.995}Sr_{0.005}Al_{0.005}Zr_{0.995}F_6$, $Rb_{1.85}Ba_{0.15}Al_{0.15}Zr_{0.85}F_6$, $Rb_{1.995}Ba_{0.005}Al_{0.005}Zr_{0.995}F_6$, $Cs_{1.85}Mg_{0.15}Al_{0.15}Zr_{0.85}F_6$, $Cs_{1.995}Mg_{0.005}Al_{0.005}Zr_{0.995}F_6$, $Cs_{1.85}Ca_{0.15}Al_{0.15}Zr_{0.85}F_6$, $Cs_{0.995}Ca_{0.005}Al_{0.005}Zr_{0.995}F_6$, $Cs_{1.85}Sr_{0.15}Al_{0.15}Zr_{0.85}F_6$, $Cs_{1.995}Sr_{0.005}Al_{0.005}Zr_{0.995}F_6$, $Cs_{1.85}Ba_{0.15}Al_{0.15}Zr_{0.85}F_6$, $Cs_{1.995}Ba_{0.005}Al_{0.005}Zr_{0.995}F_6$, $Li_{1.85}Mg_{0.15}Al_{0.15}Sn_{0.85}F_6$, $Li_{1.995}Mg_{0.005}Al_{0.005}Sn_{0.995}F_6$, $Li_{1.85}Ca_{0.15}Al_{0.15}Sn_{0.85}F_6$, $Li_{1.995}Ca_{0.005}Al_{0.005}Sn_{0.995}F_6$, $Li_{1.85}Sr_{0.15}Al_{0.15}Sn_{0.85}F_6$, $Li_{1.995}Sr_{0.005}Al_{0.005}Sn_{0.995}F_6$, $Li_{1.85}Ba_{0.15}Al_{0.15}Sn_{0.85}F_6$, $Li_{1.995}Ba_{0.005}Al_{0.005}Sn_{0.995}F_6$, $Na_{1.85}Mg_{0.15}Al_{0.15}Sn_{0.85}F_6$, $Na_{1.995}Mg_{0.005}Al_{0.005}Sn_{0.995}F_6$, $Na_{1.85}Ca_{0.15}Al_{0.15}Sn_{0.85}F_6$, $Na_{1.995}Ca_{0.005}Al_{0.005}Sn_{0.995}F_6$, $Na_{1.85}Sr_{0.15}Al_{0.15}Sn_{0.85}F_6$, $Na_{1.995}Sr_{0.005}Al_{0.005}Sn_{0.995}F_6$, $Na_{1.85}Ba_{0.15}Al_{0.15}Sn_{0.85}F_6$, $Na_{1.995}Ba_{0.005}Al_{0.005}Sn_{0.995}F_6$, $K_{1.85}Mg_{0.5}Al_{0.15}Sn_{0.85}F_6$, $K_{1.995}Mg_{0.005}Al_{0.005}Sn_{0.995}F_6$, $K_{1.85}Ca_{0.15}Al_{0.15}Sn_{0.85}F_6$, $K_{1.995}Ca_{0.005}Al_{0.005}Sn_{0.995}F_6$, $K_{1.85}Sr_{0.15}Al_{0.15}Sn_{0.85}F_6$, $K_{1.995}Sr_{0.005}Al_{0.005}Sn_{0.995}F_6$, $K_{1.85}Ba_{0.15}Al_{0.15}Sn_{0.85}F_6$, $K_{1.995}Ba_{0.005}Al_{0.005}Sn_{0.995}F_6$, $Rb_{1.85}Mg_{0.15}Al_{0.15}Sn_{0.85}F_6$, $Rb_{1.995}Mg_{0.005}Al_{0.005}Sn_{0.995}F_6$, $Rb_{1.85}Ca_{0.15}Al_{0.15}Sn_{0.85}F_6$, $Rb_{1.995}Ca_{0.005}Al_{0.005}Sn_{0.995}F_6$, $Rb_{1.85}Sr_{0.15}Al_{0.15}Sn_{0.85}F_6$, $Rb_{1.995}Sr_{0.005}Al_{0.005}Sn_{0.995}F_6$, $Rb_{1.85}Ba_{0.15}Al_{0.15}Sn_{0.85}F_6$, $Rb_{1.995}Ba_{0.005}Al_{0.005}Sn_{0.995}F_6$, $Cs_{1.85}Mg_{0.15}Al_{0.15}Sn_{0.85}F_6$, $Cs_{1.995}Mg_{0.005}Al_{0.005}Sn_{0.995}F_6$, $Cs_{1.85}Ca_{0.15}Al_{0.15}Sn_{0.85}F_6$, $Cs_{1.995}Ca_{0.005}Al_{0.005}Sn_{0.995}F_6$, $Cs_{1.85}Sr_{0.15}Al_{0.15}Sn_{0.85}F_6$, $Cs_{1.995}Sr_{0.005}Al_{0.005}Sn_{0.995}F_6$, $Cs_{1.85}Ba_{0.15}Al_{0.15}Sn_{0.85}F_6$, $Cs_{1.995}Ba_{0.005}Al_{0.005}Sn_{0.995}F_6$.

In addition to the constituting elements A, B, C, D, and X described above, the phosphor represented by formula [1] of the present invention may contain elements, for example, such as impurity elements, that become unavoidably mixed but do not interfere with the effects of the present invention.

The phosphor [1] of the present invention has a structure other than a garnet structure. This provides a novel red phosphor having considerably improved waterfastness compared to the related art.

Patent Literatures 1 to 4 do not describe phosphors that contain all of alkaline earth metals, Al, and F. Patent Literature 5 merely describes containing small amounts of alkaline earth metal only comparable to the level of activating ions. The phosphor of the present invention containing Al and F, and amounts of alkaline earth metal large enough to form even a host has a clearly different composition ratio, and can be considered as a novel phosphor.

(Crystal Phase Having Chemical Composition Represented by Formula [2])

The phosphor of the present invention contains a crystal phase of a chemical composition represented by the following formula [2], the crystal phase having no garnet structure, and the phosphor having an emission peak in a 600 nm to 650 nm wavelength range by being activated by at least $Mn^{4+}$ (hereinafter, the phosphor also will be referred to as "phosphor [2] of the present invention"), $$A^2_{aii}B^2_{bii}C^2_{cii}D^2_{dii}X^2_{xii} \quad \text{formula [2],}$$

wherein $A^2$ represents one or more alkali metal elements, $B^2$ represents one or more alkaline earth metal elements, $C^2$ represents one or more elements selected from the group consisting of Group 3 elements and Group 13 elements of the periodic table, $D^2$ represents one or more elements selected from the group consisting of Group 4 elements and Group 14 elements of the periodic table, $X^2$ represents one or more halogen elements, and aii, bii, cii, dii, and xii represent numbers that satisfy $0 \le aii < 1$, $0 < bii < 1$, $0 < cii < 1$, $0 \le dii < 1$, and $0 < xii < 1$, respectively, and $aii+bii+cii+dii+xii=1$.

The phosphor particle of the phosphor [2] of the present invention has a chemical composition represented by the formula [2]. As used herein, "phosphor particle" means a single particle.

$A^2$ in formula [2] has the same definition as A of formula [1]. The preferred forms of $A^2$ are also as described for A.

The ratio (Z1/Z8) of the number (Z1) of alkali metal elements contained as $A^2$ with respect to the total number (Z8) of elements contained in the phosphor is preferably 0.01 or more, more preferably 0.05 or more, and is preferably 0.40 or less, more preferably 0.30 or less, particularly preferably 0.20 or less.

$B^2$ in formula [2] has the same definition as B of formula [1]. The preferred forms of $B^2$ are also as described for B.

The ratio (Z2/Z8) of the number (Z2) of alkaline earth metal elements contained as $B^2$ with respect to the total number (Z8) of elements contained in the phosphor is preferably 0.05 or more, more preferably 0.10 or more, particularly preferably 0.15 or more, and is preferably 0.40 or less, more preferably 0.35 or less, particularly preferably 0.30 or less.

$C^2$ in formula [2] has the same definition as C of formula [1]. The preferred forms of $C^2$ are also as described for C.

The ratio (Z3/Z8) of the number (Z3) of elements selected from Group 3 elements and Group 13 elements of the periodic table and contained as $C^2$ with respect to the total number (Z8) of elements contained in the phosphor is preferably 0.02 or more, more preferably 0.10 or more, and is preferably 0.40 or less, more preferably 0.30 or less. When the element $C^2$ contains Al as an essential element, the ratio (Z4/Z8) of the number (Z4) of Al elements contained as $C^2$ with respect to the total number (Z8) of elements contained in the phosphor is preferably 0.01 or more, more preferably 0.05 or more, further preferably 0.10 or more, and is preferably 0.40 or less, more preferably 0.30 or less, particularly preferably 0.20 or less.

It is preferable in the phosphor [2] of the present invention that the ratio (Z2/Z8) of the number (Z2) of alkaline earth metal elements contained as $B^2$ with respect to the total number (Z8) of elements contained in the phosphor is 0.05 or more, and that the ratio (Z3/Z8) of the number (Z3) of elements selected from Group 3 elements and Group 13 elements of the periodic table and contained as $C^2$ with respect to the total number (Z8) of elements contained in the phosphor is 0.02 or more.

$D^2$ in formula [2] has the same definition as D of formula [1]. The preferred forms of $D^2$ are also as described for D.

The ratio (Z5/Z8) of the number (Z5) of elements selected from Group 4 elements and Group 14 elements of the periodic table and contained as $D^2$ with respect to the total number (Z8) of elements contained in the phosphor is preferably 0.01 or more, more preferably 0.05 or more, and is preferably 0.15 or less, more preferably 0.10 or less.

In the formula [2], $X^2$ represents at least one monovalent anion selected from halogen elements. As used herein, halogen elements mean F, Cl, Br, and I. Preferably, at least fluorine is contained as element X, and fluorine may be contained either alone or in combination with elements other than F in any proportions. The element $X^2$ may be partly substituted with an OH group, provided that such substitution is not detrimental to the luminescence characteristics. The proportion of F in element $X^2$ is preferably 50 mol % or more, more preferably 70 mol % or more, further preferably 90 mol % or more.

The ratio (Z6/Z8) of the number (Z6) of halogen elements contained as $X^2$ with respect to the total number (Z8) of elements contained in the phosphor is preferably 0.30 or more, more preferably 0.40 or more, and is preferably 0.80 or less, more preferably 0.70 or less, particularly preferably 0.60 or less. When element $X^2$ contains fluorine as an essential element, the ratio (Z7/Z8) of the number (Z7) of fluorine elements contained as $X^2$ with respect to the total number (Z8) of elements contained in the phosphor is preferably 0.30 or more, more preferably 0.40 or more, and is preferably 0.80 or less, more preferably 0.70 or less, particularly preferably 0.60 or less.

In the formula [2], "aii" represents the molar ratio of element $A^2$ (one or more alkali metal elements). The subscript "aii" is a number that satisfies 0<aii<1, and is preferably 0.01 or more, more preferably 0.05 or more, and is preferably 0.40 or less, more preferably 0.30 or less, particularly preferably 0.20 or less.

In the formula [2], "bii" represents the molar ratio of element $B^2$ (one or more alkaline earth metal elements). The subscript "bii" is a number that satisfies 0<bii<1, and is preferably 0.05 or more, more preferably 0.10 or more, further preferably 0.15 or more, and is preferably 0.40 or less, more preferably 0.35 or less, particularly preferably 0.30 or less.

In the formula [2], "cii" represents the molar ratio of element $C^2$ (one or more elements selected from the group consisting of Group 3 elements and Group 13 elements of the periodic table). The subscript "cii" is a number that satisfies 0<cii<1, and is preferably 0.02 or more, more preferably 0.10 or more, and is preferably 0.40 or less, more preferably 0.30 or less.

In the formula [2], "dii" represents the molar ratio of element $D^2$ (one or more elements selected from the group consisting of Group 4 elements and Group 14 elements of the periodic table). The subscript "dii" is a number that satisfies 0<dii<1, and is preferably 0.01 or more, more preferably 0.05 or more, and is preferably 0.15 or less, more preferably 0.10 or less.

In the formula [2], "xii" represents the molar ratio of element $X^2$ (one or more halogen elements). The subscript "xii" is a number that satisfies 0<xii<1, and is preferably 0.30 or more, more preferably 0.40 or more, and is preferably 0.80 or less, more preferably 0.70 or less, particularly preferably 0.60 or less.

The numbers aii, bii, cii, dii, and xii falling in the foregoing ranges satisfy aii+bii+cii+dii+xii=1.

A second aspect of the phosphor [2] of the present invention is that the phosphor includes host crystals containing at least (1) one or more alkaline earth metal elements selected from the group consisting of Mg, Ca, Sr, and Ba, (2) aluminum, and (3) fluorine, and has an emission peak in a 600 nm to 650 nm wavelength range by being activated by at least $Mn^{4+}$ (hereinafter, the phosphor also will be referred to as "phosphor [2'] of the present invention").

The ratio (Z2/Z8) of the number (Z2) of the alkaline earth metal elements with respect to the total number (Z8) of elements contained in the phosphor is preferably 0.05 or more, more preferably 0.10 or more, particularly preferably 0.15 or more, and is preferably 0.40 or less, more preferably 0.35 or less, particularly preferably 0.30 or less.

The ratio (Z4/Z8) of the number (Z4) of the Al elements with respect to the total number (Z8) of elements contained in the phosphor is preferably 0.01 or more, more preferably 0.05 or more, further preferably 0.10 or more, and is preferably 0.40 or less, more preferably 0.30 or less, particularly preferably 0.20 or less.

The ratio (Z7/Z8) of the number (Z7) of the F elements with respect to the total number (Z8) of elements contained in the phosphor is preferably 0.30 or more, more preferably 0.40 or more, and is preferably 0.80 or less, more preferably 0.70 or less, particularly preferably 0.60 or less.

Preferred examples of the phosphor [2'] of the present invention include $CaAlF_5$, $SrAlF_5$, $BaAlF_5$, $Ca_2AlF_7$, $Sr_2AlF_7$, $Ba_2AlF_7$, $Ca_3AlF_9$, $Sr_3AlF_9$, $Ba_3AlF_9$, $Ba_3Al_2F_{12}$, $BasAlF_{13}$, $Ba_{20}Al_{12}F_{76}$, $BaMgAlF_7$, $Ba_2MgAlF_9$, $SrsAl_2F_{16}$, $Ba_2CaMgAl_2F_{14}$, $LiMgAlF_6$, $LiCaAlF_6$, $LiSrAlF_6$, $LiBaAlF_6$, $NaCaAlF_6$, $NaSrAlF_6$, $NaBaAlF_6$, $NaMgAlF_6$, $Na_2MgAlF_7$, $Na_3CaMg_3AlF_{14}$, $Na_2Ca_3Al_2F_{14}$, $Na_4Ca_4Al_7F_{33}$, $Na_2Sr_7Al_6F_{34}$, $Na_3Sr_4Al_5F_{26}$, $KMgAlF_6$, $KCaAl_2F_9$, $RbMgAlF_6$, and $(Na,K,Rb)MgAlF_6$.

The concentration of the activating ion $Mn^{4+}$ in the phosphors [2] and [2'] of the present invention is typically 0.01 mol % or more, preferably 0.05 mol % or more, further preferably 1 mol % or more, particularly preferably 3 mol % or more, and is typically 50 mol % or less, preferably 40 mol % or less, further preferably 30 mol % or less, particularly preferably 20 mol % or less with respect to the total of the elements selected from the group consisting of Group 3 and Group 13 elements of the periodic table and the elements selected from the group consisting of Group 4 elements and Group 14 elements of the periodic table. The ability to absorb light from a first illuminant (described later) in a device using the phosphor of the present invention tends to suffer greatly when the concentration of the activating ion $Mn^{4+}$ is too low. On the other hand, concentration quenching becomes prominent, and the emission efficiency tends to greatly decrease when the $Mn^{4+}$ concentration is excessively high.

The phosphors [2] and [2'] of the present invention may contain elements, for example, such as impurity elements, that become unavoidably mixed but do not interfere with the effects of the present invention, in addition to the constituting elements $A^2$, $B^2$, $C^2$, $D^2$, and $X^2$, alkaline earth metal elements, Al, and F.

Patent Literatures 1 to 4 do not describe phosphors that contain all of alkaline earth metals, Al, and F. Patent Literature 5 merely describes containing small amounts of alkaline earth metal only comparable to the level of activating ions. The phosphor of the present invention containing Al and F, and amounts of alkaline earth metal large enough to form even a host can thus be considered as a novel phosphor.

The phosphors [2] and [2'] of the present invention have a crystal phase of a structure other than a garnet structure. This provides a novel red phosphor having considerably improved waterfastness compared to the related art.

(Phosphor of Formula [3])

In the phosphor of the present invention, the chemical composition represented by the foregoing formula [2] is preferably represented by the following formula [3](hereinafter, such a phosphor also will be referred to as "phosphor [3] of the present invention"), $$A^3_{aiii}B^3_{biii}C^3_{ciii}D^3_{diii}X^3_{xiii}Y^3_{diii}:R^3 \qquad \text{formula [3]}$$

wherein $A^3$ represents one or more alkali metal elements, $B^3$ represents one or more alkaline earth metal elements, $C^3$ represents one or more elements selected from the group consisting of Group 3 elements and Group 13 elements of the periodic table, $D^3$ represents one or more elements selected from the group consisting of Group 4 elements and Group 14 elements of the periodic table, $X^3$ represents one or more halogen elements that include at least F, $Y^3$ represents one or more Group 16 elements of the periodic table, $R^3$ represents an element that includes at least a tetravalent Mn, and aiii, biii, ciii, diii, and xiii represent numbers that satisfy $0.8 \leq aiii \leq 1.2$, $0.8 \leq biii \leq 1.2$, $0 \leq ciii \leq 1.2$, $0 \leq diii \leq 1$, $0.8 \leq ciii + diii \leq 1.2$, $5.0 \leq xiii \leq 7.0$, and $5.0 \leq xiii + diii \leq 7.0$.

$A^3$, $B^3$, $C^3$, and $D^3$ in formula [3] have the same definitions as A, B, C, and D, respectively, of formula [1]. Specific examples and the preferred forms of $A^3$, $B^3$, $C^3$, and $D^3$ are also as described for A, B, C, and D.

$X^3$ and $R^3$ in formula [3] have the same definitions as X and R, respectively, of formula [1]. The preferred forms of $X^3$ and $R^3$ are also as described for X and R.

$Y^3$ in formula [3] represents at least one bivalent anion selected from Group 16 elements of the periodic table. As used herein, Group 16 elements of the periodic table mean O, S, Se, and Te. Preferably, at least oxygen is contained as $Y^3$, and oxygen may be contained either alone or in combination with elements other than O in any proportions. The proportion of oxygen in $Y^3$ is preferably 50 mol % or more, more preferably 70 mol % or more, further preferably 90 mol % or more.

In the formula [3], "aiii" represents the molar ratio of $A^3$ (one or more alkali metal elements). The subscript "aiii" is a number that satisfies $0.8 \leq aiii \leq 1.2$, and is preferably 0.85 or more, more preferably 0.9 or more, and is preferably 1.15 or less, more preferably 1.1 or less, particularly preferably 1.05 or less.

In the formula [3], "biii" represents the molar ratio of element $B^3$ (one or more alkaline earth metal elements). The subscript "biii" is a number that satisfies $0.8 \leq biii \leq 1.2$, and is preferably 0.85 or more, more preferably 0.9 or more, and is preferably 1.15 or less, more preferably 1.1 or less, particularly preferably 1.05 or less.

In the formula [3], "ciii" represents the molar ratio of element $C^3$ (one or more elements selected from the group consisting of Group 3 elements and Group 13 elements of the periodic table). The subscript "ciii" is a number that satisfies $0 \leq ciii \leq 1.2$, and is preferably 0.85 or more, more preferably 0.9 or more, and is preferably 1.15 or less, more preferably 1.10 or less.

In the formula [3], "diii" represents the molar ratio of element $D^3$ (one or more elements selected from the group consisting of Group 4 elements and Group 14 elements of the periodic table) and element $Y^3$ (Group 16 element of the periodic table). The subscript "diii" is a number that satisfies $0 \leq diii \leq 1$, and is preferably 0.1 or more, more preferably 0.2 or more, and is preferably 0.9 or less, more preferably 0.8 or less.

In the formula [3], "xiii" represents the molar ratio of element X (one or more halogen elements). The subscript "xiii" is a number that satisfies $5.0 \leq xiii \leq 7.0$, and is preferably 5.3 or more, more preferably 5.5 or more, and is preferably 6.7 or less, more preferably 6.5 or less.

The subscript "diii" also represents the substitution amount of element $D^3$ for element $C^3$, and the substitution amount of element $Y^3$ for element $X^3$. Accordingly, the number ciii+diii satisfies $0.8 \leq ciii + diii \leq 1.2$. The number ciii+diii is preferably 0.85 or more, more preferably 0.9 or more, particularly preferably 0.95 or more, and is preferably 1.15 or less, more preferably 1.1 or less, particularly preferably 1.05 or less. With the molar ratio "ciii" and the molar ratio "diii", specifically the numbers represented by ciii, diii, and ciii+diii falling in the foregoing ranges in the phosphor of the present invention, it becomes easier to maintain the tetravalency of the activating element Mn, and the resulting phosphor can have desirable luminescence characteristics with the $Mn^{4+}$ ion.

In the phosphor [3] of the present invention described herein, it is preferable in formula [3] that $A^3$ is one or more elements selected from the group consisting of Li, Na, K, Rb, and Cs, $B^3$ is one or more elements selected from the group consisting of Mg, Ca, Sr, and Ba, $C^3$ is one or more elements selected from the group consisting of Al, Ga, In, Sc, and Y, and $X^3$ is one or more halogen elements that include at least F. Further preferably, $D^3$ is one or more elements selected from the group consisting of Ti, Zr, Hf, Si, Ge, and Sn, and $Y^3$ includes at least oxygen.

The number xiii+diii satisfies 5.0≤xiii+diii≤7.0. The number xiii+diii is preferably 5.3 or more, more preferably 5.5 or more, particularly preferably 5.7 or more, and is preferably 6.7 or less, more preferably 6.5 or less, particularly preferably 6.3 or less. With the molar ratio “xiii” and the molar ratio “diii”, specifically the numbers represented by xiii, diii, and xiii+diii falling in the foregoing ranges in the phosphor of the present invention, some of the halogen elements will be substituted by other elements such as oxygen, and the substitution amount falls in an appropriate range to provide a phosphor having improved waterfastness.

Preferred examples of the phosphor [3] of the present invention include $LiCaAlF_6$, $LiSrAlF_6$, $LiBaAlF_6$, $NaCaAlF_6$, $NaSrAlF_6$, $NaBaAlF_6$, $KCaAlF_6$, $KSrAlF_6$, $KBaAlF_6$, $RbCaAlF_6$, $RbSrAlF_6$, $RbBaAlF_6$, $LiCaAl_{0.5}Ti_{0.5}F_{5.5}O_{0.5}$, $LiSrAl_{0.5}Ti_{0.5}F_{5.5}O_{0.5}$, $LiBaAl_{0.5}Ti_{0.5}F_{5.5}O_{0.5}$, $NaCaAl_{0.5}Ti_{0.5}F_{5.5}O_{0.5}$, $NaSrAl_{0.5}Ti_{0.5}F_{5.5}O_{0.5}$, $NaBaAl_{0.5}Ti_{0.5}F_{5.5}O_{0.5}$, $KCaAl_{0.5}Ti_{0.5}F_{5.5}O_{0.5}$, $KSrAl_{0.5}Ti_{0.5}F_{5.5}O_{0.5}$, $KBaAl_{0.5}Ti_{0.5}F_{5.5}O_{0.5}$, $RbCaAl_{0.5}Ti_{0.5}F_{5.5}O_{0.5}$, $RbSrAl_{0.5}Ti_{0.5}F_{5.5}O_{0.5}$, $RbBaAl_{0.5}Ti_{0.5}F_{5.5}O_{0.5}$, $LiCaTiF_5O$, $LiSrTiF_5O$, $LiBaTiF_5O$, $NaCaTiF_5O$, $NaSrTiF_5O$, $NaBaTiF_5O$, $KCaTiF_5O$, $KSrTiF_5O$, $KBaTiF_5O$, $RbCaTiF_5O$, $RbSrTiF_5O$, and $RbBaTiF_5O$.

The phosphor represented by formula [3] of the present invention may contain elements, for example, such as impurity elements, that become unavoidably mixed but do not interfere with the effects of the present invention, in addition to the constituting elements $A^3$, $B^3$, $C^3$, $D^3$, $X^3$, and $Y^3$.

Patent Literatures 1 to 4 do not describe phosphors that contain all of alkaline earth metals, Al, and F. Patent Literature 5 merely describes containing small amounts of alkaline earth metal only comparable to the level of activating ions. The phosphor of the present invention containing Al and F, and amounts of alkaline earth metal large enough to form even a host has a clearly different composition ratio, and can be considered as a novel phosphor.

(Phosphor of Formula [4])

In the phosphor of the present invention, the chemical composition represented by the foregoing formula [2] is preferably represented by the following formula [4](hereinafter, such a phosphor also will be referred to as “phosphor [4] of the present invention”), $$(A^4_{aiv}B^4_{biv})_2(C^4_{civ}D^4_{div}E^4_{eiv})_2(X^4_{xiv}Y^4_{yiv})_7:R^4 \quad \text{formula [4]}$$

wherein $A^4$ represents one or more alkali metal elements, $B^4$ represents one or more alkaline earth metal elements, $C^4$ represents one or more alkaline earth metal elements different from $B^4$, $D^4$ represents one or more elements selected from the group consisting of Group 3 elements and Group 13 elements of the periodic table, $E^4$ represents one or more elements selected from the group consisting of Group 4 elements and Group 14 elements of the periodic table, $X^4$ represents one or more halogen elements that include at least F, $Y^4$ represents one or more Group 16 elements of the periodic table, $R^4$ represents an element that includes at least a tetravalent Mn, and aiv, biv, civ, div, eiv, xiv, and yiv represent numbers that satisfy 0<aiv≤2.0, 0≤biv≤1.0, 0<aiv+biv≤2.5, 0<civ≤2.0, 0<div≤2.0, 0≤eiv≤1.0, 0.5≤civ+div+eiv≤2.5, 0<xiv≤2.0, 0≤yiv≤1.0, and 0.5≤xiv+yiv≤2.5.

$A^4$, $B^4$, $C^4$, and $D^4$ in formula [4] have the same definitions as A, B, C, and D, respectively, of formula [1]. Specific examples and the preferred forms of $A^4$, $B^4$, $C^4$, and $D^4$ are also as described for A, B, C, and D.

$X^4$ and $R^4$ in formula [4] have the same definitions as X and R, respectively, of formula [1]. The preferred forms of $X^4$ and $R^4$ are also as described for X and R.

$Y^4$ in formula [4] has the same definition as $Y^3$ of formula [3]. The preferred forms of $Y^4$ are also as described for $Y^3$.

In the formula [4], $E^4$ represents at least one tetravalent element selected from the group consisting of Group 4 elements and Group 14 elements of the periodic table. As used herein, the group consisting of Group 4 elements and Group 14 elements of the periodic table means Ti, Zr, Hf, C, Si, Ge, Sn, and Pb. Element $E^4$ may contain these elements either alone or in a combination of two or more in any proportions. Preferably, at least Ti, C, Si, or Ge, more preferably at least Ti or Ge is contained as element $E^4$.

In the formula [4], “aiv” represents the molar ratio of element $A^4$ (one or more alkali metal elements). The subscript “aiv” is a number that satisfies 0<aiv≤2.0, and is preferably 0.4 or more, more preferably 0.8 or more, and is preferably 1.6 or less, more preferably 1.2 or less.

In the formula [4], “biv” represents the molar ratio of element $B^4$ (one or more alkaline earth metal elements). The subscript “biv” is a number that satisfies 0≤biv≤1.0, and is preferably 0.2 or more, more preferably 0.3 or more, and is preferably 0.8 or less, more preferably 0.7 or less.

The subscript “biv” also represents the substitution amount of element $B^4$ for element $A^4$. Accordingly, the number aiv+biv satisfies 0<aiv+biv≤2.5. The number aiv+biv is preferably 0.7 or more, more preferably 0.9 or more, and is preferably 2.3 or less, more preferably 2.1 or less. With the molar ratio “aiv” and the molar ratio “biv”, specifically the numbers represented by aiv, biv, and aiv+biv falling in the foregoing ranges in the phosphor of the present invention, the alkali metals will be substituted with alkaline earth metals, and the substitution amount falls in an appropriate range to provide a phosphor having improved waterfastness.

In the formula [4], “civ” represents the molar ratio of element $C^4$ (one or more alkaline earth metal elements). The subscript “civ” is a number that satisfies 0<civ≤2.0, and is preferably 0.5 or more, more preferably 0.7 or more, and is preferably 1.5 or less, more preferably 1.3 or less.

In the formula [4], “div” is the molar ratio of element $D^4$ (one or more elements selected from the group consisting of Group 3 elements and Group 13 elements of the periodic table). The subscript “dv” is a number that satisfies 0<div≤2.0, and is preferably 0.5 or more, more preferably 0.7 or more, and is preferably 1.5 or less, more preferably 1.3 or less.

In the formula [4], “eiv” represents the molar ratio of element E (one or more elements selected from the group consisting of Group 4 elements and Group 14 elements of the periodic table). The subscript “eiv” is a number that satisfies 0≤eiv≤1, and is preferably 0.1 or more, more preferably 0.2 or more, and is preferably 0.9 or less, more preferably 0.8 or less.

The subscript “civ” also represents the substitution amount of element $C^4$ for element $D^4$. The subscript “eiv” also represents the substitution amount of element $E^4$ for element $D^4$. Accordingly, the number civ+div+eiv satisfies 0.5≤civ+div+eiv≤2.5. The number civ+div+eiv is preferably 0.7 or more, more preferably 0.9 or more, and is preferably 2.3 or less, more preferably 2.1 or less. With the molar ratio “civ”, the molar ratio “div”, and the molar ratio “eiv”, specifically the numbers represented by civ, div, eiv, and civ+div+eiv falling in the foregoing ranges in the phosphor of the present invention, it becomes easier to maintain the tetravalency of the activating element Mn, and the resulting phosphor can have desirable luminescence characteristics with the $Mn^{4+}$ ion.

In the formula [4], “xiv” represents that molar ratio of element $X^4$ (one or more halogen elements). The subscript “xiv” is a number that satisfies 0<xiv≤2.0, and is preferably 0.5 or more, more preferably 0.7 or more, and is preferably 1.5 or less, more preferably 1.3 or less.

The subscript “yiv” represents the molar ratio of element $Y^4$ (one or more Group 16 elements of the periodic table). The subscript “yiv” is a number that satisfies 0≤yiv≤1.0, and is preferably 0.2 or more, more preferably 0.3 or more, and is preferably 0.8 or less, more preferably 0.7 or less.

The subscript “yiv” also represents the substitution amount of element $Y^4$ for element $X^4$. Accordingly, the number xiv+yiv satisfies 0.5≤xiv+yiv≤2.5. The number xiv+yiv is preferably 0.75 or more, more preferably 0.85 or more, particularly preferably 0.90 or more, and is preferably 2.25 or less, more preferably 2.15 or less, particularly preferably 2.10 or less. With the molar ratio “xiv” and the molar ratio “yiv”, specifically the numbers represented by xiv, yiv, and xiv+yiv falling in the foregoing ranges in the phosphor of the present invention, some of the halogen elements will be substituted by other elements such as oxygen, and the substitution amount falls in an appropriate range to provide a phosphor having improved waterfastness.

In the phosphor [4] of the present invention described herein, it is preferable in formula [4] that $A^4$ is one or more elements selected from the group consisting of Li, Na, K, Rb, and Cs, $B^4$ is an element that mainly includes one or more selected from the group consisting of Ca, Sr, and Ba, $C^4$ is an element that mainly includes Mg, $D^4$ is one or more elements selected from the group consisting of Al, Ga, In, Sc, and Y, and $X^4$ is one or more halogen elements that include at least F. More preferably, $C^4$ is Mg. Further preferably, $E^4$ is one or more elements selected from the group consisting of Ti, Zr, Hf, Si, Ge, and Sn, and $Y^4$ includes at least oxygen.

Specifically, the following are the preferred examples of the phosphor [4] of the present invention. The present invention, however, is not limited to these examples.

$Li_2MgAlF_7$, $Na_2MgAlF_7$, $K_2MgAlF_7$, $Rb_2MgAlF_7$, $Cs_2MgAlF_7$, $Li_2CaAlF_7$, $Na_2CaAlF_7$, $K_2CaAlF_7$, $Rb_2CaAlF_7$, $Cs_2CaAlF_7$, $Li_2SrAlF_7$, $Na_2SrAlF_7$, $K_2SrAlF_7$, $Rb_2SrAlF_7$, $Cs_2SrAlF_7$, $Li_3CaMg_3AlF_{14}$, $Na_3CaMg_3AlF_{14}$, $K_3CaMg_3AlF_{14}$, $Rb_3CaMg_3AlF_{14}$, $Cs_3CaMg_3AlF_{14}$, $Li_3SrMg_3AlF_{14}$, $Na_3SrMg_3AlF_{14}$, $K_3SrMg_3AlF_{14}$, $Rb_3SrMg_3AlF_{14}$, $Cs_3SrMg_3AlF_{14}$, $Li_2Mg_{1.25}Al_{0.5}Ti_{0.25}F_7$, $Na_2Mg_{1.25}Al_{0.5}Ti_{0.25}F_7$, $K_2Mg_{1.25}Al_{0.5}Ti_{0.25}F_7$, $Rb_2Mg_{1.25}Al_{0.5}Ti_{0.25}F_7$, $Cs_2Mg_{1.25}Al_{0.5}Ti_{0.25}F_7$, $Li_2CaMg_{0.25}Al_{0.5}Ti_{0.25}F_7$, $Na_2CaMg_{0.25}Al_{0.5}Ti_{0.25}F_7$, $K_2CaMg_{0.25}Al_{0.5}Ti_{0.25}F_7$, $Rb_2CaMg_{0.25}Al_{0.5}Ti_{0.25}F_7$, $Cs_2CaMg_{0.25}Al_{0.5}Ti_{0.25}F_7$, $Li_2SrMg_{0.25}Al_{0.5}Ti_{0.25}F_7$, $Na_2SrMg_{0.25}Al_{0.5}Ti_{0.25}F_7$, $K_2SrMg_{0.25}Al_{0.5}Ti_{0.25}F_7$, $Rb_2SrMg_{0.25}Al_{0.5}Ti_{0.25}F_7$, $Cs_2SrMg_{0.25}Al_{0.5}Ti_{0.25}F_7$, $Li_2Mg_{1.45}Al_{0.1}Ti_{0.45}F_7$, $Na_2Mg_{1.45}Al_{0.1}Ti_{0.45}F_7$, $K_2Mg_{1.45}Al_{0.1}Ti_{0.45}F_7$, $Rb_2Mg_{1.45}Al_{0.1}Ti_{0.45}F_7$, $Cs_2Mg_{1.45}Al_{0.1}Ti_{0.45}F_7$, $Li_2CaMg_{0.45}Al_{0.1}Ti_{0.45}F_7$, $Na_2CaMg_{0.45}Al_{0.1}Ti_{0.45}F_7$, $K_2CaMg_{0.45}Al_{0.1}Ti_{0.45}F_7$, $Rb_2CaMg_{0.45}Al_{0.1}Ti_{0.45}F_7$, $Cs_2CaMg_{0.45}Al_{0.1}Ti_{0.45}F_7$, $Li_2SrMg_{0.45}Al_{0.1}Ti_{0.45}F_7$, $Na_2SrMg_{0.45}Al_{0.1}Ti_{0.45}F_7$, $K_2$ $SrMg_{0.45}Al_{0.1}Ti_{0.45}F_7$, $Rb_2SrMg_{0.45}Al_{0.1}Ti_{0.45}F_7$, $Cs_2SrMg_{0.45}Al_{0.1}Ti_{0.45}F_7$, $Li_2MgAl_{0.5}Ti_{0.5}F_{6.5}O_{0.5}$, $Na_2MgAl_{0.5}Ti_{0.5}F_{6.5}O_{0.5}$, $K_2MgAl_{0.5}Ti_{0.5}F_{6.5}O_{0.5}$, $Rb_2MgAl_{0.5}Ti_{0.5}F_{6.5}O_{0.5}$, $Cs_2MgAl_{0.5}Ti_{0.5}F_{6.5}O_{0.5}$, $Li_2CaAl_{0.5}Ti_{0.5}F_{6.5}O_{0.5}$, $Na_2CaAl_{0.5}Ti_{0.5}F_{6.5}O_{0.5}$, $K_2CaAl_{0.5}Ti_{0.5}F_{6.5}O_{0.5}$, $Rb_2CaAl_{0.5}Ti_{0.5}F_{6.5}O_{0.5}$, $Cs_2CaAl_{0.5}Ti_{0.5}F_{6.5}O_{0.5}$, $Li_2SrAl_{0.5}Ti_{0.5}F_{6.5}O_{0.5}$, $Na_2SrAl_{0.5}Ti_{0.5}F_{6.5}O_{0.5}$, $K_2SrAl_{0.5}Ti_{0.5}F_{6.5}O_{0.5}$, $Rb_2SrAl_{0.5}Ti_{0.5}F_{6.5}O_{0.5}$, $Cs_2SrAl_{0.5}Ti_{0.5}F_{6.5}O_{0.5}$, $Li_2MgAl_{0.1}Ti_{0.9}F_{6.1}O_{0.9}$, $Na_2MgAl_{0.1}Ti_{0.9}F_{6.1}O_{0.9}$, $K_2MgAl_{0.1}Ti_{0.9}F_{6.1}O_{0.9}$, $Rb_2MgAl_{0.1}Ti_{0.9}F_{6.1}O_{0.9}$, $Cs_2MgAl_{0.1}Ti_{0.9}F_{6.1}O_{0.9}$, $Li_2CaAl_{0.1}Ti_{0.9}F_{6.1}O_{0.9}$, $Na_2CaAl_{0.1}$ $Ti_{0.9}F_{6.1}O_{0.9}$, $K_2CaAl_{0.1}Ti_{0.9}F_{6.1}O_{0.9}$, $Rb_2CaAl_{0.1}Ti_{0.9}F_{6.1}O_{0.9}$, $Cs_2CaAl_{0.1}Ti_{0.9}F_{6.1}O_{0.9}$, $Li_2SrAl_{0.1}Ti_{0.9}F_{6.1}O_{0.9}$, $Na_2SrAl_{0.1}Ti_{0.9}F_{6.1}O_{0.9}$, $K_2SrAl_{0.1}Ti_{0.9}F_{6.1}O_{0.9}$, $Rb_2SrAl_{0.1}Ti_{0.9}F_{6.1}O_{0.9}$, $Cs_2SrAl_{0.1}Ti_{0.9}F_{6.1}O_{0.9}$, $Li_3CaMg_{3.25}Al_{0.5}Ti_{0.25}F_{14}$, $Na_3CaMg_{3.25}Al_{0.5}Ti_{0.25}F_{14}$, $K_3CaMg_{3.25}Al_{0.5}Ti_{0.25}F_{14}$, $Rb_3CaMg_{3.25}Al_{0.5}Ti_{0.25}F_{14}$, $Cs_3CaMg_{3.25}Al_{0.5}Ti_{0.25}F_{14}$, $Li_3SrMg_{3.25}Al_{0.5}Ti_{0.25}F_{14}$, $Na_3SrMg_{3.25}Al_{0.5}Ti_{0.25}F_{14}$, $K_3SrMg_{3.25}Al_{0.5}Ti_{0.25}F_{14}$, $Rb_3SrMg_{3.25}Al_{0.5}Ti_{0.25}F_{14}$, $Cs_3SrMg_{3.25}Al_{0.5}Ti_{0.25}F_{14}$, $Li_3CaMg_{3.45}Al_{0.1}Ti_{0.45}F_{14}$, $Na_3CaMg_{3.45}Al_{0.1}Ti_{0.45}F_{14}$, $K_3CaMg_{3.45}Al_{0.1}Ti_{0.45}F_{14}$, $Rb_3CaMg_{3.45}Al_{0.1}Ti_{0.45}F_{14}$, $Cs_3CaMg_{3.45}Al_{0.1}Ti_{0.45}F_{14}$, $Li_3SrMg_{3.45}Al_{0.1}Ti_{0.45}F_{14}$, $Na_3SrMg_{3.45}Al_{0.1}Ti_{0.45}F_{14}$, $K_3SrMg_{3.45}Al_{0.1}Ti_{0.45}F_{14}$, $Rb_3SrMg_{3.45}Al_{0.1}Ti_{0.45}F_{14}$, $Cs_3SrMg_{3.45}Al_{0.1}Ti_{0.45}F_{14}$, $Li_3CaMg_3Al_{0.9}Ti_{0.1}F_{13.9}O_{0.1}$, $Na_3CaMg_3Al_{0.9}Ti_{0.1}F_{13.9}O_{0.1}$, $K_3CaMg_3Al_{0.9}Ti_{0.1}F_{13.9}O_{0.1}$, $Rb_3CaMg_3Al_{0.9}Ti_{0.1}F_{13.9}O_{0.1}$, $Cs_3CaMg_3Al_{0.9}Ti_{0.1}F_{13.9}O_{0.1}$, $Li_3SrMg_3Al_{0.9}Ti_{0.1}F_{13.9}O_{0.1}$, $Na_3SrMg_3Al_{0.9}Ti_{0.1}F_{13.9}O_{0.1}$, $K_3SrMg_3Al_{0.9}Ti_{0.1}F_{13.9}O_{0.1}$, $Rb_3SrMg_3Al_{0.9}Ti_{0.1}F_{13.9}O_{0.1}$, $Cs_3SrMg_3Al_{0.9}Ti_{0.1}F_{13.9}O_{0.1}$, $Li_3CaMg_3Al_{0.5}Ti_{0.5}F_{13.5}O_{0.5}$, $Na_3CaMg_3Al_{0.5}Ti_{0.5}F_{13.5}O_{0.5}$, $K_3CaMg_3Al_{0.5}Ti_{0.5}F_{13.5}O_{0.5}$, $Rb_3CaMg_3Al_{0.5}Ti_{0.5}F_{13.5}O_{0.5}$, $Cs_3CaMg_3Al_{0.5}Ti_{0.5}F_{13.5}O_{0.5}$, $Li_3SrMg_3Al_{1.5}Ti_{0.5}F_{13.5}O_{0.5}$, $Na_3SrMg_3Al_{0.5}Ti_{0.5}F_{13.5}O_{0.5}$, $K_3SrMg_3Al_{0.5}Ti_{0.5}F_{13.5}O_{0.5}$, $Rb_3SrMg_3Al_{0.5}Ti_{0.5}F_{13.5}O_{0.5}$, $Cs_3SrMg_3Al_{0.5}Ti_{0.5}F_{13.5}O_{0.5}$, $Li_3CaMg_{2.5}Al_{1.5}F_{13.5}O_{0.5}$, $Na_3CaMg_{2.5}Al_{1.5}F_{13.5}O_{0.5}$, $K_3CaMg_{2.5}Al_{1.5}F_{13.5}O_{0.5}$, $Rb_3CaMg_{2.5}Al_{1.5}F_{13.5}O_{0.5}$, $Cs_3CaMg_{2.5}Al_{1.85}F_{13.5}O_{0.5}$, $Li_3SrMg_{2.5}Al_{1.5}F_{13.5}O_{0.5}$, $Na_3SrMg_{2.5}Al_{1.5}F_{13.5}O_{0.5}$, $K_3SrMg_{2.5}Al_{1.5}F_{13.5}O_{0.5}$, $Rb_3SrMg_{2.5}Al_{1.5}F_{13.5}O_{0.5}$, $Cs_3SrMg_{2.5}Al_{1.5}F_{13.5}O_{0.5}$, $Li_3CaMg_2Al_2F_{13}O$, $Na_3CaMg_2Al_2F_{13}O$, $K_3CaMg_2Al_2F_{13}O$, $Rb_3CaMg_2Al_2F_{13}O$, $Cs_3CaMg_2Al_2F_{13}O$, $Li_3SrMg_2Al_2F_{13}O$, $Na_3SrMg_2Al_2F_{13}O$, $K_3SrMg_2Al_2F_{13}O$, $Rb_3SrMg_2Al_2F_{13}O$, $Cs_3SrMg_2Al_2F_{13}O$, $Li_3CaMg_2AlTiF_{12}O_2$, $Na_3CaMg_2AlTiF_{12}O_2$, $K_3CaMg_2AlTiF_{12}O_2$, $Rb_3CaMg_2AlTiF_{12}O_2$, $Cs_3CaMg_2AlTiF_{12}O_2$, $Li_3SrMg_2AlTiF_{12}O_2$, $Na_3SrMg_2AlTiF_{12}O_2$, $K_3SrMg_2AlTiF_{12}O_2$, $Rb_3SrMg_2AlTiF_{12}O_2$, $Cs_3SrMg_2AlTiF_{12}O_2$.

The concentration of the activating element (activating ion) $Mn^{4+}$ in the phosphor [4] of the present invention is typically 0.01 mol % or more, preferably 0.05 mol % or more, further preferably 1 mol % or more, particularly preferably 3 mol % or more, and is typically 50 mol % or less, preferably 40 mol % or less, further preferably 30 mol % or less, particularly preferably 20 mol % or less with respect to the total of the substituted elements $C^4$, $D^4$, and $E^4$. The ability to absorb light from a first illuminant (described later) in a device using the phosphor of the present invention tends to suffer greatly when the concentration of the activating ion Mn is too low. On the other hand, concentration quenching becomes prominent, and the emission efficiency tends to greatly decrease when the Mn concentration is excessively high. The content of Mg, Cu, or Zn other than the tetravalent Mn is not particularly limited, as long as it is not detrimental to the luminescence characteristics, as described above. The Mg, Cu, or Zn content is preferably at most about the same as the content of the tetravalent Mn because a heterophase of a chemical composition different from the phosphor of the present invention tends to increase when the Mg, Cu, or Zn content is excessively high.

The phosphor [4] of the present invention may contain elements, for example, such as impurity elements, that become unavoidably mixed but do not interfere with the effects of the present invention, in addition to the constituting elements $A^4$, $B^4$, $C^4$, $D^4$, $E^4$, $X^4$, and $Y^4$.

Patent Literatures 1 to 4 do not describe phosphors that contain all of alkaline earth metals, Al, and F. Patent Literature 5 merely describes containing small amounts of alkaline earth metal only comparable to the level of activating ions. The phosphor of the present invention containing Al and F, and amounts of alkaline earth metal large enough to form even a host has a clearly different composition ratio, and can be considered as a novel phosphor.

(Crystal Phase of Phosphor [4])

The phosphor [4] of the present invention includes a pyrochlore-type crystal phase in at least a part of its crystal phase. Preferably, the pyrochlore-type crystal phase accounts for a large proportion of the crystal phase. Specifically, the proportion of the pyrochlore-type crystal phase in the total crystal phase is typically 50% or more, preferably 70% or more, more preferably 90% or more, particularly preferably 100%.

Because the desired luminescence from the phosphor [4] of the present invention occurs in the pyrochlore-type crystal phase of the crystal phase, the luminance of emitted light can be increased with such large proportions of the pyrochlore-type crystal phase in the crystal phase. The proportion of the pyrochlore-type crystal phase in the total crystal phase can be measured by using a powder X-ray diffraction method.

The phosphor [4] of the present invention, with the foregoing composition and the pyrochlore-type crystal phase, can have excellent durability, and can emit bright light.

Preferably, the phosphor [4] of the present invention has an X-ray diffraction pattern with at least one peak between 2θ angles of from 14.0° to 16.00, at least one peak between 2θ angles of from 29.5° to 31.50, at least one peak between 2θ angles of from 37.5° to 39.50, at least one peak between 2θ angles of from 45.5° to 47.50, and at least one peak between 2θ angles of from 49.5° to 51.50 under exposure to X-rays of 1.54 Å wavelength. Preferably, these peaks represent main peaks of the phosphor [4] of the present invention. However, the phosphor [4] of the present invention may have peaks different from these.

[1-2. Phosphor Characteristics]

<Emission Spectrum>

Preferably, the phosphor of the present invention displays the following characteristics in an emission spectrum measurement performed with excitation light having a peak wavelength of 455 nm.

The peak wavelength λp (nm) in the emission spectrum is typically larger than 600 nm, preferably 605 nm or more, more preferably 610 nm or more, and is typically 660 nm or less, preferably 650 nm or less. The emitted color tends to become yellowish when the emission peak wavelength λp is too short, and the red luminescence tends to become darker as the emission peak wavelength λp increases. These are not desirable because the phosphor characteristics as an orange or a red phosphor may deteriorate in these peak wavelength ranges.

In the phosphor of the present invention, the half width (full width at half maximum; hereinafter, referred to as "FWHM" as appropriate) of the emission peak in the emission spectrum is typically larger than 1 nm, preferably 2 nm or more, further preferably 3 nm or more, and is typically less than 50 nm, more preferably 30 nm or less, further preferably 10 nm or less, even more preferably 8 nm or less, and yet more preferably 7 nm or less. The emission peak intensity may become weak when the half width (FWHM) is too narrow, and the color purity may suffer with an excessively wide half width.

The excitation of the phosphor with light having a peak wavelength of 455 nm may be performed with, for example, a xenon light source. The emission spectrum measurement of the phosphor of the present invention may be performed with, for example, a fluorescence measurement apparatus (JASCO Corporation) equipped with a 150-W xenon lamp as the excitation light source, and a multi-channel CCD detector C7041 (Hamamatsu Photonics) as a spectrum measurement device. Emission peak wavelengths, and half widths of emission peaks can be calculated from the resulting emission spectrum.

<Quantum Efficiency and Absorption Efficiency>

The phosphor of the present invention should have as high an internal quantum efficiency as possible. The value is typically 50% or more, preferably 75% or more, further preferably 85% or more, particularly preferably 90% or more. Low internal quantum efficiency values are not desirable as they tend to lower the emission efficiency.

The phosphor of the present invention should have as high an external quantum efficiency as possible. The value is typically 20% or more, preferably 25% or more, further preferably 30% or more, particularly preferably 35% or more. Low external quantum efficiency values are not desirable as they tend to lower the emission efficiency.

The phosphor of the present invention should have as high an absorption efficiency as possible. The value is typically 25% or more, preferably 30% or more, further preferably 42% or more, particularly preferably 50% or more. Low absorption efficiency values are not desirable as they tend to lower the emission efficiency.

Internal quantum efficiency, external quantum efficiency, and absorption efficiency can be measured by using the methods described in Examples below.

<Weight Median Size $D_{50}$>

The weight median size $D_{50}$ of the phosphor of the present invention is typically 0.1 m or more, preferably 1 m or more, and is typically 50 μm or less, preferably 30 μm or less. When the weight median size $D_{50}$ is too small, the luminance may decrease, or the phosphor particles may aggregate. On the other hand, an excessively large weight median size $D_{50}$ may form a non-uniform coating, or cause clogging of a dispenser or the like.

The weight median size $D_{50}$ of the phosphor of the present invention may be measured by using devices, for example, such as a laser diffraction/scattering particle size distribution measurement device.

<Specific Surface Area>

Preferably, the phosphor of the present invention has a specific surface area of typically 1.3 $m^2/g$ or less, preferably 1.1 $m^2/g$ or less, particularly preferably 1.0 $m^2/g$ or less, and is typically 0.05 $m^2/g$ or more, preferably 0.1 $m^2/g$ or more. When the specific surface area of the phosphor is too small, the large phosphor particle size tends to form a non-uniform coating, or cause clogging of a dispenser or the like. When the specific surface area is too large, the small phosphor particle size increases the external contact area, and the durability suffers.

The specific surface area of the phosphor of the present invention is measured by using the single point BET method, using, for example, a fully automated specific surface area measurement device (flow method; AMS 1000A, Ohkura Riken).

<Particle Size Distribution>

Preferably, the phosphor of the present invention has a single peak value in its particle size distribution.

A presence of two or more peak values is indicative of the presence of a peak value attributed to single particles, and a peak value attributed to an aggregate of single particles. A presence of two or more peak values thus means that the single particles are very small.

Accordingly, the phosphor with a single peak value in its particle size distribution has large single particles with only small numbers of aggregates. This is effective at improving luminance, and improving durability with the small specific surface area due to large growth of single particles.

The particle size distribution of the phosphor of the present invention can be measured by using, for example, a laser diffraction/scattering particle size distribution measurement device (LA-300, Horiba Ltd.). The measurement preferably uses ethanol as a dispersion solvent, and should be performed by stirring the phosphor in a dispersion solvent with a magnet rotor to minimize the influence of the aggregates, after adjusting the initial transmittance to about 90% on the light axis.

The peak width in the particle size distribution should preferably be narrow. Specifically, the quantile deviation (QD) of the particle size distribution of the phosphor particles is typically 0.18 or more, preferably 0.20 or more, and is typically 0.60 or less, preferably 0.40 or less, more preferably 0.35 or less, further preferably 0.30 or less, particularly preferably 0.25 or less.

The quantile deviation of a particle size distribution becomes smaller as the particle sizes of the phosphor particles become more uniform. Specifically, a small quantile deviation of a particle size distribution means that the peak width of particle size distribution is narrow, and that the phosphor particle sizes are uniform.

The quantile deviation of a particle size distribution can be calculated from a particle size distribution curve obtained by measurement with a laser diffraction/scattering particle size distribution measurement device.

<Particle Shape>

The phosphor of the present invention is preferably granular in shape with particles equally grown in three axial directions as observed in an SEM image obtained in accordance with the present invention. A particle shape with equally grown particles in three axial directions has a reduced specific surface area, and the reduced external contact area provides excellent durability.

SEM images can be obtained by using, for example, a SEM (S-3400N, Hitachi).

<Durability>

The phosphor of the present invention has excellent durability. Specifically, a light-emitting unit produced with the phosphor of the present invention has a percentage remaining luminance of typically 75% or more, preferably 85% or more, more preferably 90% or more after being allowed time to stand for 150 hours in an OFF state under 85° C. room temperature and 85% relative humidity conditions.

<Waterfastness>

The phosphor of the present invention has excellent waterfastness. Specifically, the phosphor of the present invention has a phosphor conductivity of preferably 400 μS/cm or less, more preferably 200 μS/cm or less, particularly preferably 160 μS/cm or less as measured in an aqueous dispersion with a conductivity meter ES-12 (HORIBA) after the eluted ions from the phosphor have saturated.

In these conductivity ranges, a light-emitting unit produced with the phosphor of the present invention can be prevented from phosphor deterioration due to moisture contained in the atmosphere or in other materials, and the adverse effect of eluted materials from the phosphor on other materials, for example, such as a liquid medium (described later) can be reduced to provide a desirable light-emitting unit.

[1-3. Phosphor Producing Method]

The method for producing the phosphor of the present invention is not particularly limited, and the phosphor of the present invention may be produced by using, for example, the following methods (1) to (3).

(1) A method that uses two solutions (or solvents) including a poor solvent in a one atmosphere environment, as described in U.S. Pat. No. 3,576,756. For example, a solution (or a solvent) containing all the elements of a phosphor composition of interest is added and mixed with a poor solvent to precipitate a phosphor.

(2) A method that uses two or more solutions, and mixes the solutions in a one atmosphere environment to obtain a phosphor of interest, as described in Japanese Patent No. 4582259. The constituting elements of a phosphor composition are separated into two or more solutions, and the solutions are mixed, upon which the phosphor composition elements are completed, and a phosphor synthesis takes place. This method is preferred for its ability to synthesize a phosphor of interest simply by mixing two solutions, without the need to use other solutions or solvents such as a poor solvent.

(3) A method that performs a hydrothermal synthesis in an autoclave under a pressure above one atmosphere in a temperature range of 300° C. or less, as described in Chem. Mater. 2007, 19, 4933-4942.

When producing the phosphor of the present invention by mixing two or more solutions by using the method (2) described in Japanese Patent No. 4582259, the hydrofluoric acid used for at least one of the solutions is used in the form of an aqueous solution in a concentration of typically 10 weight % or more, preferably 20 weight % or more, more preferably 30 weight % or more, and typically 70 weight % or less, preferably 60 weight % or less, more preferably 50 weight % or less.

The following specifically describes the method for producing the phosphor [1] of the present invention.

When producing the phosphor [1] of the present invention by mixing two or more solutions according to the method (2) above, it is preferable that neither of the mixed solutions contains all the elements that form the phosphor of interest. The following methods 2-1) and 2-2) represent specific examples of mixed solution combinations.

2-1) A solution containing at least element A is mixed with a solution containing element B, element C, element D, and at least Mn and F.

2-2) A solution containing at least element A and element B is mixed with a solution containing at least element C, Mn, and F. Element $R^2$ other than Mn may be contained in either solution. Element D is contained preferably in the solution that contains element C.

The following describes exemplary producing methods in which element A is Na, element B is Ca, element C is Al, element D is Si, and element X is solely F. The source materials used as the sources of elements A to D, X, and R may be appropriately changed according to the elements contained in the composition of the phosphor of the present invention to be produced, and the source materials below are considered preferable.

2-1) Method in which a Solution Containing at Least Na (Element A) is Mixed with a Solution Containing Ca (Element B), Al (Element C), Si (Element D), and at Least Mn and F to Precipitate the Product (Phosphor)

A solution (or "solution A") containing at least Na (element A) is a solution of sodium in water.

Examples of the Na source of solution A include NaCl, NaF, $NaHF_2$, NaBr, NaI, Na(OH), $Na_2CO_3$, $CH_3COONa$, $Na_2SO_4$, $NaNO_3$, NaF, $NaHF_2$, and hydrates thereof. Preferred are $CH_3COONa$, $Na_2SO_4$, $NaNO_3$, NaF, $NaHF_2$, and hydrates thereof because these are highly soluble in water, and do not contain chlorine. These Na sources may be used either alone or in a combination of two or more. Use of element A other than Na may be considered in an analogous fashion, as noted above. Compounds containing element A may be used as the source of element A. Preferred as such compounds are acetates, sulfates, nitrates, fluorides, and hydrates thereof containing element A.

A solution (or solution B) containing Ca (element B), Al (element C), Si (element D), and at least Mn and F is a solution of Ca, Al, Si, and Mn in hydrofluoric acid.

Examples of the Ca source of solution B include $CaCl_2$, $CaF_2$, $CaBr_2$, $CaI_2$, $Ca(OH)_2$, $CaCO_3$, $CH_3COO_2Ca$, $CaSO_4$, $Ca(NO_3)_2$, and hydrates thereof. Preferred are $Ca(OH)_2$, $CaCO_3$, $(CH_3COO)_2Ca$, $Ca(NO_3)_2$, and hydrates thereof because these are highly soluble in water, and do not contain chlorine. These Ca sources may be used either alone or in a combination of two or more. Use of element B other than Ca may be considered in an analogous fashion, as noted above. Compounds containing element B may be used as the source of element B. Preferred as such compounds are carbonates, hydroxides, acetates, nitrates, fluorides, and hydrates thereof containing element B.

Examples of the Al source include $Al(OH)_3$, $AlF_3$, $AlCl_3$, $Al(NO_3)_3$, $Al_2(SO_4)_3$, $(CH_3COO)_3Al$, $(NH_4)_3AlF_6$, and hydrates thereof. Preferred are $AlF_3$, $AlCl_3$, $Al(NO_3)_3$, $Al_2(SO_4)_3$, and hydrates thereof because these are highly soluble in water. More preferred are Cl-free, $(NH_4)_3AlF_6$, $Al(NO_3)_3$, $Al_2(SO_4)_3$, and hydrates thereof because Cl-containing source materials tend to degrade luminescence characteristics. These Al sources may be used either alone or in a combination of two or more. Use of element C other than Al may be considered in an analogous fashion, as noted above. Compounds containing element C may be used as the source of element C. Preferred as such compounds are hexafluoroammonium salts, nitrates, sulfates, and hydrates thereof containing element C.

Examples of the Si source include $SiO_2$, $H_2SiF_6$, and $SiCl_4$. Preferred are $SiO_2$ and $H_2SiF_6$ because these do not contain chlorine. These Si sources may be used either alone or in a combination of two or more.

Examples of the Mn source include $K_2MnF_6$, $KMnO_4$, and $K_2MnCl_6$. Preferred is $K_2MnF_6$ because it does not contain chlorine, which tends to strain and destabilize the crystal lattice, and because $K_2MnF_6$ can stably exist as $MnF_6$ complex ions in hydrofluoric acid while maintaining the oxidation number (tetravalency) that enables activation. These Mn sources may be used either alone or in a combination of two or more.

Preferably, the hydrogen fluoride concentration in solution B is typically 10 weight % or more, preferably 20 weight % or more, more preferably 30 weight % or more, and is typically 70 weight % or less, preferably 60 weight % or less, more preferably 50 weight % or less. When the hydrogen fluoride concentration is too low, the $K_2MnF_6$ and other Mn sources contained in solution B become unstable and susceptible to hydrolysis, and the Mn concentration rapidly fluctuates. This makes it difficult to control the activation level of Mn in the synthesized phosphor, and tends to create large variation in phosphor emission efficiency. An excessively high concentration, on the other hand, tends to increase the risk of procedural complications.

The method used to mix solution A and solution B is not particularly limited. These solutions may be mixed by adding solution B to solution A while stirring solution A, or by adding solution A to solution B while stirring solution B. It is also possible to stir and mix solution A and solution B after charging these solutions into a container together.

Mixing solution A and solution B causes a reaction between the Na source, the Ca source, the Al source, the Mg source, and the Mn source in predetermined proportions, and the phosphor of interest precipitates in crystals. Preferably, the crystals are collected through solid-liquid separation such as by filtration, washed with a solvent such as ethanol, water, and acetone, and dried at typically 100° C. or more, preferably 120° C. or more, more preferably 150° C. or more, and at typically 300° C. or less, preferably 250° C. or less, more preferably 200° C. or less. The drying time is not particularly limited, as long as the moisture adhering to the phosphor can evaporate. The drying time is, for example, about 1 to 2 hours. The drying environment is not particularly limited, as long as the moisture adhering to the phosphor can evaporate. The drying may be performed under one atmosphere of pressure, a reduced pressure of one atmosphere or less, or an inert atmosphere such as in $N_2$, Ar, and He.

In mixing solution A and solution B, the mixed proportions of solution A and solution B need to be adjusted to provide the desired composition for the product phosphor, taking into account the difference between the starting composition of the phosphor source materials and the composition of the product phosphor.

2-2) Method in which a Solution Containing at Least Na (Element A) and Ca (Element B) is Mixed with a Solution Containing at Least Al (Element C), Si (Element D), Mn, and F to Precipitate the Product (Phosphor)

This method is also characterized by non-use of a poor solvent, and has the same advantage as the method 2-1) above.

A solution (or solution C) containing at least Na (element A) and Ca (element B) is a solution of a Na source and a Ca source in water.

Examples of the Na source of solution C include NaCl, NaF, $NaHF_2$, NaBr, NaI, Na(OH), $Na_2CO_3$, $CH_3COONa$, $Na_2SO_4$, $NaNO_3$, and hydrates thereof. Preferred are $CH_3COONa$, $Na_2SO_4$, $NaNO_3$, NaF, $NaHF_2$, and hydrates thereof because these are highly soluble in water, and do not contain chlorine. These Na sources may be used either alone or in a combination of two or more. Use of element A other than Na may be considered in an analogous fashion, as noted above. Compounds containing element A may be used as the source of element A. Preferred as such compounds are acetates, sulfates, nitrates, fluorides, and hydrates thereof containing element A.

Examples of the Ca source of solution C include $CaCl_2$, $CaF_2$, $CaBr_2$, $CaI_2$, $Ca(OH)_2$, $CaCO_3$, $(CH_3COO)_2Ca$, $CaSO_4$, $Ca(NO_3)_2$, and hydrates thereof. Preferred are $Ca(OH)_2$, $CaCO_3$, $(CH_3COO)_2Ca$, $Ca(NO_3)_2$, and hydrates thereof because these do not contain chlorine. These Ca sources may be used either alone or in a combination of two or more. Use of element B other than Ca may be considered in an analogous fashion, as noted above. Compounds containing element B may be used as the source of element B. Preferred as such compounds are carbonates, hydroxides, acetates, nitrates, fluorides, and hydrates thereof containing element B.

A solution (or solution D) containing at least Al (element C), Si (element D), Mn, and F is a solution of Al, Si, and Mn in hydrofluoric acid.

Examples of the Al source of solution D include $Al(OH)_3$, $AlF_3$, $AlCl_3$, $Al(NO_3)_3$, $Al_2(SO_4)_3$, $(CH_3COO)_3Al$, $(NH_4)_3AlF_6$, and hydrates thereof. Preferred are $AlF_3$, $AlCl_3$, $Al(NO_3)_3$, $Al_2(SO_4)_3$, and hydrates thereof because these are highly soluble in water. More preferred are Cl-free, $(NH_4)_3AlF_6$, $Al(NO_3)_3$, $Al_2(SO_4)_3$, and hydrates thereof because Cl-containing source materials tend to interfere with the valency changes of Mn, and degrade luminescence characteristics. These Al sources may be used either alone or in a combination of two or more. Use of element C other than Al may be considered in an analogous fashion, as noted above. Compounds containing element C may be used as the source of element C. Preferred as such compounds are hexafluoroammonium salts, nitrates, sulfates, and hydrates thereof containing element C.

Examples of the Si source include $SiO_2$, $H_2SiF_6$, and $SiCl_4$. Preferred are $SiO_2$ and $H_2SiF_6$ because these do not contain chlorine. These Si sources may be used either alone or in a combination of two or more.

Examples of the Mn source of solution D include $K_2MnF_6$, $KMnO_4$, and $K_2MnCl_6$. Preferred is $K_2MnF_6$ because it does not contain chlorine, which tends to strain and destabilize the crystal lattice, and because $K_2MnF_6$ can stably exist as $MnF_6$ complex ions in hydrofluoric acid while maintaining the oxidation number (tetravalency) that enables activation. These Mn sources may be used either alone or in a combination of two or more.

Preferably, the hydrogen fluoride concentration in solution D is typically 10 weight % or more, preferably 20 weight % or more, more preferably 30 weight % or more, particularly preferably 35 weight % or more, and is typically 70 weight % or less, preferably 60 weight % or less, more preferably 50 weight % or less, particularly preferably 45 weight % or less. When the hydrogen fluoride concentration in solution D is too low, it becomes difficult to control the activation level of Mn in the synthesized phosphor, and this tends to create large variation in phosphor emission efficiency. An excessively high hydrogen fluoride concentration, on the other hand, tends to increase the risk of procedural complications.

The method used to mix solution C and solution D is not particularly limited. These solutions may be mixed by adding solution D to solution C while stirring solution C, or by adding solution C to solution D while stirring solution D. It is also possible to stir and mix solution C and solution D after charging these solutions into a container together.

Mixing solution C and solution D causes a reaction between the Li source, the Ba source, the Al source, the Mg source, and the Mn source in predetermined proportions, and the phosphor of interest precipitates in crystals. Preferably, the crystals are collected through solid-liquid separation such as by filtration, washed with a solvent such as ethanol, water, and acetone, and dried at typically 100° C. or more, preferably 120° C. or more, more preferably 150° C. or more, and at typically 300° C. or less, preferably 250° C. or less, more preferably 200° C. or less. The drying time is not particularly limited, as long as the moisture adhering to the phosphor can evaporate. The drying time is, for example, about 1 to 2 hours. The drying environment is not particularly limited, as long as the moisture adhering to the phosphor can evaporate. The drying may be performed under one atmosphere of pressure, a reduced pressure of one atmosphere or less, or an inert atmosphere such as in $N_2$, Ar, and He.

When producing the phosphor [3] of the present invention by using the method (2) that mixes two or more solutions, it is preferable that neither of the mixed solutions contains all the elements that form the phosphor of interest. The following methods 2-3) and 2-4) represent specific examples of mixed solution combinations.

2-3) A solution containing at least element $C^3$ is mixed with a solution containing at least Mn and F. Element $A^3$, element $B^3$, and element $R^3$ other than Mn may be contained in either solution. Element $D^3$ and element $Y^3$ are contained preferably in the solution that contains element $C^3$.

2-4) A solution containing at least element $A^3$ and element $B^3$ is mixed with a solution containing at least element $C^3$, Mn, and F. Element $R^3$ other than Mn may be contained in either solution. Element $D^3$ and element $Y^3$ are contained preferably in the solution that contains element $C^3$.

The following describes exemplary producing methods in which element $A^3$ is Li, element $B^3$ is Ba, element $C^3$ is Al, element $X^3$ is solely F, and element $R^3$ other than Mn is Mg. The source materials used as the sources of elements $A^3$ to $D^3$, $X^3$, and $R^3$ may be appropriately changed according to the elements contained in the composition of the phosphor of the present invention to be produced, and the source materials below are considered preferable.

2-3) Method in which a Solution Containing at Least Al (Element $C^3$) is Mixed with a Solution Containing at Least Mn and F to Precipitate the Product (Phosphor)

A solution (or solution E) containing at least Al (element $C^3$) is a solution of aluminum in water.

Examples of the Al source of solution E include $Al(OH)_3$, $AlF_3$, $AlCl_3$, $Al(NO_3)_3$, $Al_2(SO_4)_3$, $(CH_3COO)_3Al$, $(NH_4)_3AlF_6$, and hydrates thereof. Preferred are $AlF_3$, $AlCl_3$, $Al(NO_3)_3$, $Al_2(SO_4)_3$, and hydrates thereof because these are highly soluble in water. More preferred are Cl-free, $(NH_4)_3AlF_6$, $Al(NO_3)_3$, $Al_2(SO_4)_3$, and hydrates thereof because Cl-containing source materials tend to degrade luminescence characteristics. These Al sources may be used either alone or in a combination of two or more. Use of element $C^3$ other than Al may be considered in an analogous fashion, as noted above. Compounds containing element $C^3$ may be used as the source of element $C^3$. Preferred as such compounds are hexafluoroammonium salts, nitrates, sulfates, and hydrates thereof containing element $C^3$.

A solution (or solution F) containing at least Mn and F is a solution of a Mn source in hydrofluoric acid.

Examples of the Mn source of solution F include $K_2MnF_6$, $KMnO_4$, and $K_2MnCl_6$. Preferred is $K_2MnF_6$ because it does not contain chlorine, which tends to strain and destabilize the crystal lattice, and because $K_2MnF_6$ can stably exist as $MnF_6$ complex ions in hydrofluoric acid while maintaining the oxidation number (tetravalency) that enables activation. These Mn sources may be used either alone or in a combination of two or more.

Preferably, the hydrogen fluoride concentration in solution F is typically 10 weight % or more, preferably 20 weight % or more, more preferably 30 weight % or more, and is typically 70 weight % or less, preferably 60 weight % or less, more preferably 50 weight % or less. When the hydrogen fluoride concentration is too low, the $K_2MnF_6$ and other Mn sources contained in solution F become unstable and susceptible to hydrolysis, and the Mn concentration rapidly fluctuates. This makes it difficult to control the activation level of Mn in the synthesized phosphor, and tends to create large variation in phosphor emission efficiency. An excessively high concentration, on the other hand, tends to increase the risk of procedural complications.

The Li (element $A^3$) and Ba (element $B^3$) needed to form the phosphor of the present invention, and the Mg that may be contained as element $R^3$ other than Mn may be contained in solution E or solution F. It is, however, preferable that these are contained in the Al-containing solution E to prevent large phosphor composition changes.

Examples of the Li source include LiCl, LiF, LiBr, LiI, Li(OH), $Li_2CO_3$, $CH_3COOLi$, $Li_2SO_4$, $LiNO_3$, and hydrates thereof. Preferred are $CH_3COOLi$, $Li_2SO_4$, $LiNO_3$, and hydrates thereof because these are highly soluble in water, and do not contain chlorine. These Li sources may be used either alone or in a combination of two or more. Use of element $A^3$ other than Li may be considered in an analogous fashion, as noted above. Compounds containing element $A^3$ may be used as the source of element $A^3$. Preferred as such compounds are acetates, sulfates, nitrates, and hydrates thereof containing element $A^3$.

Examples of the Ba source include $BaCl_2$, $BaF_2$, $BaBr_2$, $BaI_2$, $Ba(OH)_2$, $BaCO_3$, $(CH_3COO)_2Ba$, $BaSO_4$, $Ba(NO_3)_2$, and hydrates thereof. Preferred are $(CH_3COO)_2Ba$, $Ba(NO_3)_2$, and hydrates thereof because these are highly soluble in water, and do not contain chlorine. These Ba sources may be used either alone or in a combination of two or more. Use of element $B^3$ other than Ba may be considered in an analogous fashion, as noted above. Compounds containing element $B^3$ may be used as the source of element $B^3$. Preferred as such compounds are acetates, nitrates, and hydrates thereof containing element $B^3$.

Examples of the Mg source include $MgCl_2$, $MgF_2$, $MgBr_2$, $MgI_2$, $Mg(OH)_2$, $MgCO_3$, $(CH_3COO)_2Mg$, $MgSO_4$, $Mg(NO_3)_2$, and hydrates thereof. Preferred are $CH_3COO_2Mg$, $Mg(NO_3)_2$, and hydrates thereof because these are highly soluble in water, and do not contain chlorine. These Mg sources may be used either alone or in a combination of two or more. Use of element $R^3$ other than Mg may be considered in an analogous fashion, as noted above. Compounds containing Cu or Zn may be used as the source of element $R^4$ other than Mn. Preferred as such compounds are acetates, nitrates, and hydrates thereof containing Cu or Zn.

The method used to mix solution E and solution F is not particularly limited. These solutions may be mixed by adding solution F to solution E while stirring solution E, or by adding solution E to solution F while stirring solution F. It is also possible to stir and mix solution E and solution F after charging these solutions into a container together.

Mixing solution E and solution F causes a reaction between the Li source, the Ba source, the Al source, the Mg source, and the Mn source in predetermined proportions, and the phosphor of interest precipitates in crystals. Preferably, the crystals are collected through solid-liquid separation such as by filtration, washed with a solvent such as ethanol, water, and acetone, and dried at typically 100° C. or more, preferably 120° C. or more, more preferably 150° C. or more, and at typically 300° C. or less, preferably 250° C. or less, more preferably 200° C. or less. The drying time is not particularly limited, as long as the moisture adhering to the phosphor can evaporate. The drying time is, for example, about 1 to 2 hours. The drying environment is not particularly limited, as long as the moisture adhering to the phosphor can evaporate. The drying may be performed under one atmosphere of pressure, a reduced pressure of one atmosphere or less, or an inert atmosphere such as in $N_2$, Ar, and He.

In mixing solution E and solution F, the mixed proportions of solution E and solution F need to be adjusted to provide the desired composition for the product phosphor, taking into account the difference between the starting composition of the phosphor source materials and the composition of the product phosphor.

2-4) Method in which a Solution Containing at Least Li (Element $A^3$) Ba (Element $B^3$) is Mixed with a Solution Containing at Least Al (Element $C^3$), Mn, and F to Precipitate the Product (Phosphor)

This method is also characterized by non-use of a poor solvent, and has the same advantage as the method 2-3) above.

A solution (or solution G) containing at least Li (element $A^3$) and Ba (element $B^3$) is a solution of a Li source and a Ba source in water.

Examples of the Li source of solution G include LiCl, LiF, LiBr, LiI, Li(OH), $Li_2CO_3$, $CH_3COOLi$, $Li_2SO_4$, $LiNO_3$, and hydrates thereof. Preferred are $CH_3COOLi$, $Li_2SO_4$, $LiNO_3$, and hydrates thereof because these are highly soluble in water, and do not contain chlorine. These Li sources may be used either alone or in a combination of two or more. Use of element $A^3$ other than Li may be considered in an analogous fashion, as noted above. Compounds containing element $A^3$ may be used as the source of element $A^3$. Preferred as such compounds are acetates, sulfates, nitrates, and hydrates thereof containing element $A^3$.

Examples of the Ba source of solution G include $BaCl_2$, $BaF_2$, $BaBr_2$, $BaI_2$, $Ba(OH)_2$, $BaCO_3$, $(CH_3COO)_2Ba$, $BaSO_4$, $Ba(NO_3)_2$, and hydrates thereof. Preferred are $(CH_3COO)_2Ba$, $Ba(NO_3)_2$, and hydrates thereof because these are highly soluble in water, and do not contain chlorine. These Ba sources may be used either alone or in a combination of two or more. Use of element $B^3$ other than Ba may be considered in an analogous fashion, as noted above. Compounds containing element $B^3$ may be used as the source of element $B^3$. Preferred as such compounds are acetates, nitrates, and hydrates thereof containing element $B^3$.

A solution (or solution H) containing at least Al (element C), Mn, and F is a solution of an Al source and a Mn source in hydrofluoric acid.

Examples of the Al source of solution H include $Al(OH)_3$, $AlF_3$, $AlCl_3$, $Al(NO_3)_3$, $Al_2(SO_4)_3$, $(CH_3COO)_3Al$, $(NH_4)_3AlF_6$, and hydrates thereof. Preferred are $AlF_3$, $AlCl_3$, $Al(NO_3)_3$, $Al_2(SO_4)_3$, and hydrates thereof because these are highly soluble in water. More preferred are Cl-free, $(NH_4)_3AlF_6$, $Al(NO_3)_3$, $Al_2(SO_4)_3$, and hydrates thereof because Cl-containing source materials tend to interfere with the valency changes of Mn, and degrade luminescence characteristics. These Al sources may be used either alone or in a combination of two or more. Use of element $C^3$ other than Al may be considered in an analogous fashion, as noted above. Compounds containing element $C^3$ may be used as the source of element $C^3$. Preferred as such compounds are hexafluoroammonium salts, nitrates, sulfates, and hydrates thereof containing element $C^3$.

Examples of the Mn source of solution H include $K_2MnF_6$, $KMnO_4$, and $K_2MnCl_6$. Preferred is $K_2MnF_6$ because it does not contain chlorine, which tends to strain and destabilize the crystal lattice, and because $K_2MnF_6$ can stably exist as $MnF_6$ complex ions in hydrofluoric acid while maintaining the oxidation number (tetravalency) that enables activation. These Mn sources may be used either alone or in a combination of two or more.

Preferably, the hydrogen fluoride concentration in solution H is typically 10 weight % or more, preferably 20 weight % or more, more preferably 30 weight % or more, particularly preferably 35 weight % or more, and is typically 70 weight % or less, preferably 60 weight % or less, more preferably 50 weight % or less, particularly preferably 45 weight % or less. When the hydrogen fluoride concentration in solution H is too low, it becomes difficult to control the activation level of Mn in the synthesized phosphor, and this tends to create large variation in phosphor emission efficiency. An excessively high hydrogen fluoride concentration, on the other hand, tends to increase the risk of procedural complications.

The method used to mix solution G and solution H is not particularly limited. These solutions may be mixed by adding solution H to solution G while stirring solution G, or by adding solution G to solution H while stirring solution H. It is also possible to stir and mix solution G and solution H after charging these solutions into a container together.

Mixing solution G and solution H causes a reaction between the Li source, the Ba source, the Al source, the Mg source, and the Mn source in predetermined proportions, and the phosphor of interest precipitates in crystals. Preferably, the crystals are collected through solid-liquid separation such as by filtration, washed with a solvent such as ethanol, water, and acetone, and dried at typically 100° C. or more, preferably 120° C. or more, more preferably 150° C. or more, and at typically 300° C. or less, preferably 250° C. or less, more preferably 200° C. or less. The drying time is not particularly limited, as long as the moisture adhering to the phosphor can evaporate. The drying time is, for example, about 1 to 2 hours. The drying environment is not particularly limited, as long as the moisture adhering to the phosphor can evaporate. The drying may be performed under one atmosphere of pressure, a reduced pressure of one atmosphere or less, or an inert atmosphere such as in $N_2$, Ar, and He.

When producing the phosphor [4] of the present invention by using the method (2) that mixes two or more solutions, it is preferable that neither of the mixed solutions contains all the elements that form the phosphor of interest. The following methods 2-5) and 2-6) represent specific examples of mixed solution combinations.

2-5) A solution containing at least element $D^4$ is mixed with a solution containing at least Mn and F. Element $A^4$, and element $R^4$ other than Mn may be contained in either solution. Element $B^4$, element $C^4$, element $E^4$, and element $Y^4$ are contained preferably in the solution that contains element $D^4$.

2-6) A solution containing at least elements $A^4$ to $C^4$ is mixed with a solution containing at least element $D^4$, Mn, and F. Element $E^4$ and element $Y^4$ are contained preferably in the solution that contains element $D^4$.

The following describes exemplary producing methods in which element $A^4$ is Na, element $B^4$ is Ca, element $C^4$ is Mg, element $D^4$ is Al, and element $X^4$ is solely F. The source materials used as the sources of elements $A^4$ to $E^4$, $X^4$, $Y^4$, and $R^4$ may be appropriately changed 49 to be produced, and the source materials below are considered preferable.

2-5) Method in which a Solution Containing at Least Element $D^4$ is Mixed with a Solution Containing at Least Mn and F to Precipitate the Product (Phosphor)

A solution (or solution I) containing at least Al (element $D^4$) is a solution of aluminum in water.

Examples of the Al source of solution I include $Al(OH)_3$, $AlF_3$, $AlCl_3$, $Al(NO_3)_3$, $Al_2(SO_4)_3$, $(CH_3COO)_3Al$, $(NH_4)_3AlF_6$, and hydrates thereof. Preferred are $AlF_3$, $AlCl_3$, $Al(NO_3)_3$, $Al_2(SO_4)_3$, and hydrates thereof because these are highly soluble in water. More preferred are Cl-free, $(NH_4)_3AlF_6$, $Al(NO_3)_3$, $Al_2(SO_4)_3$, and hydrates thereof because Cl-containing source materials tend to degrade luminescence characteristics. These Al sources may be used either alone or in a combination of two or more. Use of element $D^4$ other than Al may be considered in an analogous fashion, as noted above. Compounds containing element $D^4$ may be sued as the source of element $D^4$. Preferred as such compounds are hexafluoroammonium salts, nitrates, sulfates, and hydrates thereof containing element $D^4$.

A solution (or solution J) containing at least Mn and F is a solution of a Mn source in hydrofluoric acid.

Examples of the Mn source of solution J include $K_2MnF_6$, $KMnO_4$, and $K_2MnCl_6$. Preferred is $K_2MnF_6$ because it does not contain chlorine, which tends to strain and destabilize the crystal lattice, and because $K_2MnF_6$ can stably exist as $MnF_6$ complex ions in hydrofluoric acid while maintaining the oxidation number (tetravalency) that enables activation. These Mn sources may be used either alone or in a combination of two or more.

Preferably, the hydrogen fluoride concentration in solution J is typically 10 weight % or more, preferably 20 weight % or more, more preferably 30 weight % or more, and is typically 70 weight % or less, preferably 60 weight % or less, more preferably 50 weight % or less. When the hydrogen fluoride concentration is too low, the $K_2MnF_6$ and other Mn sources contained in solution J become unstable and susceptible to hydrolysis, and the Mn concentration rapidly fluctuates. This makes it difficult to control the activation level of Mn in the synthesized phosphor, and tends to create large variation in phosphor emission efficiency. An excessively high concentration, on the other hand, tends to increase the risk of procedural complications.

The Na (element $A^4$), Ca (element $B^4$), and Mg (element $C^4$) needed to form the phosphor of the present invention may be contained in solution I or solution J. It is, however, preferable that these are contained in the Al-containing solution I to prevent large phosphor composition changes.

Examples of the Na source include NaCl, NaF, $NaHF_2$, NaBr, NaI, Na(OH), $Na_2CO_3$, $CH_3COONa$, $Na_2SO_4$, $NaNO_3$, and hydrates thereof. Preferred are NaF, $NaHF_2$, $CH_3COONa$, $Na_2SO_4$, $NaNO_3$, and hydrates thereof because these are highly soluble in water, and do not contain chlorine. These Na sources may be used either alone or in a combination of two or more. Use of element $A^4$ other than Na may be considered in an analogous fashion, as noted above. Compounds containing element $A^4$ may be used as the source of element $A^4$. Preferred as such compounds are acetates, sulfates, nitrates, and hydrates thereof containing element $A^4$.

Examples of the Ca source include $CaCl_2$, $CaF_2$, $CaBr_2$, $CaI_2$, $Ca(OH)_2$, $CaCO_3$, $(CH_3COO)_2Ca$, $CaSO_4$, $Ca(NO_3)_2$, and hydrates thereof. Preferred are $CH_3COO_2Ca$, $Ca(NO_3)_2$, and hydrates thereof because these are highly soluble in water, and do not contain chlorine. These Ca sources may be used either alone or in a combination of two or more. Use of element $B^4$ other than Ca may be considered in an analogous fashion, as noted above. Compounds containing element $B^4$ may be used as the source of element $B^4$. Preferred as such compounds are acetates, nitrates, and hydrates thereof containing element $B^4$.

Examples of the Mg source include $MgCl_2$, $MgF_2$, $MgBr_2$, $MgI_2$, $Mg(OH)_2$, $MgCO_3$, $(CH_3COO)_2Mg$, $MgSO_4$, $Mg(NO_3)_2$, and hydrates thereof. Preferred are $(CH_3COO)_2Mg$, $Mg(NO_3)_2$, and hydrates thereof because these are highly soluble in water, and do not contain chlorine. These Mg sources may be used either alone or in a combination of two or more. Use of element $C^4$ other than Mg may be considered in an analogous fashion, as noted above. Compounds containing element $C^4$ may be used as the source of element $C^4$. Preferred as such compounds are acetates, nitrates, and hydrates thereof containing element $C^4$.

The method used to mix solution I and solution J is not particularly limited. These solutions may be mixed by adding solution J to solution I while stirring solution I, or by adding solution I to solution J while stirring solution J. It is also possible to stir and mix solution I and solution J after charging these solutions into a container together.

Mixing solution I and solution J causes a reaction between the Na source, the Ca source, the Al source, the Mg source, and the Mn source in predetermined proportions, and the phosphor of interest precipitates in crystals. Preferably, the crystals are collected through solid-liquid separation such as by filtration, washed with a solvent such as ethanol, water, and acetone, and dried at typically 50° C. or more, preferably 70° C. or more, more preferably 80° C. or more, and at typically 300° C. or less, preferably 200° C. or less, more preferably 150° C. or less. The drying time is not particularly limited, as long as the moisture adhering to the phosphor can evaporate. The drying time is, for example, about 1 to 2 hours. The drying environment is not particularly limited, as long as the moisture adhering to the phosphor can evaporate. The drying may be performed under one atmosphere of pressure, a reduced pressure of one atmosphere or less, or an inert atmosphere such as in $N_2$, Ar, and He.

In mixing solution I and solution J, the mixed proportions of solution I and solution J need to be adjusted to provide the desired composition for the product phosphor, taking into account the difference between the starting composition of the phosphor source materials and the composition of the product phosphor.

2-6) Method in which a Solution Containing at Least Na (Element $A^4$), Ca (Element $B^4$), and Mg (Element $C^4$) is Mixed with a Solution Containing at Least Al (Element $D^4$), Mn, and F to Precipitate the Product (Phosphor)

This method is also characterized by non-use of a poor solvent, and has the same advantage as the method 2-5) above.

A solution (or solution K) containing at least Na (element A), Ca (element B), and Mg (element C) is a solution of a Na source, a Ca source, and a Mg source in water.

Examples of the Na source of solution K include NaCl, NaF, $NaHF_2$, NaBr, NaI, Na(OH), $Na_2CO_3$, $CH_3COONa$, $Na_2SO_4$, $NaNO_3$, and hydrates thereof. Preferred are NaF, NaHF2, $CH_3COONa$, $Na_2SO_4$, $NaNO_3$, and hydrates thereof because these are highly soluble in water, and do not contain chlorine. These Na sources may be used either alone or in a combination of two or more. Use of element $A^4$ other than Na may be considered in an analogous fashion, as noted above. Compounds containing element $A^4$ may be used as the source of element $A^4$. Preferred as such compounds are acetates, sulfates, nitrates, and hydrates thereof containing element $A^4$.

Examples of the Ca source of solution K include $CaCl_2$, $CaF_2$, $CaBr_2$, $CaI_2$, $Ca(OH)_2$, $CaCO_3$, $(CH_3COO)_2Ca$, $CaSO_4$, $Ca(NO_3)_2$, and hydrates thereof. Preferred are $(CH_3COO)_2Ca$, $Ca(NO_3)_2$, and hydrates thereof because these are highly soluble in water, and do not contain chlorine. These Ca sources may be used either alone or in a combination of two or more. Use of element $B^4$ other than Ca may be considered in an analogous fashion, as noted above. Compounds containing element $B^4$ may be used as the source of element $B^4$. Preferred as such compounds are acetates, nitrates, and hydrates thereof containing element $B^4$.

Examples of the Mg source of solution K include $MgCl_2$, $MgF_2$, $MgBr_2$, $MgI_2$, $Mg(OH)_2$, $MgCO_3$, $(CH_3COO)_2Mg$, $MgSO_4$, $Mg(NO_3)_2$, and hydrates thereof. Preferred are $(CH_3COO)_2Mg$, $Mg(NO_3)_2$, and hydrates thereof because these are highly soluble in water, and do not contain chlorine. These Mg sources may be used either alone or in a combination of two or more. Use of element $C^4$ other than Mg may be considered in an analogous fashion, as noted above. Compounds containing element $C^4$ may be used as the source of element $C^4$. Preferred as such compounds are acetates, nitrates, and hydrates thereof containing element $C^4$.

A solution (or solution L) containing at least Al (element $D^4$), Mn, and F is a solution of an Al source and a Mn source in hydrofluoric acid.

Examples of the Al source of solution L include $Al(OH)_3$, $AlF_3$, $AlCl_3$, $Al(NO_3)_3$, $Al_2(SO_4)_3$, $(CH_3COO)_3Al$, $(NH_4)_3AlF_6$, and hydrates thereof. Preferred are $AlF_3$, $AlCl_3$, $Al(NO_3)_3$, $Al_2(SO_4)_3$, and hydrates thereof because these are highly soluble in water. More preferred are Cl-free, $(NH_4)_3AlF_6$, $Al(NO_3)_3$, $Al_2(SO_4)_3$, and hydrates thereof because Cl-containing source materials tend to degrade luminescence characteristics. These Al sources may be used either alone or in a combination of two or more. Use of element $D^4$ other than Al may be considered in an analogous fashion, as noted above. Compounds containing element $D^4$ may be used as the source of element $D^4$. Preferred as such compounds are hexafluoroammonium salts, nitrates, sulfates, and hydrates thereof containing element $D^4$.

Examples of the Mn source of solution L include $K_2MnF_6$, $KMnO_4$, and $K_2MnCl_6$. Preferred is $K_2MnF_6$ because it does not contain chlorine, which tends to strain and destabilize the crystal lattice, and because $K_2MnF_6$ can stably exist as $MnF_6$ complex ions in hydrofluoric acid while maintaining the oxidation number (tetravalency) that enables activation. These Mn sources may be used either alone or in a combination of two or more.

Preferably, the hydrogen fluoride concentration in solution L is typically 10 weight % or more, preferably 20 weight % or more, more preferably 30 weight % or more, particularly preferably 35 weight % or more, and is typically 70 weight % or less, preferably 60 weight % or less, more preferably 50 weight % or less, particularly preferably 45 weight % or less. When the hydrogen fluoride concentration in solution L is too low, it becomes difficult to control the activation level of Mn in the synthesized phosphor, and this tends to create large variation in phosphor emission efficiency. An excessively high hydrogen fluoride concentration, on the other hand, tends to increase the risk of procedural complications.

The method used to mix solution K and solution L is not particularly limited. These solutions may be mixed by adding solution L to solution K while stirring solution K, or by adding solution K to solution L while stirring solution L. It is also possible to stir and mix solution K and solution L after charging these solutions into a container together.

Mixing solution K and solution L causes a reaction between the Na source, the Ca source, the Al source, the Mg source, and the Mn source in predetermined proportions, and the phosphor of interest precipitates in crystals. Preferably, the crystals are collected through solid-liquid separation such as by filtration, washed with a solvent such as ethanol, water, and acetone, and dried at typically 50° C. or more, preferably 70° C. or more, more preferably 80° C. or more, and at typically 300° C. or less, preferably 200° C. or less, more preferably 150° C. or less. The drying time is not particularly limited, as long as the moisture adhering to the phosphor can evaporate. The drying time is, for example, about 1 to 2 hours. The drying environment is not particularly limited, as long as the moisture adhering to the phosphor can evaporate. The drying may be performed under one atmosphere of pressure, a reduced pressure of one atmosphere or less, or an inert atmosphere such as in $N_2$, Ar, and He.

[1-4. Surface Treatment of Phosphor]

In order to prevent the unnecessary aggregation of phosphor particles, the phosphor of the present invention may be subjected to a surface treatment by using a known technique. However, care must be taken that the surface treatment does not degrade the phosphor.

[1-5. Use of Phosphor]

The phosphor of the present invention may be used in any application that uses phosphor. The phosphor of the present invention may be used either alone or in a combination of two or more, or may be used as a phosphor mixture with other phosphors in any combination.

By taking advantage of the characteristic excitability with blue light, the phosphor of the present invention can preferably be used for various light-emitting units ("light-emitting unit of the present invention", described later). The phosphor of the present invention is typically a red emitting phosphor, and can be used to produce, for example, a purple to pink light-emitting unit when combined with an excitation light source that emits blue light. The phosphor of the present invention also can be used to produce a white light-emitting unit by combining the phosphor with a blue emitting excitation light source and a green emitting phosphor, or with a near UV light-emitting excitation light source, a blue emitting phosphor, and a green emitting phosphor, and causing the phosphor to emit red light upon excitation with the blue light from the blue emitting excitation light source or the blue emitting phosphor.

The color emitted by the light-emitting unit is not limited to white, and a light-emitting unit that emits a light-bulb color (warm white), a pastel color, or any other color can be produced by appropriately selecting the combination or contents of the phosphors. Such light-emitting units may be used as light emitting members of image display devices (particularly, backlights of liquid crystal panels), and lighting devices.

[2. Phosphor-Containing Composition]

The phosphor of the present invention may be used as a mixture with a liquid medium. Specifically, when the phosphor of the present invention is used in applications such as in light-emitting units, it is preferable to use the phosphor in the form of a dispersion in a liquid medium. A dispersion of the phosphor of the present invention in a liquid medium will be referred to as "phosphor-containing composition of the present invention", as appropriate.

[2-1. Phosphor]

The phosphor of the present invention contained in the phosphor-containing composition of the present invention is not particularly limited, and may be freely selected from the examples above. The phosphor of the present invention may be contained in the phosphor-containing composition of the present invention either alone or in a combination of two or more in any proportions. The phosphor-containing composition of the present invention may contain phosphors other than the phosphor of the present invention, provided that it is not detrimental to the effects of the present invention.

[2-2. Liquid Medium]

The liquid medium used for the phosphor-containing composition of the present invention is not particularly limited, and a curable material adapted to be moldable over a semiconductor light-emitting device may typically be used. As used herein, "curable material" refers to fluidic materials that can be cured in some form of curing process. As used herein, the term "fluidic" means, for example, a liquid or a gelatinous form. The curable material is not limited to specific materials, as long as it serves to guide the emitted light from a solid light-emitting device to the phosphor. The curable material may be used either alone or in a combination of two or more in any proportions. The curable material, then, may be an inorganic material or an organic material, or a mixture of an inorganic material and an organic material.

Examples of the inorganic material include inorganic materials obtained upon solidifying a solution or a combination thereof prepared by sol-gel hydrolysis polymerization of a solution containing metal alkoxide, ceramic precursor polymer, or metal alkoxide (for example, an inorganic material with siloxane bonds).

Examples of the organic material include thermosetting resins and light-curable resins. Specific examples include (meth)acrylic resins such as methyl poly(meth)acrylate; styrene resins such as polystyrene, and styrene-acrylonitrile copolymer; polycarbonate resins; polyester resins; phenoxy resins; butyral resins; polyvinyl alcohol; cellulose resins such as ethylcellulose, cellulose acetate, and cellulose acetate butyrate; epoxy resins; phenolic resins; and silicone resins.

Because the phosphor-containing composition of the present invention contains the phosphor that contains fluorine, preferred for use as the curable material are silicon-containing compounds that do not undergo serious deterioration under the emission of a semiconductor light-emitting device, and that excel in alkali resistance, acid resistance, and heat resistance. Silicon-containing compounds are compounds having silicon atoms within the molecule. Examples include organic materials (silicone-based compounds) such as polyorganosiloxane; inorganic materials such as silicon oxide, silicon nitride, and silicon oxynitride; and glass materials such as borosilicate, phosphosilicate, and alkali silicate. Preferred are silicone-based materials for their advantages including transparency, bondability, ease of handling, and relaxation properties against mechanical and thermal stresses.

Silicone-based materials typically mean organic polymers with the siloxane bonds forming the main chain, and may be, for example, condensed-type, addition-type, modified sol-gel type, or light-curable silicone-based materials.

Examples of the condensed type silicone-based materials include the semiconductor light-emitting unit members described in JP-A-2007-112973, JP-A-2007-112974, JP-A-2007-112975, JP-A-2007-19459, and JP-A-2008-34833. Condensed type silicone-based materials have desirable bondability for the package, the electrodes, the light-emitting device, and other such members used in semiconductor light-emitting units, and require addition of only the least required amount of an adhesion improving component. Another advantage is the excellent heat resistance and lightfastness provided by the crosslinkage formed of mainly siloxane bonds.

Examples of the materials preferred for use as the addition type silicone-based materials include the silicone materials for potting described in JP-A-2004-186168, JP-A-2004-221308, and JP-A-2005-327777; the organic modified silicone material for potting described in JP-A-2003-183881, and JP-A-2006-206919; the silicone materials for injection molding described in JP-A-2006-324596; and the silicone materials for transfer molding described in JP-A-2007-231173. The advantages of the addition type silicone materials include the high selectability of parameters such as the cure rate, and the hardness of the cured product, the absence of desorbing components during the curing and thus resistance to cure shrinkage, and excellent deep curability.

Preferred for use as modified sol gel-type silicone-based materials as a variety of condensed-type silicone-based materials are, for example, the silicone materials described in JP-A-2006-077234, JP-A-2006-291018, and JP-A-2007-119569. Advantages of the modified sol gel-type silicone materials include the high degree of crosslinking, and the accompanying high heat resistance and lightfastness, and high durability. Other advantages include low gas permeability, and excellent protection for phosphors of low moisture resistance.

Preferred for use as the light curable silicone-based materials are, for example, the silicone materials described in JP-A-2007-131812 and JP-A-2007-214543. Advantages of the UV curable silicone materials include good productivity owning to the fast curing time, and no need to apply high curing temperatures, which cause deterioration of the light-emitting device.

The silicone-based materials may be used either alone, or as a mixture of more than one silicone-based materials, provided that mixing of the silicone-based materials does not inhibit curing.

[2-3. Contents of Liquid Medium and Phosphor]

The liquid medium may have any content, as long as it is not detrimental to the effects of the present invention. The liquid medium content is typically 25 weight % or more, preferably 40 weight % or more, and is typically 99 weight % or less, preferably 95 weight % or less, more preferably 80 weight % or less with respect to the total of the phosphor-containing composition of the present invention. The liquid medium does not cause any notable problem even when contained in excess. It is, however, typically preferable to use the liquid medium in the foregoing mixture ratio in order to obtain the desired values in properties such as the chromaticity coordinates, the color rendition index, and the emission efficiency of the product semiconductor light-emitting unit. On the other hand, fluidity may suffer, and handling may become difficult when the liquid medium content is too small.

The liquid medium serves mainly as a binder in the phosphor-containing composition of the present invention. The liquid medium may be used either alone or in a combination of two or more in any proportions. For example, when a silicon-containing compound is used to improve properties such as heat resistance and lightfastness, an epoxy resin and other such thermosetting resin may be contained to the extent that the durability of the silicon-containing compound is not lost. In this case, it is desirable that the content of such a thermosetting resin is typically 25 weight % or less, preferably 10 weight % or less with respect to the total amount of the binder liquid medium.

The phosphor contained in the phosphor-containing composition of the present invention may have any content, as long as it is not detrimental to the effects of the present invention. The phosphor content is typically 1 weight % or more, preferably 5 weight % or more, more preferably 20 weight % or more, and is typically 75 weight % or less, preferably 60 weight % or less with respect to the total of the phosphor-containing composition of the present invention. The proportion of the phosphor of the present invention in the phosphors contained in the phosphor-containing composition may have any value, and is typically 30 weight % or more, preferably 50 weight % or more, and is typically 100 weight % or less. The fluidity of the phosphor-containing composition may suffer, and handling may become difficult when the phosphor content in the phosphor-containing composition is excessive. On the other hand, the emission efficiency of the light-emitting unit tends to suffer when the phosphor content is too small.

[2-4. Other Components]

In addition to the phosphor and the liquid medium, the phosphor-containing composition of the present invention may contain other components, provided such additional components are not detrimental to the effects of the present invention. For example, such additional components are additives such as metal oxides for adjusting refractive index (described later), diffusing agents, fillers, viscosity adjusters, and UV absorbers. The additional components may be used either alone or in a combination of two or more in any proportions.

[3. Light-Emitting Unit]

The light-emitting unit of the present invention (hereinafter, also referred to simply as "light-emitting unit", as appropriate) is a light-emitting unit that includes a first illuminant (excitation light source), and a second illuminant that emits visible light upon exposure to light from the first illuminant. The second illuminant contains a first phosphor that contains one or more of the phosphors of the present invention described above in Section 1 with the heading "Phosphor."

Typically, a phosphor that fluoresces in the red region (hereinafter, also referred to as "red phosphor of the present invention") upon exposure to light from the excitation light source is used as the phosphor of the present invention. Preferably, the red phosphor of the present invention has an emission peak in a 600 nm to 650 nm wavelength range. The red phosphor of the present invention may be used either alone or in a combination of two or more in any proportions.

With the red phosphor of the present invention, the light-emitting unit of the present invention shows high emission efficiency for the excitation light source (first illuminant) that emits light of the blue region, and exhibits excellent properties when used as a white light-emitting unit such as a lighting device, and the light source of liquid crystal displays.

Specifically, preferred examples of the red phosphor of the present invention used for the light-emitting unit of the present invention include the phosphors of the present invention described above in Section 1 with the heading Phosphor, and the phosphors used in Examples in the Example section below.

The configuration of the light-emitting unit of the present invention is not limited, as long as it has the first illuminant (excitation light source), and uses at least the phosphor of the present invention as the second illuminant. The light-emitting unit of the present invention can thus adopt any known configuration. Specific examples of such configurations will be described below.

Preferably, the light-emitting unit of the present invention has an emission peak in a 600 nm to 650 nm wavelength range in the red region of its emission spectrum.

The emission spectrum of the light-emitting unit may be measured by passing a current of 20 mA in a room with the maintained temperature of 25±1° C., using color-illuminance measurement software and an USB 2000-series spectrometer (customized with integrating spheres) available from Ocean Optics. From the data in the 380 nm to 780 nm wavelength region of the emission spectrum, the chromaticity values (x, y, z) can be calculated as the chromaticity coordinates of the XYZ color system specified by JIS Z 8701 (1999). Here, the relation x+y+z=1 holds. In this specification, the XYZ color system is also referred to as XY color system, typically with the notation (x, y).

The light-emitting unit of the present invention has an emission efficiency of typically 10 lm/W or more, preferably 30 lm/W or more, particularly preferably 50 lm/W or more. Emission efficiency is determined by first determining the total flux in an emission spectral measurement performed for the light-emitting unit as above, and dividing the rumen (lm) value by power consumption (W). Power consumption is determined as the product of current value and voltage value in a voltage measurement performed with a True RMS Multimeters, Model 187 & 189 (Fluke) under 20 mA current.

The light-emitting unit of the present invention may provide a white light-emitting unit in which the excitation light source below is used as the first illuminant, and in which known phosphors such as a blue fluorescing phosphor (hereinafter, referred to as "blue phosphor" as appropriate), a green fluorescing phosphor (hereinafter, referred to as "green phosphor" as appropriate), and a yellow fluorescing phosphor (hereinafter, referred to as "yellow phosphor" as appropriate) are used in any combination with the red phosphor above in a known configuration.

As used herein, the color "white" in "white light-emitting unit" is intended to encompass the all shades of white color specified by JIS Z 8701 (1999), including (yellowish) white, (greenish) white, (bluish) white, (purplish) white, and white.

Preferably, "white" is the white specified therein.

[3-1. Configuration of Light-Emitting Unit]

<3-1-1. First Illuminant>

The first illuminant in the light-emitting unit of the present invention emits light that excites the second illuminant (described later).

The emission peak wavelength of the first illuminant is not particularly limited, as long as it overlaps the absorption wavelength of the second illuminant described below. Accordingly, the first illuminant may be selected from illuminants with a wide range of emission wavelengths. Typically, the first illuminant is an illuminant having an emission wavelength from the ultraviolet region to the blue region, particularly preferably an illuminant having an emission wavelength in the blue region.

Specifically, the desired emission peak wavelength of the first illuminant is typically 200 nm or more. When the excitation light is blue light, it is desirable to use an illuminant having an emission peak wavelength of typically 420 nm or more, preferably 430 nm or more, more preferably 440 nm or more, and typically 480 nm or less, preferably 470 nm or less, more preferably 460 nm or less. On the other hand, when the excitation light is near ultraviolet light, the phosphor of the present invention is excited by the blue light of the phosphor that emits blue light upon being excited by near ultraviolet light, and it is accordingly desirable to choose excitation light (near ultraviolet light) of wavelengths that match the excitation band of the blue phosphor. Specifically, it is desirable to use an illuminant having an emission peak wavelength of typically 300 nm or more, preferably 330 nm or more, more preferably 360 nm or more, and typically 420 nm or less, preferably 410 nm or less, more preferably 400 nm or less.

Typically, a semiconductor light-emitting device is used as the first illuminant. Specifically, light emitting diodes (LEDs), and laser diodes (LDs) may be used, for example. Other examples of illuminants that may be used as the first illuminant include organic electroluminescence light-emitting devices, and inorganic electroluminescence light-emitting devices. However, the first illuminant is not limited to the examples presented herein.

Preferred as the first illuminant are GaN LEDs and LDs that use GaN compound semiconductors. GaN LEDs and LDs are preferred because these have much higher emission output and external quantum efficiency than SiC LEDs that emit light of the same region, and can produce very bright light with low power when combined with the phosphor. For example, GaN LEDs and LDs have emission intensity that is typically at least 100 times greater than that of SiC LEDs for a current load of 20 mA. Preferred as GaN LEDs and LDs are those having an $Al_xGa_YN$ emissive layer, a GaN emissive layer, or an $In_xGa_YN$ emissive layer. GaN LEDs with an $In_xGa_YN$ emissive layer are particularly preferred for their considerably high emission intensity. GaN LEDs having a multiple quantum well structure of an $In_xGa_YN$ layer and a GaN layer are further preferred.

The value of X+Y above typically ranges from 0.8 to 1.2. Preferably, the emissive layers of GaN LEDs are doped with Zn or Si, or undoped to adjust the luminescence characteristics.

GaN LEDs includes an emissive layer, a p layer, an n layer, electrodes, and a substrate as basic constituting elements. GaN LEDs of a heterostructure with an emissive layer sandwiched between n-type and p-type layers such as an $Al_xGa_YN$ layer, a GaN layer, and an $In_xGa_YN$ layer are preferred for their high emission efficiency. Further preferred for improved emission efficiency are GaN LEDs having a quantum well hetero structure. The first illuminant may be used either alone or in any combination of two or more in any proportions.

<3-1-2. Second Illuminant>

The second illuminant in the light-emitting unit of the present invention is an illuminant that emits visible light upon exposure to light from the first illuminant described above, and includes a first phosphor that contains the red phosphor of the present invention, and a second phosphor (e.g., a blue phosphor, a green phosphor, a yellow phosphor, and an orange phosphor), which is appropriately contained for different applications, as will be described later. For example, the second illuminant is configured as a dispersion of the first and second phosphors in a sealing material.

The composition of the phosphors used for the second illuminant other than the phosphor of the present invention is not particularly limited, and may contain host crystals, for example, such as metal oxides (e.g., $Y_2O_3$, $YVO_4$, $Zn_2SiO_4$, $Y_3Al_5O_{12}$, and $Sr_2SiO_4$), metal nitrides (e.g., $Sr_2Si_5N_8$), phosphates (e.g., $Ca_5(PO_4)_3Cl$), sulfides (e.g., ZnS, SrS, and CaS), and oxysulfides (e.g., $Y_2O_2S$, and $La_2O_2S$) with ions of rare earth metals such as Ce, Pr, Nd, Pm, Sm, Eu, Tb, Dy, Ho, Er, Tm, and Yb, or ions of metals such as Ag, Cu, Au, Al, Mn, and Sb contained as an activating element or a co-activating element.

Specific examples of the preferred crystal hosts are presented in Table 1 below.

TABLE 1

| Classification | Specific examples |
| --- | --- |
| Sulfides | (ZnCd)S, (CaSrBa)S, $(Ca,Sr,Ba)Ga_2S_4$ |
| Aluminates | $(Y,Gd,Lu)_3(Al,Ga,Sc)_5O_{12}$, $YAlO_3$, $(Ba,Sr,Ca)(Mg,Zn,Mn)Al_{10}O_{17}$, $(Ca,Sr,Ba)Al_{12}O_{19}$, $(La,Ce)MgAl_{11}O_{19}$, $(Mg,Ca,Sr,Ba)Al_2O_4$, $BaAl_2Si_2O_8$, $SrAl_{14}O_{25}$ |
| Silicates | $(Ca,Sr,Ba,Mg)_2SiO_4$, $(La,Gd,Y,Lu)_2SiO_5$, $Zn_2SiO_4$ |
| Oxides | $SnO_2$, $(Y,Gd,Lu)_2O_3$ |
| Borates | $GdMgB_5O_{10}$, $(Y,Gd)BO_3$ |
| Halophosphates | $(Sr,Ca,Ba,Mg)_{10}(PO_4)_6(F,Cl)_2$ |
| Phosphates | $Sr_2P_2O_7$, $(La,Ce,Gd,Y)PO_4$ |
| Nitrides | $(Mg,Ca,Sr,Ba)_2Si_5N_8$, $(Ca,Sr)AlSiN_3$ |
| Oxynitrides | $(Ca,Sr,Ba)Si_2N_2O_2$, $(Ba,Sr)_3Si_6O_{12}N_2$ |
| Vanadates | $(La,Gd,Y,Lu)VO_4$ |
| Tungstates | $CaWO_4$ |

The element compositions of the host crystals, the activating elements, and the co-activating elements are not particularly limited, and the elements may be partly replaced by elements of the same group, as long as the product phosphor can emit visible light by absorbing light of a near ultraviolet to visible region.

Specific examples of the phosphors are presented below. It should be noted, however, that these are merely examples, and the phosphors usable in the present invention are not limited to these. In the examples below, phosphors that differ in only a part of the structures are omitted as appropriate, as above.

<3-1-2-1. First Phosphor>

The second illuminant in the light-emitting unit of the present invention contains the first phosphor that contains at least the phosphor of the present invention. The phosphor of the present invention may be used either alone or in a combination of two or more in any proportions.

Aside from the phosphor of the present invention, the first phosphor may use a phosphor (a concomitant phosphor of the same color) that fluoresces the same color as the phosphor of the present invention. Typically, because the phosphor of the present invention is a red phosphor, the first phosphor may use the phosphor of the present invention in combination with some other red phosphor or a phosphor that fluoresces orange (hereinafter, referred to as "orange phosphor", as appropriate).

The first phosphor used in the light-emitting unit of the present invention preferably has a weight median size $D_{50}$ of typically 2 μm or more, preferably 5 μm or more, and typically 30 μm or less, preferably 20 μm or less. When the weight median size $D_{50}$ is too small, the luminance decreases, and the phosphor particles tend to aggregate. On the other hand, an excessively large weight median size tends to form a non-uniform coating, or cause clogging of a dispenser or the like.

The orange or red phosphor useable with the phosphor of the present invention may be any phosphor, provided that it is not detrimental to the effects of the present invention. The orange or red phosphor used as a concomitant phosphor of the same color preferably has an emission peak wavelength in a wavelength range of typically 570 nm or more, preferably 580 nm or more, more preferably 585 nm or more, and typically 780 nm or less, preferably 700 nm or less, more preferably 680 nm or less.

Examples of phosphors that can be used as such orange or red phosphors are presented in Table 2 below.

TABLE 2

| Classification | Specific examples of usable phosphors |
| --- | --- |
| Eu-activated oxysulfide phosphor | $(La,Gd,Y,Lu)_2O_2S$:Eu |
| Eu-activated oxide phosphor | $Y(V,P)O_4$:Eu, $(La,Gd,Y)_2O_3$:Eu |
| Eu-activated aluminate phosphor | $YAlO_3$:Eu |
| Eu-activated tungstate phosphor | $LiW_2O_8$:Eu, $LiW_2O_8$:Eu,Sm, $Eu_2W_2O_9$, $Eu_2W_2O_9$:Nb, $Eu_2W_2O_9$:Sm, $(Y,Lu)_2WO_6$:Eu, Mo |
| Eu-activated sulfide phosphor | (Ca,Sr,Ba,Mg)S:Eu, $(Ca,Sr,Ba)Y_2S_4$:Eu |
| Eu-activated silicate phosphor | $Ca_2Y_8(SiO_4)_6O_2$:Eu, $LiY_9(SiO_4)_6O_2$:Eu, $(Sr,Ba,Ca)_3SiO_5$:Eu |
| Eu-activated borate phosphor | $(Ba,Sr)_2Mg(BO_3)_2$:Eu, $Ba_2LiB_5O_{10}$:Eu |
| Eu-activated nitride phosphor | $(Mg,Ca,Sr,Ba)AlSiN_3$:Eu, $(Mg,Ca,Sr,Ba)_2(Si,Al)_5N_8$:Eu, $(Mg,Ca,Sr,Ba)SiN_2$:Eu, $SrAlSi_4N_7$:Eu |
| Eu-activated oxynitride phosphor | $(Mg,Ca,Sr,Ba)_2Si_5(N,O)_8$:Eu, $(Mg,Ca,Sr,Ba)Si(N,O)_2$:Eu, $(Mg,Ca,Sr,Ba)AlSi(N,O)_3$:Eu, $(CaY,Li)_x(Si,Al)_{12}(O,N)_{16}$:Eu(α-SiAlON), $SrAl_2SiN_2O_3$:Eu, $SrAlSi_2N_3O_2$:Eu, $Sr_2(Al,Si)_{10}(N,O)_{13}$:Eu |
| Eu,Mn-activated halophosphate phosphor | $(Ca,Sr,Ba,Mg)_{10}(PO_4)_6(F,Cl,Br,OH)$:Eu,Mn |
| Eu,Mn-activated silicate phosphor | $(Ba,Sr,Ca,Mg)_2SiO_4$:Eu,Mn, $(Ba,Sr,Ca,Mg)_3(Zn,Mg)Si_2O_8$:Eu, Mn |
| Eu,Mn-activated phosphate phosphor | $(Sr,Ca,Ba,Mg,Zn)_2P_2O_7$:Eu,Mn |
| Eu,Bi-activated phosphor | $(Gd,Y,Lu,La)_2O_3$:Eu,Bi, $(Gd,Y,Lu,La)_2O_2S$:Eu,Bi, $(Gd,Y,Lu,La)VO_4$:Eu,Bi |

TABLE 2-continued

| Classification | Specific examples of usable phosphors |
|---|---|
| Eu,Ce-activated sulfide phosphor | $(Ca,Sr,Ba)Y_2S_4$:Eu,Ce |
| Eu,Ce-activated nitride phosphor | $(Ba,Sr,Ca)_xSi_yN_z$:Eu,Ce (wherein x, y, and z represent an integer of 1 or more; e.g., (x,y,z) = (2,5,8), (1,1,2), or (1,7,10)) |
| Ce-activated silicate phosphor | $((Y,Lu,Gd,Tb)_{1-x-y}Sc_xCe_y)_2(Ca,Mg)_{1-r}(Mg,Zn)_{2+r}Si_{z-q}Ge_qGe_qO_{12+\delta}$ (wherein x, y, z, r, q, and δ represent numbers that satisfy $0 \le x \le 1$, $0 < y \le 0.3$, $2.5 \le z \le 3.5$, $0 \le r < 1$, $0 \le q \le 3$, and $-1.5 \le \delta \le 1.5$) |
| Ce-activated aluminate phosphor | $(Y,Gd,Tb,Lu)_3Al_5O_{12}$:Ce |
| Mn-activated germanate phosphor | $3.5MgO•0.5MgF_2•GeO_2$:Mn |
| Mn-activated fluoride phosphor | $(Li,Na,K,Rb,Cs)_2(Ti,Zr,Si,Ge)F_6$:Mn, $(Li,Na,K,Rb,Cs)_3(Al,Ga)F_6$:Mn |
| Other Mn-activated phosphor | $Mg_2TiO_4$:Mn, $MgGa_2O_4$:Mn |
| Red organic phosphor | β-diketonate, β-diketone, aromatic carboxylic acid, or rare earth element ion complexes with Brønted acid or other such anions contained as ligands |
| Pigments | Perylene pigments (e.g., dibenzo{[f,f']-4,4',7,7'-tetraphenyl}diindeno[1,2,3-c d:1',2',3'-lm]perylene, anthraquinone pigments, lake pigments, azo pigments, quinacridone pigments, anthracene pigments, isoindoline pigments, isoindolinone pigments, phthalocyanine pigments, triphenylmethane basic dyes, indanthrone pigments, indophenol pigments, cyanine pigments, and dioxazine pigments |

Preferred as red phosphors are $(Ca,Sr,Ba)_2Si_5(N,O)_8$:Eu, $(Ca,Sr,Ba)Si(N,O)_2$:Eu, $(Ca,Sr,Ba)AlSi(N,O)_3$:Eu, $(Sr,Ba)_3SiO_5$:Eu, (Ca,Sr)S:Eu, $(La,Y)_2O_2S$:Eu, β-diketone Eu complexes (such as an $Eu(dibenzoylmethane)_3$.1,10-phenanthroline complex), carboxylic acid Eu complexes, and $K_2SiF_6$:Mn. More preferred are $(Ca,Sr,Ba)_2Si_5(N,O)_8$:Eu, (Sr,Ca)AlSi(N,O):Eu, $(La,Y)_2O_2S$:Eu, and $K_2SiF_6$:Mn.

Preferred as orange phosphors are $(Sr,Ba)_3SiO_5$:Eu, $(Sr,Ba)_2SiO_4$:Eu, $(Ca,Sr,Ba)_2Si_5(N,O)_8$:Eu, and $(Ca,Sr,Ba)AlSi(N,O)_3$:Ce.

<3-1-2-2. Second Phosphor>

The second illuminant in the light-emitting unit of the present invention may contain a phosphor (second phosphor), in addition to the first phosphor described above, depending on the intended use. The second phosphor represents one or more phosphors having emission peak wavelengths different from that of the first phosphor. Typically, the second phosphor is used to adjust the color of the second illuminant, and often uses phosphors that fluoresce colors different from the color of the first phosphor. The first phosphor typically uses a red phosphor as described above, and accordingly the second phosphor uses non-red phosphors, for example, such as a blue phosphor, a green phosphor, and a yellow phosphor.

The second phosphor used in the light-emitting unit of the present invention preferably has a weight median size $D_{50}$ of typically 2 m or more, preferably 5 μm or more, and typically 30 μm or less, preferably 20 μm or less. When the weight median size $D_{50}$ is too small, the luminance tends to decrease, and the phosphor particles tend to aggregate. On the other hand, an excessively large weight median size tends to form a non-uniform coating, or cause clogging of a dispenser or the like.

<Blue Phosphor>

When a blue phosphor is used as the second phosphor with the phosphor of the present invention, the blue phosphor may be any blue phosphor, provided that it is not detrimental to the effects of the present invention. Preferably, the blue phosphor has an emission peak wavelength of typically 420 nm or more, preferably 430 nm or more, more preferably 440 nm or more, and typically 490 nm or less, preferably 480 nm or less, more preferably 470 nm or less, further preferably 460 nm or less. In these ranges, the emission peak wavelength of the blue phosphor overlaps the excitation band of the phosphor of the present invention, and the blue light from the blue phosphor can efficiently excite the phosphor of the present invention.

Examples of phosphors usable as such blue phosphors are presented in Table 3 below.

TABLE 3

| Classification | Specific examples of usable phosphors |
|---|---|
| Eu-activated aluminate phosphor | $(Ba,Sr,Ca)MgAl_{10}O_{17}$:Eu, $(Sr,Ca,Ba)Al_2O_4$:Eu, $BaAl_8O_{13}$:Eu, $(Sr,Ca,Ba)_4Al_{14}O_{25}$:Eu |
| Eu-activated silicate phosphor | $BaAl_2Si_2O_8$:Eu, $(Ba,Ca,Sr)_3MgSi_2O_9$:Eu, $(Ba,Ca,Mg,Sr)_2SiO_4$:Eu |
| Eu-activated phosphate phosphor | $(Ca,Sr,Ba)_2P_2O_7$:Eu |
| Eu-activated borosilicate phosphor | $(Ba,Sr,Ca)BPO_5$:Eu, $2SrO•0.84P_2O_5•0.16B_2O_3$:Eu |
| Eu-activated halophosphate phosphor | $(Mg,Ca,Sr,Ba)_5(PO_4)_3(Cl,F)$:Eu, $(Ba,Sr,Ca)_5(PO_4)_3(Cl,F,Br,OH)$:Eu,Mn,Sb |
| Eu-activated haloborate phosphor | $(Ca,Sr,Ba)_2B_5O_9Cl$:Eu |
| Eu-activated halosilicate phosphor | $Sr_2Si_3O_8•2SrCl_2$:Eu |
| Eu-activated oxynitride phosphor | $SrSi_9Al_{19}ON_{31}$:Eu, $EuSi_9Al_{19}ON_{31}$ |

TABLE 3-continued

| Classification | Specific examples of usable phosphors |
|---|---|
| Eu,Mn-activated aluminate phosphor | $(Ba,Sr,Ca)MgAl_{10}O_{17}$:Eu,Mn |
| Eu, Mn-activated borophosphate phosphor | $(Ba,Sr,Ca)BPO_5$:EU,Mn, $(Sr,Ca)_{10}(PO_4)_6 \bullet nB_2O_3$:Eu, $2SrO \bullet 0.84P_2O_5 \bullet 0.16B_2O_3$:Eu |
| Ce-activated silicate phosphor | $Y_2SiO_5$:Ce |
| Ce-activated oxynitride phosphor | $LaAl(Si,Al)_6(N,O)_{10}$:Ce, $(La,Ca)Al(Si,Al)_6(N,O)_{10}$:Ce |
| Ce-activated nitride phosphor | $LaSi_3N_5$:Ce |
| Ce-activated thiogallate phosphor | $(Ca,Sr,Ba)Ga_2S_4$:Ce |
| Sulfide phosphor | ZnS:Ag, ZnS:Ag,Al |
| Tungstate phosphor | $CaWO_4$, $CaWO_4$:Pb |
| Sn-activated phosphor | $Sr_2P_2O_7$:Sn |
| Fluorescent pigments | Naphthalimide compounds, benzoxazole compounds, styryl compounds, coumalin compounds, pyralizone compounds, and triazole compounds |
| Organic phosphor | Thulium complexes |

Preferred as blue phosphors are $(Ba,Sr,Ca)MgAl_{10}O_{17}$:Eu, $(Sr,Ca,Ba,Mg)_{10}(PO_4)_6(Cl,F)_2$:Eu, $(Ba,Ca,Mg,Sr)_2SiO_4$:Eu, $(Sr,Ca,Ba,Mg)_{10}(PO_4)_6(Cl,F)_2$:Eu, and $(Ba,Ca,Sr)_3MgSi_2Os$:Eu. More preferred are $(Ba,Sr)MgAl_{10}O_{17}$:Eu, $(Ca,Sr,Ba)_{10}(PO_4)_6(Cl,F)_2$:Eu, and $Ba_3MgSi_{28}$:Eu. Particularly preferred are $Sr_{10}(PO_4)_6Cl_2$:Eu, and $BaMgAl_{10}O_{17}$:Eu.

The blue phosphors exemplified above may be used either alone or in a combination of two or more in any proportions.

<Green Phosphor>

When a green phosphor is used as the second phosphor with the phosphor of the present invention, the green phosphor may be any green phosphor, provided that it is not detrimental to the effects of the present invention. Preferably, the green phosphor has an emission peak wavelength of typically larger than 500 nm, preferably 510 nm or more, further preferably 515 nm or more, and typically 550 nm or less, preferably 542 nm or less, further preferably 535 nm or less. The emitted light tends to become bluish when the emission peak wavelength is too short, and yellowish when the emission peak wavelength is too long. In either case, the phosphor characteristics as a green phosphor may deteriorate.

Examples of phosphors usable as such green phosphors are presented in Table 4 below.

TABLE 4

| Classification | Specific examples of usable phosphors |
|---|---|
| Eu-activated alkali earth silicon oxynitride oxynitride phosphor | $(Mg,Ca,Sr,Ba)Si_2O_2N_2$:Eu, $(Ba,Sr,Ca)_3Si_6O_{12}N_2$:Eu, $(Ba,Sr,Ca)_3Si_6O_9N_4$:Eu, $(Si,Al)_6(O,N)_8$:Eu(β-SiAlON), $BaSi_7N_{10}$:Eu, $(Ba,Sr)(Si,Al)_7(N,O)_{10}$:Eu |
| Eu-activated aluminate phosphor | $Sr_4Al_{14}O_{25}$:Eu, $SrAl_2O_4$:Eu, $(Ba,Sr,Ca)Al_2O_4$:Eu |
| Eu-activated silicate phosphor | $(Ba,Sr,Ca,Mg)_2SiO_4$:Eu, $(Sr,Ba)Al_2Si_2O_8$:Eu, $Ba_9Sc_2Si_6O_{24}$:Eu, $(Ba,Sr,Ca)_2(Mg,Zn)Si_2O_7$:Eu, $(Ba,Ca,Sr,Mg)_9(Sc,Y,Lu,Gd)_2(Si,Ge)_5O_{24}$:Eu |
| Eu-activated borophosphate phosphor | $Sr_2P_2O_7 \bullet Sr_2B_2O_5$:Eu |
| Eu-activated halosilicate phosphor | $Sr_2Si_3O_8 \bullet 2SrCl_2$:Eu, $Ca_3SiO_4Cl_2$:Eu |
| Eu-activated oxynitride phosphor | $Sr_3Si_{13}Al_3O_2N_{21}$:Eu |
| Eu-activated thiogallate phosphor | $(Sr,Ba,Ca)Ga_2S_4$:Eu |
| Eu-activated thioaluminate phosphor | $(Sr,Ca,Ba)(Al,Ga,In)_2S_4$:Eu |
| Eu,Mn-activated aluminate phosphor | $(Ba,Sr,Ca)MgAl_{10}O_{17}$:Eu,Mn |
| Eu,Mn-activated halosilicate phosphor | $(Ca,Sr)_8(Mg,Zn)(SiO_4)_4Cl_2$:Eu,Mn |
| Ce-activated aluminate phosphor | $(Y,Gd,Tb,La,Sm,Pr,Lu)_3(Al,Ga,Sc)_5O_{12}$:Ce |
| Ce-activated silicate phosphor | $(Ca,Sr,Na,Li)_3(Sc,Mg,Na,Li)_2(Si,Ge)_3O_{12}$:Ce |
| Ce-activated oxide phosphor | $(Ca,Sc)Sc_2O_4$:Ce |
| Tb-activated aluminate phosphor | $CeMgAl_{11}O_{19}$:Tb, $Y_3(Al,Ga)_5O_{12}$:Tb |
| Tb-activated silicate phosphor | $Ca_2Y_8(SiO_4)_6O_2$:Tb, $La_3Ga_5SiO_{14}$:Tb |
| Tb-activated oxysulfide phosphor | $(La,Gd,Y)_2O_2S$:Tb |
| Ce,Tb-activated phosphor | $Y_2SiO_5$:Ce:Tb |
| Ce,Tb-activated phosphate phosphor | $LaPO_4$:Ce,Tb |
| Ce,Tb-activated borate phosphor | $(Y,Ga,Lu,Sc,La)BO_3$:Ce,Tb, $Na_2Gd_2B_2O_7$:Ce,Tb, $(Ba,Sr)_2(Ca,Mg,Zn)B_2O_6$:K,Ce,Tb |
| Mn-activated phosphor | $Zn_2(Si,Ge)O_4$:Mn, $Zn(Al,Ga)_2O_4$:Mn |
| Sulfide phosphor | ZnS:Cu,Al, ZnS:Cu,Au,Al |
| Fluorescent pigments | Pyridine phthalimide condensed derivatives, benzoxazinone pigments, quinazolinone pigments, coumalin pigments, quinophthalone pigments, and narthalimide pigments |
| Organic phosphor | Terbium complexes |

Preferred as green phosphors are $Y_3(Al,Ga)_5O_{12}$:Ce, CaSc2$O_4$:Ce, $Ca_3(Sc,Mg)_2Si_3O_{12}$:Ce, $(Sr,Ba)_2SiO_4$:Eu, $(Si,Al)_6(O,N)_8$:Eu((β-sialon), $(Ba,Sr)_3Si_6O_{12}$:$N_2$:Eu, $SrGa_2S_4$:Eu, and $BaMgAl_{10}O_{17}$:Eu,Mn.

When the light-emitting unit is used for a lighting device, the green phosphor is preferably $Y_3(Al,Ga)_5O_{12}$:Ce, $CaSc_2O_4$:Ce$Ca_3(Sc,Mg)_2Si_3O_{12}$:Ce, $(Sr,Ba)_2SiO_4$:Eu, $(Si,Al)_6(O,N)_8$:Eu(β-sialon), or $(Ba,Sr)_3Si_6O_{12}$:$N_2$:Eu.

When the light-emitting unit is used for an image display device, the green phosphor is preferably $(Sr,Ba)_2SiO_4$:Eu, $(Si,Al)_6(O,N)_8$:Eu(β-sialon), $(Ba,Sr)_3Si_6O_{12}$:$N_2$:Eu, $SrGa_2S_4$:Eu, or $BaMgAl_{10}O_{17}$:Eu,Mn.

The green phosphors exemplified above may be used either alone or in a combination of two or more in any proportions.

<Yellow Phosphor>

When a yellow phosphor is used as the second phosphor with the phosphor of the present invention, the yellow phosphor may be any yellow phosphor, provided that it is not detrimental to the effects of the present invention. The yellow phosphor preferably has an emission peak wavelength in a wavelength range of typically 530 nm or more, preferably 540 nm or more, more preferably 550 nm or more, and typically 620 nm or less, preferably 600 nm or less, more preferably 580 nm or less.

Examples of phosphors usable as such yellow phosphors are presented in Table 5 below.

TABLE 5

| Classification | Specific examples of usable phosphors |
|---|---|
| Garnet phosphor | $(Y,Gd,Tb,Lu,Sm)_3(Al,Ga,Sc)_5O_{12}$:Ce, $(Ca,Sr,Na,Li)_3(Sc,Mg)_2(Si,Ge)_3O_{12}$:Ce, $Lu_2CaMg_2(Si,Ge)_3O_{12}$:Ce |
| Orthosilicate phosphor | $(Ba,Sr,Ca,Mg,Zn)_2(Si,Ge)O_4$:Eu |
| Ce-activated nitride phosphor | $(Ca,Sr,Ba)AlSiN_3$:Ce, $Y_2Si_4N_6C$:Ce, $(La,Ca)_3Si_6N_{11}$:Ce |
| Ce-activated oxynitride phosphor | $(Ca,Sr,Ba,Mg,Zn)AlSi(N,O)_3$:Ce |
| Sulfide phosphor | $(Ca,Sr)(Ga,Al)_2S_4$:Eu |
| Eu-activated oxynitride phosphor | $Ca_x(Si,Al)_{12}(O,N)_{16}$:Eu(α-sialon), $(Ca,Sr)Si_2N_2O_2$:Eu |
| Fluorescent dyes | Brilliant sulfoflavine FF (Colour Index Number 56205), basic yellow HG (Colour Index Number 46040), eosine (Colour Index Number 45380), rhodamine 6G (Colour Index Number 45160) |

Preferred as yellow phosphors are $Y_3Al_5O_{12}$:Ce, $(Y,Gd)_3Al_5O_{12}$:Ce, $(Ba,Sr,Ca,Mg)_2SiO_4$:Eu, and $(Ca,Sr)Si_2N_2O_2$:Eu.

The yellow phosphors exemplified above may be used either alone or in a combination of two or more in any proportions.

Specifically, when the semiconductor light-emitting unit of the present invention is configured as a white light-emitting unit, the semiconductor light-emitting device may preferably be combined with the $Mn^{4+}$-activated fluorine-containing phosphor and other phosphors in, for example, the following combinations (A) to (C).

(A) A combination in which a blue illuminant (e.g., a blue LED) is used as the semiconductor light-emitting device, the $Mn^{4+}$-activated phosphor of the present invention is used as a red phosphor, and a green or yellow phosphor is used as other phosphor. The green phosphor is preferably one or more selected from the group consisting of $(Ba,Sr,Ca,Mg)_2SiO_4$:Eu phosphors, $(Ca,Sr)Sc_2O_4$:Ce phosphors, $Ca_3(Sc,Mg)_2Si_3O_{12}$:Ce phosphors, $SrGa_2S_4$:Eu phosphors, Eu-activated β-sialon phosphors, $(Mg,Ca,Sr,Ba)Si_2O_2N_2$:Eu phosphors, and $M_3Si_6O_{12}N_2$:Eu (wherein M represents an alkaline earth metal element). The yellow phosphor is preferably one or more selected from the group consisting of $Y_3Al_5O_{12}$:Ce phosphors, $(Ba,Sr,Ca,Mg)_2SiO_4$:Eu phosphors, and α-sialon phosphors. The green phosphor and the yellow phosphor may be used together.

(B) A combination in which a near ultraviolet illuminant (e.g., a near ultraviolet LED) is used as the semiconductor light-emitting device, the $Mn^{4+}$-activated phosphor of the present invention is used as a red phosphor, and blue and green phosphors are used as other phosphor. In this case, the blue phosphor is preferably one or more selected from the group consisting of $(Ba,Sr,Ca)MgAl_{10}O_{17}$:Eu, $(Sr,Ba)_3MgSi_2O_8$:Eu, and $(Sr,Ca,Ba,Mg)_{10}(PO_4)_6(Cl,F)_2$:Eu. The green phosphor is preferably one or more selected from the group consisting of the green phosphors exemplified in the combination (A) above, $(Ba,Sr)MgAl_{10}O_{17}$:Eu,Mn, $(Ba,Sr,Ca)_4Al_{14}O_{25}$:Eu, and $(Ba,Sr,Ca)Al_2O_4$:Eu.

(C) A combination in which a blue illuminant (e.g., a blue LED) is used as the semiconductor light-emitting device, the $Mn^{4+}$-activated phosphor of the present invention is used as a red phosphor, and an orange phosphor is used. In this case, the orange phosphor is preferably $(Sr,Ba)_3SiO_5$:Eu.

The $Mn^{4+}$-activated phosphor of the present invention is preferably a combination of the phosphors represented by the foregoing formula [1], as described above.

The following specifically describes the combinations of phosphors. When a blue illuminant such as a blue LED is used as the semiconductor light-emitting device for image display device backlight applications, it is preferable to use the combinations presented in Table 6 below.

TABLE 6

| | |
|---|---|
| Red phosphor | $Mn^{4+}$-activated fluorine-containing phosphor |
| Green phosphor | $(Ba,Sr)_3Si_6O_{12}N_2$:Eu, Eu-activated β-SiAlON, $(Ba,Sr,Ca,Mg)Si_2O_2N_2$:Eu, $(Ba,Sr,Ca,Mg)_2SiO_4$:Eu |

Table 7 below presents the more preferred combinations of the combinations presented in Table 6.

TABLE 7

| | |
|---|---|
| Red phosphor | $Mn^{4+}$-activated fluorine-containing phosphor |
| Green phosphor | $(Ba,Sr)_3Si_6O_{12}N_2$:Eu, Eu-activated β-SiAlON |

Table 8 below presents the particularly preferred combinations.

TABLE 8

| | |
|---|---|
| Red phosphor | $Mn^{4+}$-activated fluorine-containing phosphor |
| Green phosphor | $(Ba,Sr)_3Si_6O_{12}N_2$:Eu |

The phosphors of different colors presented in Tables 6 to 8 are excited by light of the blue region, and emit light in narrow ranges of the red region and the green region. These phosphors also have excellent temperature characteristics that involve only small emission peak intensity changes due to temperature change.

A semiconductor light-emitting unit suited as a light source for the backlight of a color image display device of the present invention, capable of accommodating a higher emission efficiency setting than in the related art can thus be provided by combining the semiconductor light-emitting device that emits light of the blue region with two or more phosphors including the phosphors of different colors presented above.

When a solid light-emitting device that emits light of the near ultraviolet to ultraviolet region is used with the phosphors, the combinations of phosphors presented in Tables 6 to 8 are used with preferably one or more blue phosphors selected from the group consisting of $(Sr,Ca,Ba,Mg)_{10}(PO_4)_6(Cl,F)$:Eu, $(Sr,Ba)_3MgSi_2O_8$:Eu, and $(Ba,Sr,Ca)MgAl_{10}O_{17}$:Eu, more preferably with $(Sr,Ca,Ba,Mg)_{10}(PO_4)_6(Cl,F)$:Eu, or $(Ba,Sr,Ca)MgAl_{10}O_{17}$:Eu. In this case, it is preferable to combine $BaMgAl_{10}O_{17}$:Eu,Mn as the green phosphor.

[4. Embodiments of Light-Emitting Unit]

[4-1. Embodiment of Light-Emitting Unit]

Specific embodiments of the light-emitting unit of the present invention are described below. It should be noted, however, that the present invention is not limited by the following embodiments, and may be implemented in various modifications within the gist of the present invention.

FIG. 1 is a schematic perspective view of an example of the light-emitting unit of the present invention, representing the positional relationship between the first illuminant provided as an excitation light source, and the second illuminant configured as a phosphor-containing portion with phosphors. The light-emitting unit shown in FIG. 1 includes a phosphor-containing portion (second illuminant) 1, a surface-emitting GaN LD 2 provided as an excitation light source (first illuminant), and a substrate 3. In order to achieve a mutually contacting state, the surfaces of the excitation light source 2 (LD) and the phosphor-containing portion 1 (second illuminant) may be brought into contact with each other with an adhesive or other means after separately producing these members, or the phosphor-containing portion 1 (second illuminant) may be deposited (molded) on the emissive surface of the excitation light source 2 (LD). The excitation light source 2 (LD) and the phosphor-containing portion 1 (second illuminant) can be brought into contact with each other by using either of these methods.

With this configuration, a loss of light quantity due to leakage of light from the excitation light source (first illuminant) occurring upon being reflected at the film surface of the phosphor-containing portion (second illuminant) can be avoided, and the emission efficiency of the unit can be improved as a whole.

Figure 2A:
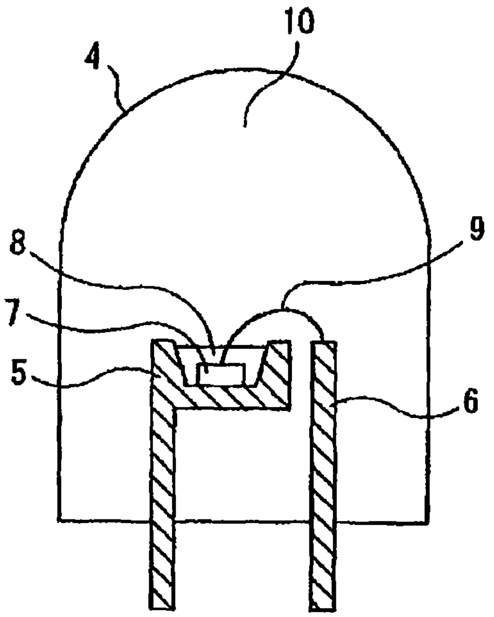
FIG. 2A is a schematic cross sectional view representing an embodiment of a shell-type light-emitting unit of the present invention.

FIG. 2A is schematic cross sectional view of an exemplary light-emitting unit of a form commonly called a shell-type, showing an excitation light source (first illuminant) and a phosphor-containing portion (second illuminant) provided therein. The light-emitting unit 4 includes a mount lead 5, an inner lead 6, an excitation light source (first illuminant) 7, a phosphor-containing portion 8, a conductive wire 9, and a molded member 10.

Figure 2B:
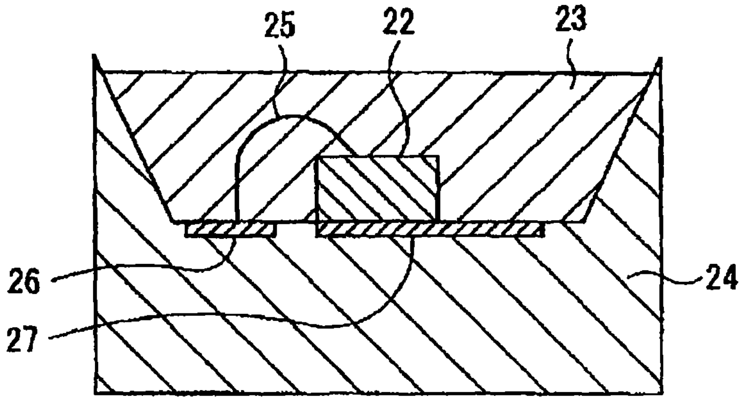
FIG. 2B is a schematic cross sectional view representing an embodiment of a surface-mounted light-emitting unit of the present invention.

FIG. 2B is a schematic cross sectional view of an exemplary light-emitting unit of a form commonly referred to as a surface-mounted light-emitting unit, showing an excitation light source (first illuminant) and a phosphor-containing portion (second illuminant) provided therein. The light-emitting unit shown in the figure includes an excitation light source (first illuminant) 22, a phosphor-containing portion (second illuminant) 23, a frame 24, a conductive wire 25, and electrodes 26 and 27.

[4-2. Use of Light-Emitting Unit]

Use of the light-emitting unit of the present invention is not particularly limited, and may typically be used in a variety of fields where light-emitting units are used. With its desirable color rendering properties and wide color reproduction range, the light-emitting unit of the present invention is particularly preferable for use as a lighting device, or a light source of image display devices.

<4-2-1. Lighting Device>

When using the light-emitting unit of the present invention for lighting devices, the light-emitting unit exemplified above may be appropriately assembled into a known lighting device. For example, the light-emitting unit 4 may be assembled to provide the surface-emitting lighting device 11 shown in FIG. 3.

Figure 3:
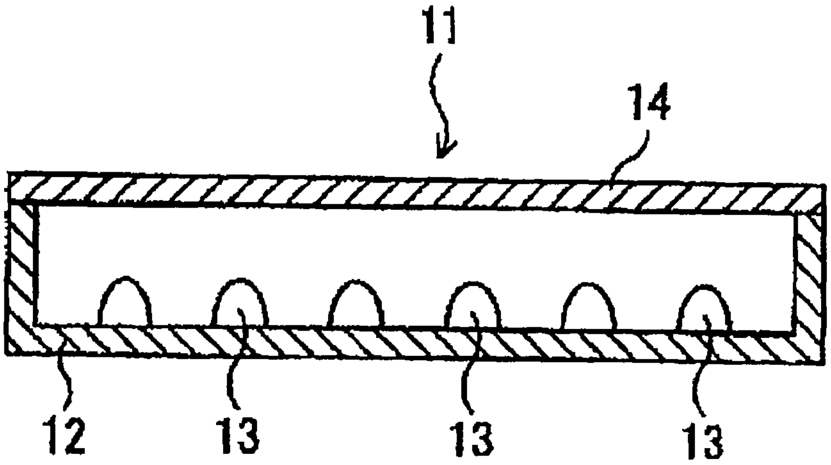
FIG. 3 is a schematic cross sectional view representing an embodiment of a lighting device of the present invention.

FIG. 3 is a cross sectional view schematically representing an embodiment of the lighting device of the present invention. As shown in FIG. 3, the surface-emitting lighting device includes a large number of light-emitting units 13 (each corresponding to the light-emitting unit 4) on the bottom surface of a rectangular holding casing 12 having opaque inner surfaces (e.g., smooth white surfaces). A power supply, circuits, and other such members (not illustrated) are externally disposed to drive the light-emitting unit 13. For uniform emission, an opaque white diffusion plate 14, such as an acrylic plate, is fixed in a position that corresponds to the cover of the holding casing 12.

Light is emitted upon driving the surface-emitting lighting device 11 and applying a voltage to the excitation light sources (first illuminant) of the light-emitting units 13. Some of the emitted light is absorbed by the phosphor in the phosphor-containing resin portion representing the phosphor-containing portion (second illuminant), and the phosphor emits visible light. The light also becomes mixed with light of other colors such as blue light that was not absorbed by the phosphor. The resulting light with high color rendering properties is then emitted (upward in the figure) through the diffusion plate 14 to produce illumination light of uniform brightness over the plane of the diffusion plate 14 of the holding casing 12.

<4-2-2. Image Display Device>

When using the light-emitting unit of the present invention as a light source of an image display device, the image display device is not limited to a specific configuration. It is, however, preferable to use the light-emitting unit with a color filter. For example, when the image display device is a color image display device with color liquid crystal display elements, the light-emitting unit may be used as the backlight, and combined with a liquid crystal light shutter coupled to red, green, and blue pixel color filters.

EXAMPLES

The present invention is described below in greater detail using Examples. Note, however, that the present invention is not limited by the following Examples, and various changes may be made within the gist of the present invention.

[Physical Property Value Measurement Methods]

Various physical property values of the phosphors obtained in the Examples and the Comparative Examples below were measured and calculated by using the following methods.

{Luminescence Characteristics}

<Emission Spectrum>

Emission spectrum measurement was performed at room temperature (25° C.) with a fluorescence spectrometer F-4500 (Hitachi). Specifically, an emission spectrum with a wavelength range of 500 nm to 700 nm was obtained by irradiation of 455 nm excitation light. An emission peak wavelength (or "peak wavelength") was recorded from the emission spectrum so obtained.

<Excitation Spectrum>

Excitation spectrum measurement was performed at room temperature (25° C.) with a fluorescence spectrometer F-4500 (Hitachi). Specifically, an excitation spectrum with a wavelength range of 300 nm to 550 nm was obtained while monitoring a red emission peak. For example, in Example 1 below, an excitation spectrum with a wavelength range of 300 nm to 550 nm was obtained while monitoring a red emission peak at 632 nm.

{Quantum Efficiency}

<Absorption Efficiency $\alpha_q$, Internal Quantum Efficiency $\eta_i$, and External Quantum Efficiency $\eta_o$>

In order to determine quantum efficiency (absorption efficiency $\alpha_q$, internal quantum efficiency $\eta_i$, and external quantum efficiency $\eta_o$), a measurement target phosphor sample (for example, a phosphor powder) was packed in a cell while making sure that the surface was sufficiently smooth to ensure measurement accuracy, and installed in a light-collecting device such as an integrating sphere.

A Xe lamp as an excitation light source for the phosphor sample was installed in the light-collecting device. Light was adjusted with a filter, a monochrometer (grating spectrometer), or other such elements so that the light source emitted monochromatic light with an emission peak wavelength of 455 nm.

The measurement target phosphor sample was irradiated with light of the adjusted emission peak wavelength from the light source, and the spectrum containing the emitted light (fluorescence) and reflected light was measured with a spectrometer (MCPD 7000, Otsuka Electronics).

<Absorption Efficiency $\alpha_q$>

Absorption efficiency $\alpha_q$ was calculated as a ratio of the number of photons $N_{abs}$ of the excitation light absorbed by the phosphor sample divided by the total number of photons N of the excitation light.

Specifically, calculations were made by following the procedures below.

First, the total number of photons N of the excitation light was determined as follows.

Specifically, a material with nearly 100% reflectance R for the excitation light (for example, a white reflector such as the Labsphere product Spectralon with 98% reflectance R for 455 nm excitation light) was installed as a measurement target in the light-collecting device in the manner described above for the phosphor sample, and the reflection spectrum was measured with the spectrometer (the reflection spectrum will be referred to as "$I_{ref}(\lambda)$").

The reflection spectrum $I_{ref}(\lambda)$ was used to solve the Formula I below. The interval of integration of Formula I was 435 nm to 465 nm. The value of Formula I is proportional to the total number of photons N of the excitation light.

[Math. 1]

$$\frac{1}{R}\int \lambda \cdot I_{ref}(\lambda)d\lambda \qquad \text{(Formula I)}$$

Separately, the following Formula II was solved by using reflection spectrum I (λ), which was obtained from the phosphor sample installed in the light-collecting device to measure absorption efficiency $\alpha_q$. Formula II had the same interval of integration as Formula I. The value of Formula II is proportional to the number of photons $N_{abs}$ of the excitation light absorbed by the phosphor sample.

[Math. 2]

$$\frac{1}{R}\int \lambda \cdot I_{ref}(\lambda)d\lambda - \int \lambda \cdot I(\lambda)d\lambda \qquad \text{(Formula II)}$$

Absorption efficiency $\alpha_q$ was calculated as follows.

Absorption efficiency $\alpha_q = N_{abs}/N$=(Formula II)/(Formula I)

<Internal Quantum Efficiency $\eta_i$>

Internal quantum efficiency $\eta_i$ was calculated as a ratio of the number of photons $N_{PL}$ of fluorescence origin divided by the number of photons $N_{abs}$ absorbed by the phosphor sample.

The following Formula (III) was solved by using the I (λ) above. The lower limit of the interval of integration of Formula III was 466 nm to 780 nm. The value of Formula III is proportional to the number of photons $N_{PL}$ of fluorescence origin.

[Math. 3]

$$\int \lambda \cdot I(\lambda)d\lambda \qquad \text{(Formula III)}$$

Internal quantum efficiency $\eta_i$ was calculated by using the following equation.

$\eta_i$=(Formula III)/(Formula II)

<External Quantum Efficiency $\eta_o$>

External quantum efficiency $\eta_o$ was calculated as the product of the absorption efficiency $\alpha_q$ and the internal quantum efficiency $\eta_i$ determined by using the foregoing procedures.

{Powder X-Ray Diffraction Measurement—Generic Identification—}

Powder X-ray diffraction measurement was performed in a precise fashion with the powder X-ray diffractometer X'Pert available from PANalytical. The measurement conditions are as follows. The measured data were processed with the data processing software X'Pert High Score (PANalytical) in an automatic background process performed with a bending filter tuned at 5.

CuKα tube

X-ray output=45 kV, 40 mA

Divergence slit=automatic, irradiation width 10 mm×10 mm

Detector=semiconductor array detector X'Celerator with Cu filter

Scan range 2θ=10 to 65 degrees

Read width=0.0167 degrees

Count time=10 seconds

Synthesis Example 1

Production of $K_2MnF_6$ $K_2MnF_6$ can be obtained from the following reaction formula, by using the method disclosed in Angew. Chem. 65, 304 (1953).

[Math. 4]

$$2KMnO_4 + 2KF + 10HF + 3H_2O_2 \xrightarrow{50\%\ aq\ HF} 2K_2MnF_6\downarrow + 8H_2O + 3O_2$$

Specifically, a KF powder or a $KHF_2$ powder was dissolved in hydrofluoric acid (47.3 weight %), and a $KMnO_4$ powder was added and dissolved in this solution. Dropping hydrogen peroxide water while stirring the solution formed a yellow precipitate upon reaching a $KMnO_4$ and $H_2O_2$ molar ratio of 1.5. The precipitate was washed with acetone, and dried at 130° C. for 1 hour to give $K_2MnF_6$.

The synthesized product $K_2MnF_6$ was used in the Examples and Comparative Examples below.

[Example of Phosphor Production]

The following describes an example of phosphor production according to the present invention. It should be noted, however, that the effects of the present invention derive from the composition elements, and the methods of production below are not intended to be limiting.

Example 1

$K_2MnF_6$ was dissolved in 15 ml of hydrofluoric acid (47.3 weight %) to obtain solution 1. Separately, $LiNO_3$, $Ca(NO_3)_2.4H_2O$, $Mg(NO_3)_2.6H_2O$, and $Al(NO_3)_3.9H_2O$ were dissolved in 5 ml of water to obtain solution 2.

Solution 2 was then added to solution 1 at room temperature under atmospheric pressure to yield a precipitate. The precipitate was filtered through a filter paper, and washed with water (10 ml). After being refiltered with a filter paper, the solid was dried at 150° C. for 2 hours to obtain a phosphor of Example 1. In the synthesis of Example 1, the starting composition of the composition elements was Li:Ca:Mg:Al:Mn=2:1:0.1:0.8:0.1 in terms of a molar ratio.

Figure 4:
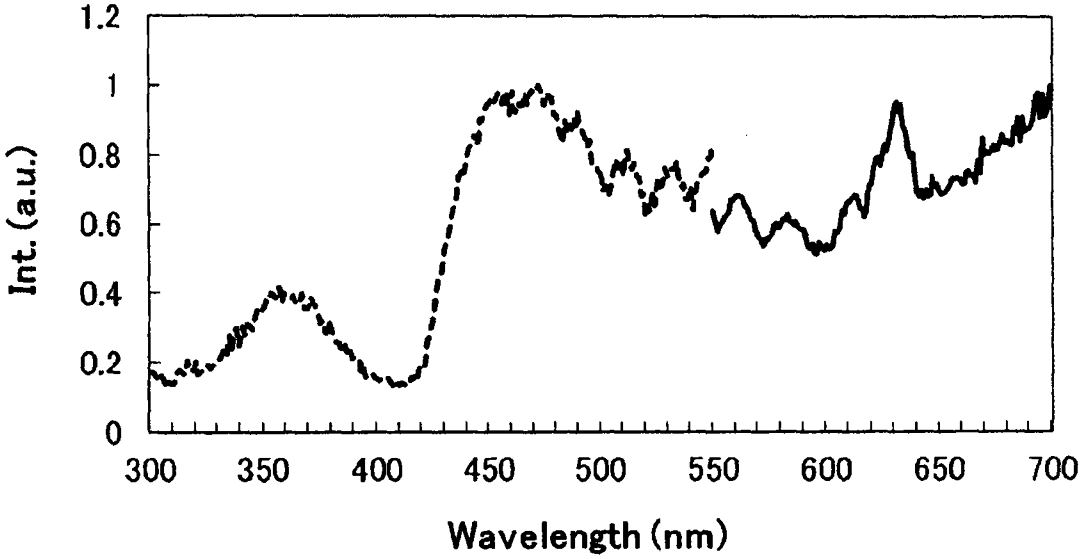
FIG. 4 represents the excitation spectrum (broken line) and the emission spectrum (solid line) of the phosphor of Example 1.

FIG. 4 represents the excitation spectrum (broken line) and the emission spectrum (solid line) of the phosphor of Example 1 measured at room temperature. As shown in FIG. 4, it can be seen from the excitation and fluorescence spectra that the phosphor of Example 1 was excited in the 300 to 500 nm wavelength region, and emitted red light with a 632 nm emission peak of a narrow half width occurring between 600 and 650 nm wavelengths.

Figure 5:
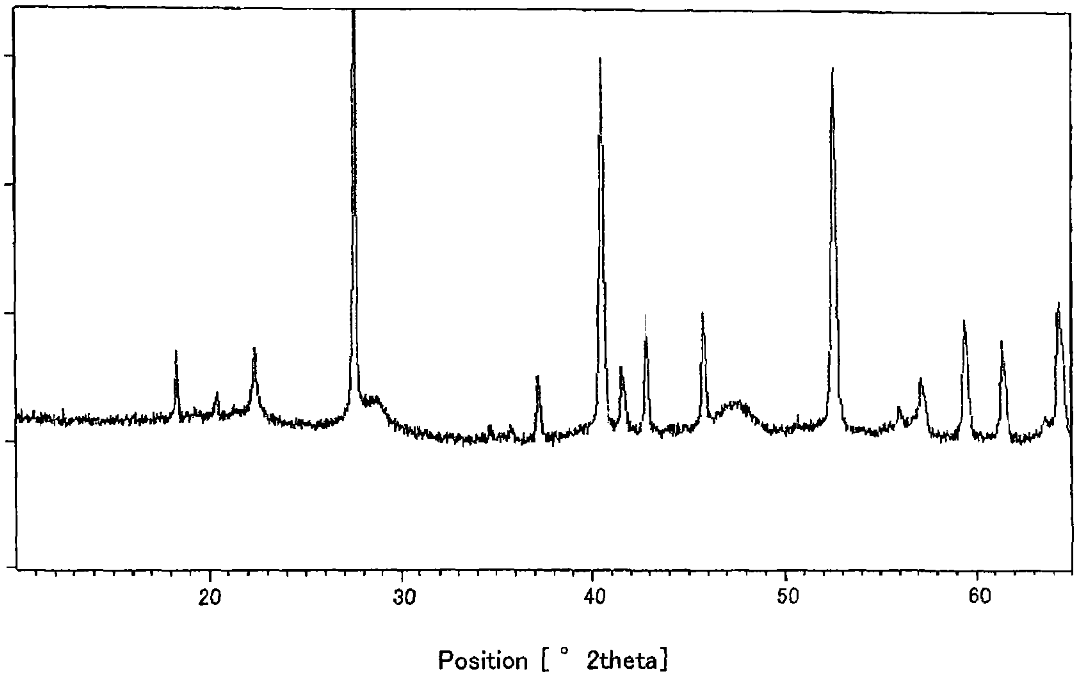
FIG. 5 represents the XRD pattern of the phosphor of Example 1.

FIG. 5 represents the XRD pattern of the phosphor of Example 1 after a powder X-ray diffraction measurement performed at room temperature. The XRD pattern revealed formation of a $LiCaAlF_6$ crystal phase.

Example 2

$K_2MnF_6$ was dissolved in 15 ml of hydrofluoric acid (47.3 weight %) to obtain solution 3. Separately, $LiNO_3$, $Sr(NO_3)_2$, $Mg(NO_3)_2.6H_2O$, and $Al(NO_3)_3.9H_2O$ were dissolved in 5 ml of water to obtain solution 4.

Solution 4 was then added to solution 3 at room temperature under atmospheric pressure to yield a precipitate. The precipitate was washed, filtered, and dried in the same manner as in Example 1 to obtain a phosphor of Example 2. In the synthesis of Example 2, the starting composition of the composition elements was Li:Sr:Mg:Al:Mn=2:1:0.1:0.8:0.1 in terms of a molar ratio.

Figure 6:
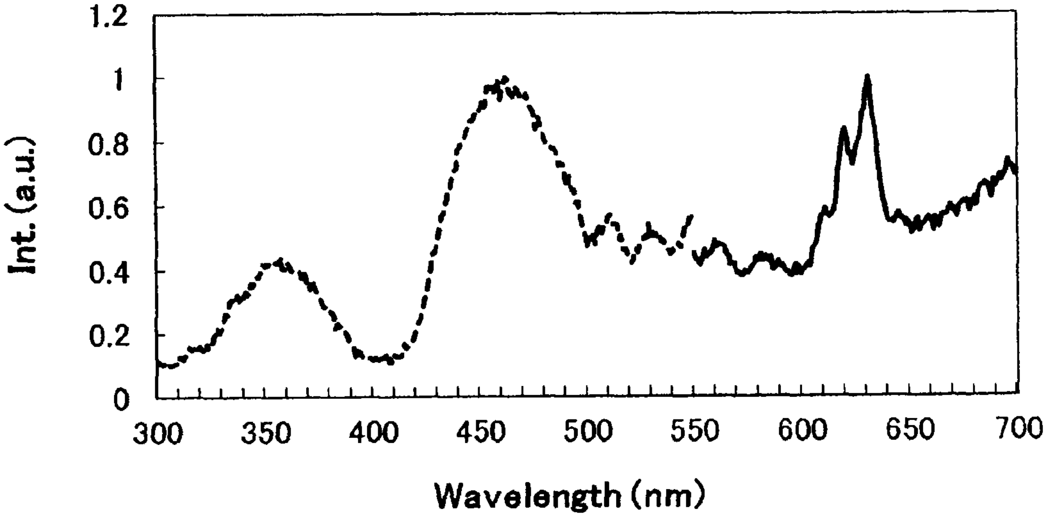
FIG. 6 represents the excitation spectrum (broken line) and the emission spectrum (solid line) of the phosphor of Example 2.

FIG. 6 represents the excitation spectrum (broken line) and the emission spectrum (solid line) of the phosphor of Example 2 measured at room temperature. As shown in FIG. 6, it can be seen from the excitation and fluorescence spectra that the phosphor of Example 2 was excited in a 300 to 500 nm wavelength region, and emitted red light with a 631 nm emission peak of a narrow half width occurring between 600 and 650 nm wavelengths.

Figure 7:
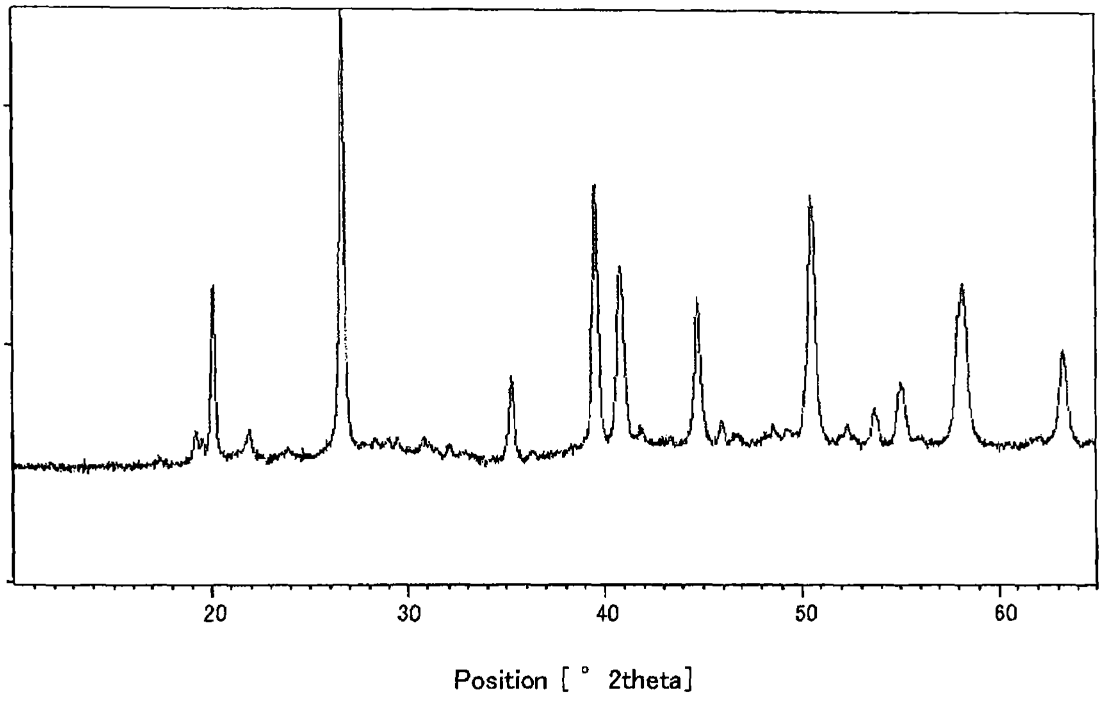
FIG. 7 represents the XRD pattern of the phosphor of Example 2.

FIG. 7 represents the XRD pattern of the phosphor of Example 2 after a powder X-ray diffraction measurement performed at room temperature. The XRD pattern revealed formation of a $LiSrAlF_6$ crystal phase.

Example 3

$(NH_4)_3AlF_6$ and $K_2MnF_6$ were dissolved in 15 ml of hydrofluoric acid (47.3 weight %) to obtain solution 5. Separately, $CH_3COOLi.2H_2O$, $(CH_3COO)_2Ba$, and $(CH_3COO)_2Mg.4H_2O$ were dissolved in 5 ml of water to obtain solution 6.

Solution 6 was then added to solution 5 at room temperature under atmospheric pressure to yield a precipitate. The precipitate was washed, filtered, and dried in the same manner as in Example 1 to obtain a phosphor of Example 3. In the synthesis of Example 3, the starting composition of the composition elements was Li:Ba:Mg:Al:Mn=4:0.5:0.1:0.8:0.1 in terms of a molar ratio.

Figure 8:
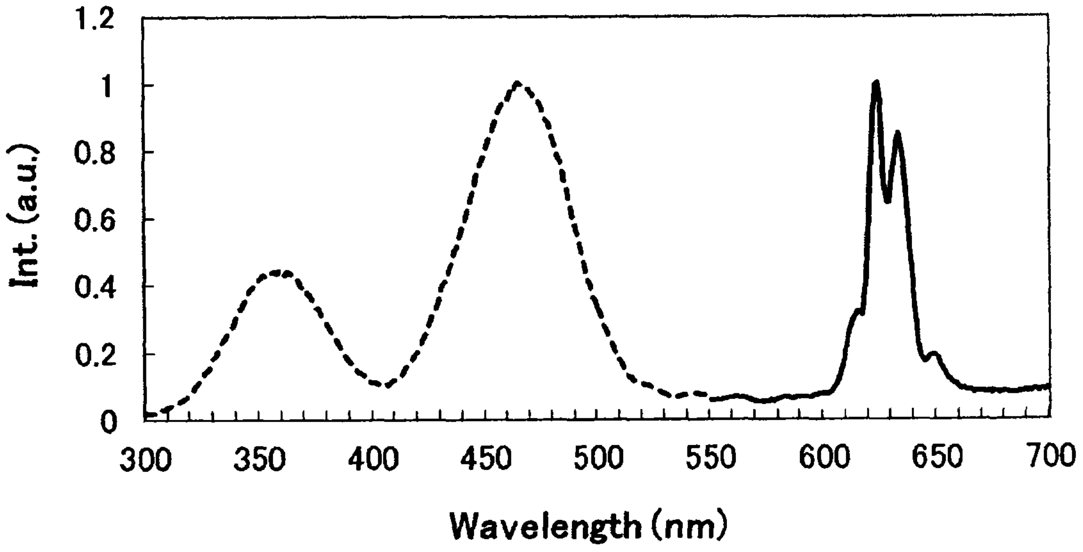
FIG. 8 represents the excitation spectrum (broken line) and the emission spectrum (solid line) of the phosphor of Example 3.

FIG. 8 represents the excitation spectrum (broken line) and the emission spectrum (solid line) of the phosphor of Example 3 measured at room temperature. As shown in FIG. 8, it can be seen from the excitation and fluorescence spectra that the phosphor of Example 3 was excited in a 300 to 500 nm wavelength region, and emitted red light with a 624 nm emission peak of a narrow half width occurring between 600 and 650 nm wavelengths.

Figure 9:
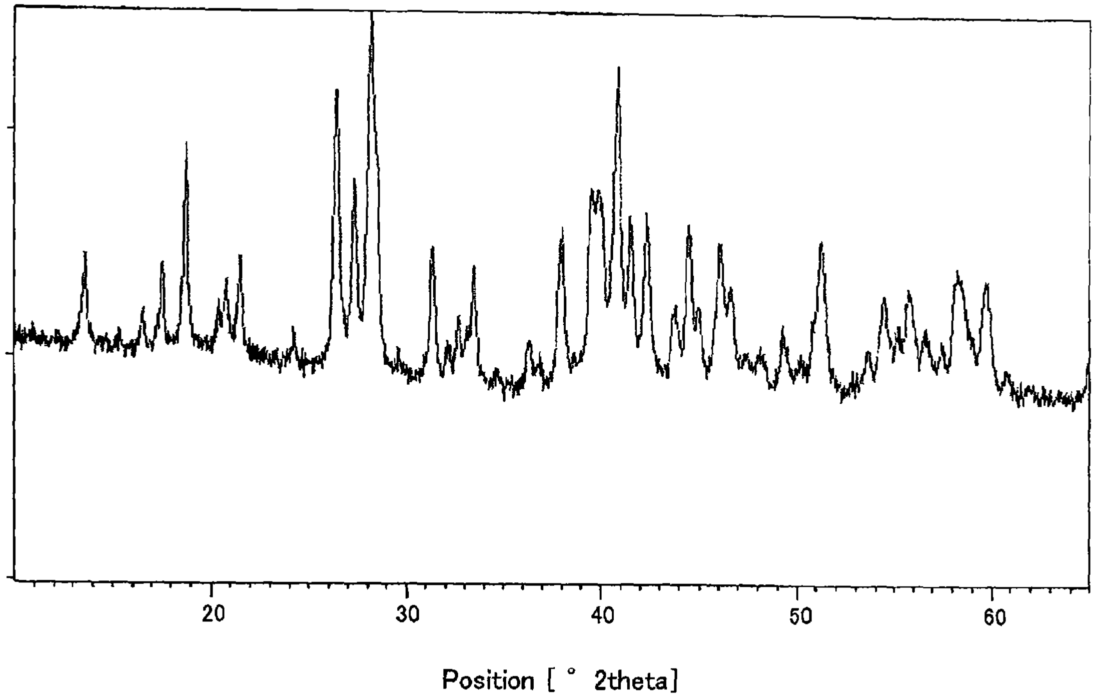
FIG. 9 represents the XRD pattern of the phosphor of Example 3.

FIG. 9 represents the XRD pattern of the phosphor of Example 3 after a powder X-ray diffraction measurement performed at room temperature. The XRD pattern revealed formation of a $LiBaAlF_6$ crystal phase.

Example 4

$(NH_4)_3AlF_6$, $K_2MnF_6$, and $NaHF_2$ were dissolved in 10 ml of hydrofluoric acid (47.3 weight %).

A $BaCO_3$ powder was then added to the solution at room temperature under atmospheric pressure to yield a precipitate. The precipitate was filtered through a filter paper, and washed with ethanol (10 ml). After being refiltered with a filter paper, the solid was dried at 150° C. for 2 hours to obtain a phosphor of Example 4. In the synthesis of Example 4, the starting composition of the composition elements was Na:Ba:Al:Mn=1:0.5:0.95:0.05 in terms of a molar ratio.

Figure 10:
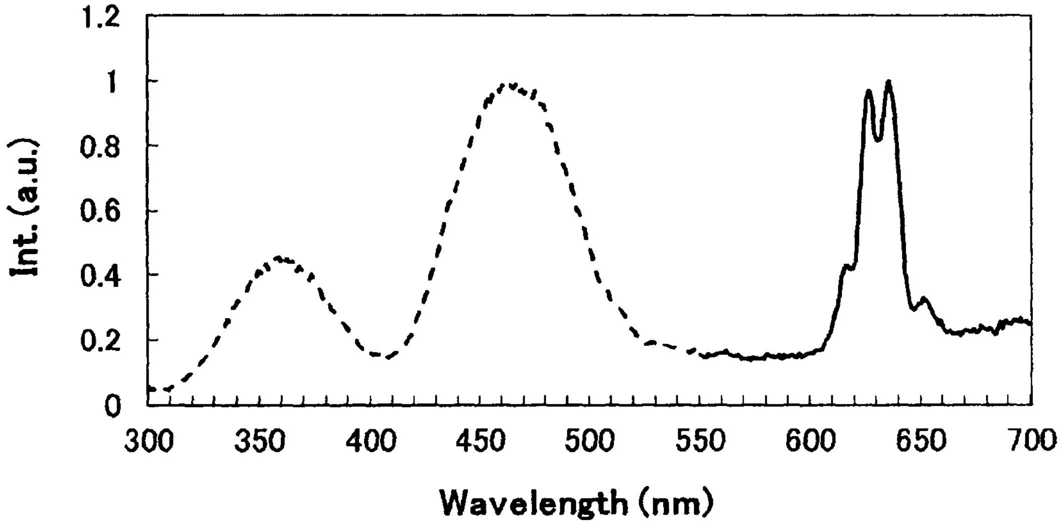
FIG. 10 represents the excitation spectrum (broken line) and the emission spectrum (solid line) of the phosphor of Example 4.

FIG. 10 represents the excitation spectrum (broken line) and the emission spectrum (solid line) of the phosphor of Example 4 measured at room temperature. As shown in FIG. 10, it can be seen that the phosphor of Example 4 was excited in a 300 to 500 nm wavelength region, and emitted red light with a 635 nm emission peak of a narrow half width occurring between 600 and 650 nm wavelengths.

Example 5

$(NH_4)_3AlF_6$, $K_2MnF_6$, and $NaHF_2$ were dissolved in 10 ml of hydrofluoric acid (47.3 weight %) to obtain solution 7. Separately, $MgCl_2.6H_2O$ was dissolved in 5 ml of water to obtain solution 8.

Solution 8 was then added to solution 7 at room temperature under atmospheric pressure to yield a precipitate. The precipitate was filtered and dried in the same manner as in Example 4, to obtain a phosphor of Example 5. In the synthesis of Example 5, the starting composition of the composition elements was Na:Mg:Al:Mn=2:1.05:0.9:0.05 in terms of a molar ratio.

Figure 11:
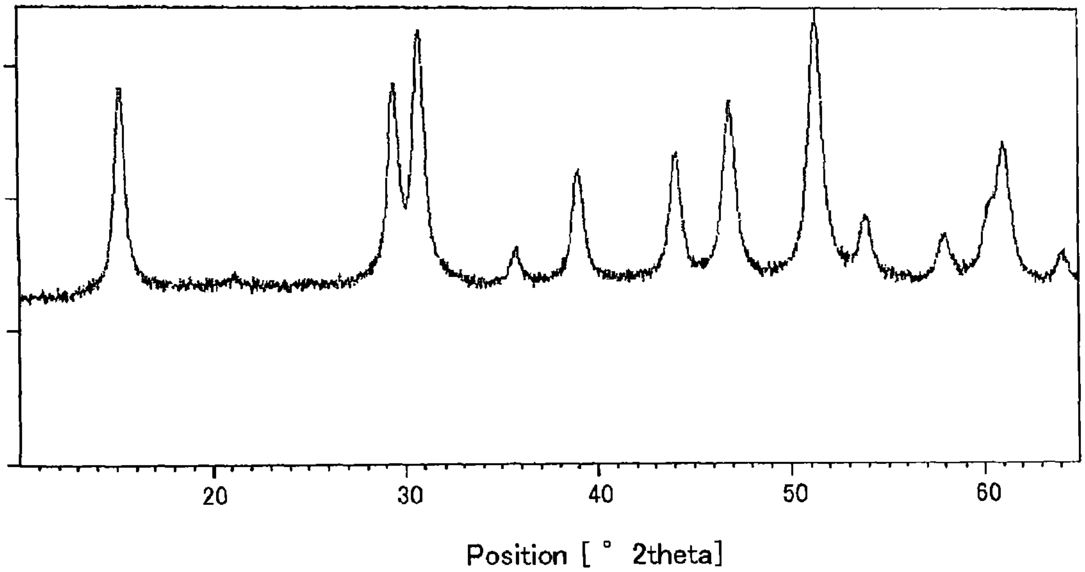
FIG. 11 represents the XRD pattern of the phosphor of Example 5.

FIG. 11 represents the XRD pattern of the phosphor of Example 5 after a powder X-ray diffraction measurement performed at room temperature. The XRD pattern revealed formation of a $Na_2MgAlF_7$ pyrochlore crystal phase.

Example 6

$K_2MnF_6$ was dissolved in 10 ml of hydrofluoric acid (47.3 weight %) to obtain solution 9. Separately, NaCl, $CaCl_2.2H_2O$, $MgCl_2.6H_2O$, and $AlCl_3.6H_2O$ were dissolved in 10 ml of water to obtain solution 10.

Solution 10 was then added to solution 9 at room temperature under atmospheric pressure to yield a precipitate. The precipitate was filtered and dried in the same manner as in Example 4, to obtain a phosphor of Example 6. In the synthesis of Example 6, the starting composition of the composition elements was Na:Ca:Mg:Al:Mn=3:1:3:0.95:0.05 in terms of a molar ratio.

Figure 12:
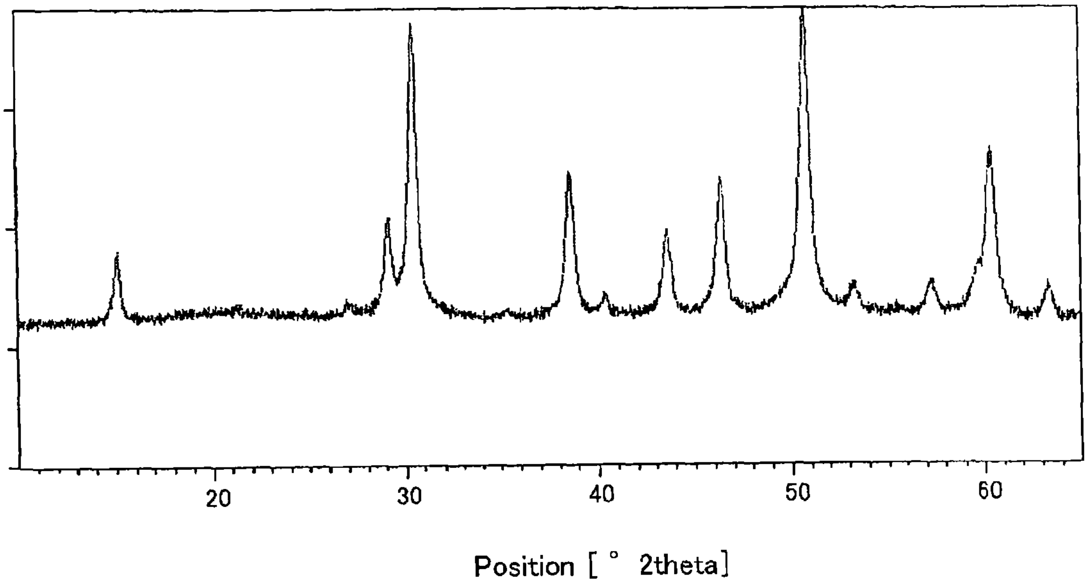
FIG. 12 represents the XRD pattern of the phosphor of Example 6.

FIG. 12 represents the XRD pattern of the phosphor of Example 6 after a powder X-ray diffraction measurement performed at room temperature. The XRD pattern revealed formation of the same pyrochlore crystal phase obtained in Example 5.

Example 7

$(NH_4)_3AlF_6$ and $K_2MnF_6$ were dissolved in 15 ml of hydrofluoric acid (47.3 weight %) to obtain solution 11. Separately, $(CH_3COO)Na$, $(CH_3COO)_2Ca.H_2O$, and $(CH_3COO)_2Mg.4H_2O$ were dissolved in 5 ml of water to obtain solution 12.

Solution 12 was then added to solution 11 at room temperature under atmospheric pressure to yield a precipitate. The precipitate was filtered through a filter paper, and washed with water (10 ml). Alter being refiltered with a filter paper, the solid was dried at 150° C. for 2 hours to obtain a phosphor of Example 7. In the synthesis of Example 7, the starting composition of the composition elements was Na:Ca:Mg:Al:Mn=6:0.9:3.1:0.9:0.1 in terms of a molar ratio.

Figure 13:
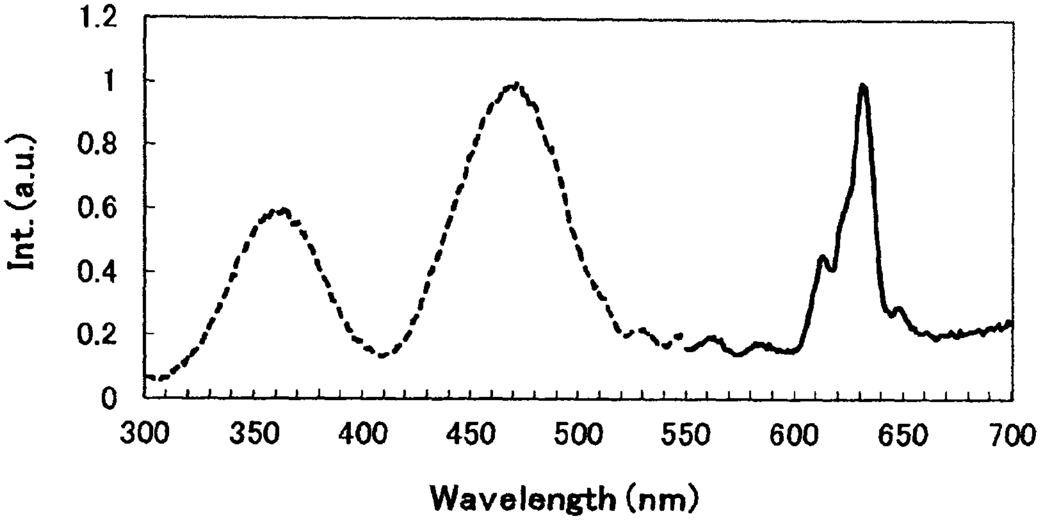
FIG. 13 represents the excitation spectrum (broken line) and the emission spectrum (solid line) of the phosphor of Example 7.

FIG. 13 represents the excitation spectrum (broken line) and the emission spectrum (solid line) of the phosphor of Example 7 measured at room temperature. As shown in FIG. 13, it can be seen from the excitation and fluorescence spectra that the phosphor of Example 7 was excited in a 300 to 500 nm wavelength region, and emitted red light with a 632 nm emission peak of a narrow half width occurring between 600 and 650 nm wavelengths.

Figure 14:
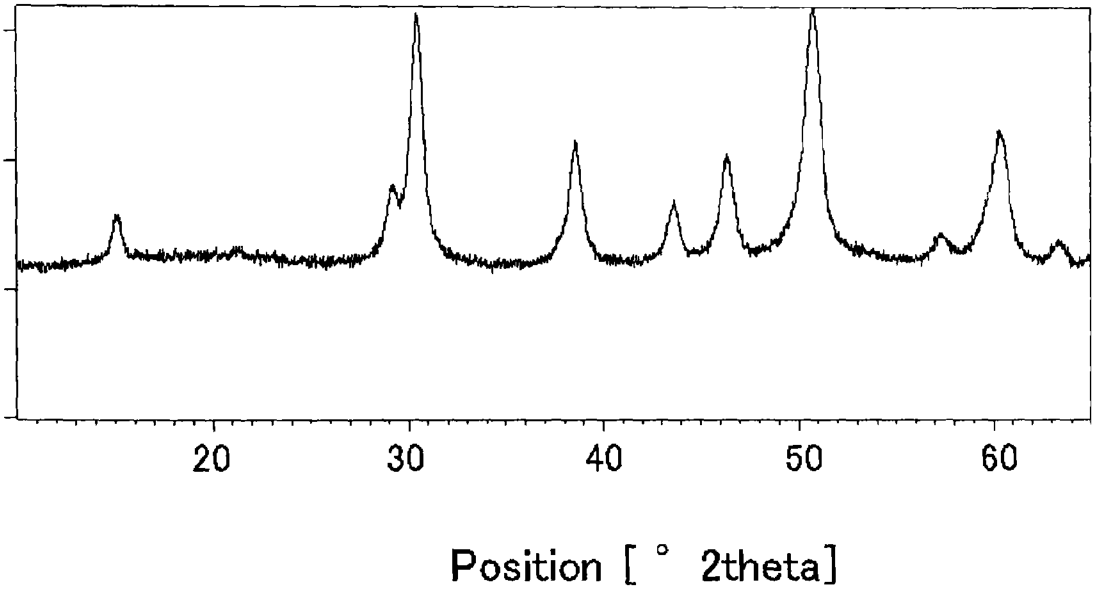
FIG. 14 represents the XRD pattern of the phosphor of Example 7.

FIG. 14 represents the XRD pattern of the phosphor of Example 7 after a powder X-ray diffraction measurement performed at room temperature. The XRD pattern was compared with an XRD pattern calculated upon X-ray irradiation at 1.54 Å wavelength with the atomic coordinates of $CaNa_3AlMg_3F_{14}$ crystals described in American Mineralogist, Volume 95, 736-740, 2010, and structure analysis software REITAN. There was a match in the XRD patterns, confirming that the phosphor synthesized in Example 7 was $CaNa_3AlMg_3F_{14}$.

Example 8

LiF, $MgF_2$, $(NH_4)_3AlF_6$, and $K_2MnF_6$ were added to 15 ml of hydrofluoric acid (47.3 weight %) to obtain solution 13. After adding a $BaCO_3$ powder, solution 13 was allowed to stand for 2 days, and the precipitate was filtered through a filter paper. The solid was then washed with ethanol (10 ml), filtered through a filter paper, and dried at 120° C. for 2 hours to obtain a phosphor of Example 8. In the synthesis of Example 8, the starting composition of the composition elements was Li:Ba:Mg:Al:Mn=2:0.5:0.1:0.8:0.1 in terms of a molar ratio.

Figure 15:
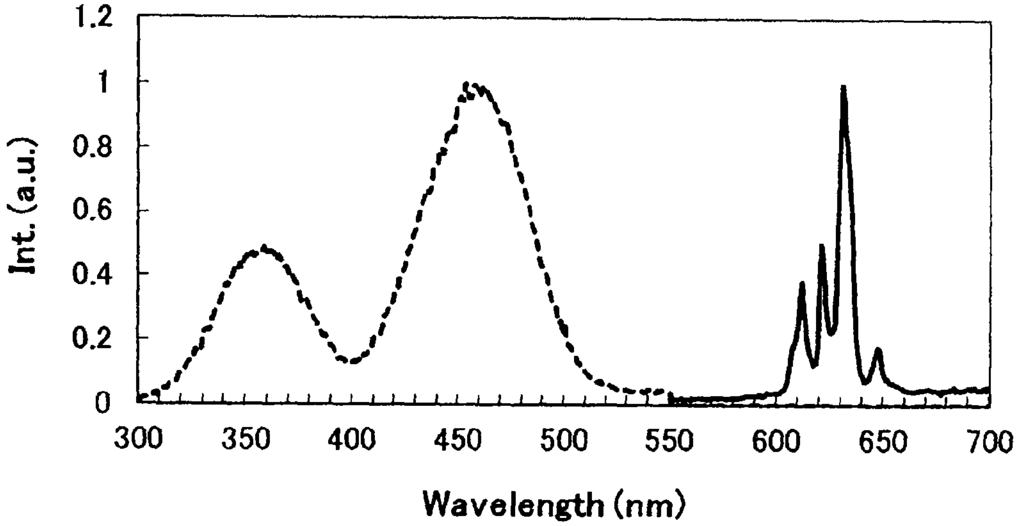
FIG. 15 represents the excitation spectrum (broken line) and the emission spectrum (solid line) of the phosphor of Example 8.

FIG. 15 represents the excitation spectrum (broken line) and the emission spectrum (solid line) of the phosphor of Example 8 measured at room temperature. As shown in FIG. 15, it can be seen from the excitation and fluorescence spectra that the phosphor of Example 8 was excited in a 300 to 500 nm wavelength region, and emitted red light with a 631 nm emission peak of a narrow half width occurring between 600 and 650 nm wavelengths.

Figure 16:
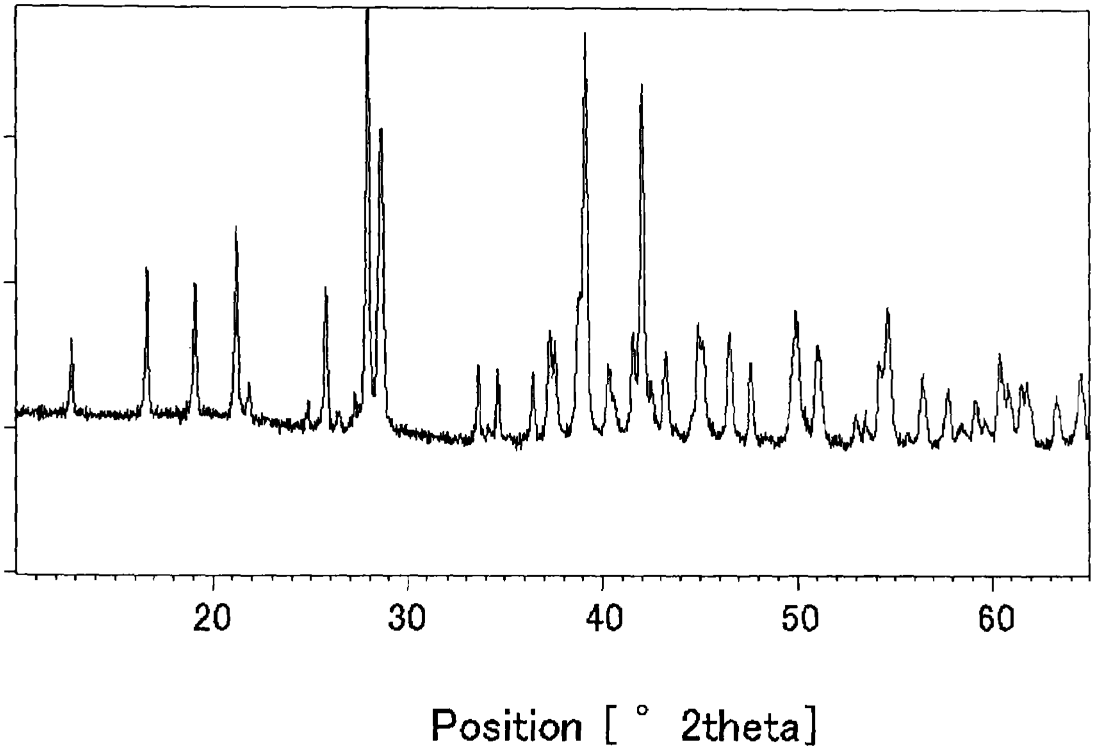
FIG. 16 represents the XRD pattern of the phosphor of Example 8.

FIG. 16 represents the XRD pattern of the phosphor of Example 8 after a powder X-ray diffraction measurement performed at room temperature. The element ratio was Li:Ba:Al:F=18:7:8:67 as determined by ICP elemental analysis.

Example 9

$(NH_4)_2SiF_6$, $K_2MnF_6$, and aluminum acetate were added to 10 ml of hydrofluoric acid (47.3 weight %) to obtain solution 14. Powders of $(CH_3COO)Na$ and $(CH_3COO)_2Ca.H_2O$ were then added to solution 14 to yield a precipitate.

The precipitate was filtered through a filter paper, and washed with ethanol (10 ml). After being refiltered with a filter paper, the solid was dried at 150° C. for 2 hours to obtain a phosphor of Example 9. In the synthesis of Example 9, the starting composition of the composition elements was Na:Ca:Al:Si:Mn=3:1:1:0.9:0.1 in terms of a molar ratio. The chemical composition of the phosphor of Example 9 was analyzed by using a SEM-EDX technique with a SEM S-3400N (Hitachi) and an energy dispersive X-ray analyzer EDX (EX-250 x-act, Horiba Ltd.). Specifically, in the scanning electron microscopy (SEM) of the phosphor, the sample was irradiated with an electron beam with an acceleration voltage of 10 kV, and the characteristic X released from each element contained in the phosphor was detected for elemental analysis. The SEM-EDX compositional analysis confirmed that the phosphor of Example 9 had the composition Na:Ca:Al:Si=1.9:0.1:0.1:0.9.

Figure 17:
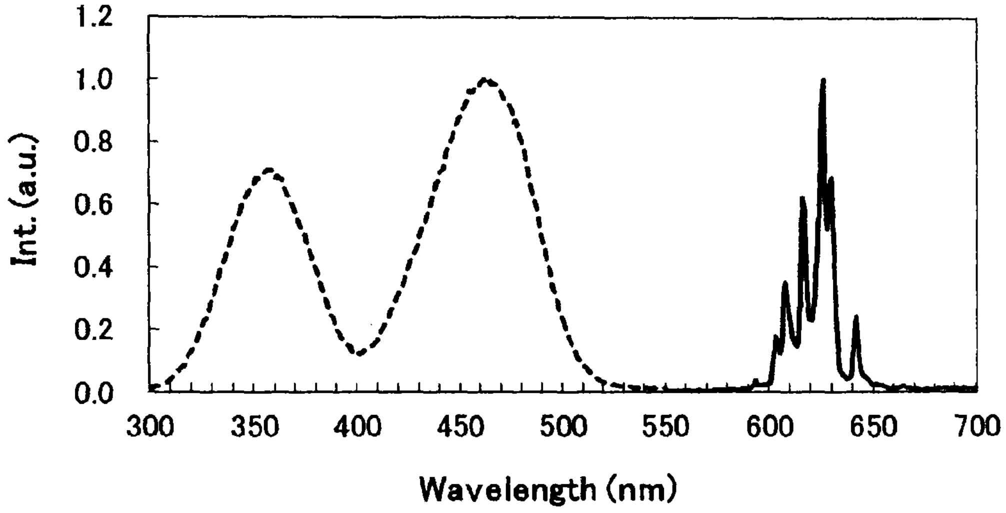
FIG. 17 represents the excitation spectrum (broken line) and the emission spectrum (solid line) of the phosphor of Example 9.

FIG. 17 represents the excitation spectrum (broken line) and the emission spectrum (solid line) of the phosphor of Example 9 measured at room temperature. As shown in FIG. 17, it can be seen from the excitation and fluorescence spectra that the phosphor of Example 9 was excited in a 300 to 500 nm wavelength region, and emitted red light with a 626 nm emission peak of a narrow half width occurring between 600 and 650 nm wavelengths.

Figure 18:
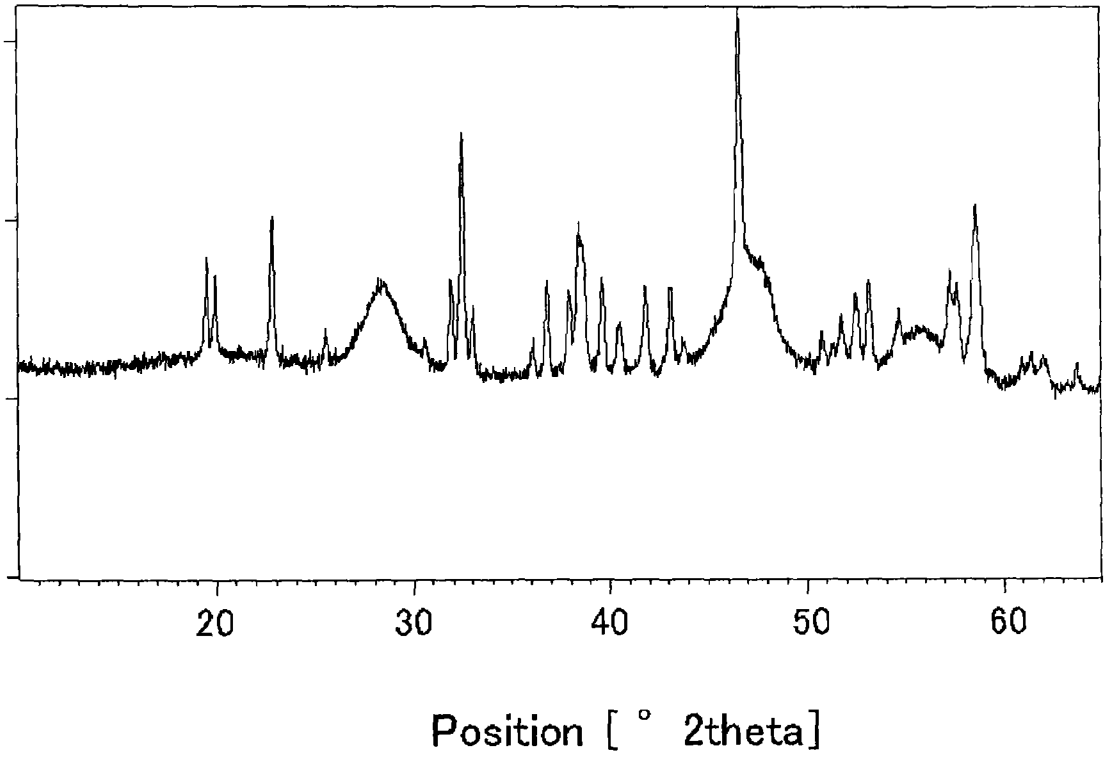
FIG. 18 represents the XRD pattern of the phosphor of Example 9.

FIG. 18 represents the XRD pattern of the phosphor of Example 9 after a powder X-ray diffraction measurement performed at room temperature. As can be seen from the XRD pattern, the phosphor despite sharing the same structure as $Na_2SiF_6$ involves a shift towards the lower angle, demonstrating that there is a solid solution substitution by Ca and Al.

Example 10

$SiO_2$, $Al(OH)_3$, $CaCO_3$, and $K_2MnF_6$ were added to 15 ml of hydrofluoric acid (47.3 weight %) to obtain solution 15. A powder of $NaHF_2$ was then added to solution 15 to yield a precipitate.

The precipitate was filtered through a filter paper, and washed with ethanol (10 ml). After being refiltered with a filter paper, the solid was dried at 150° C. for 2 hours to obtain a phosphor of Example 10. In the synthesis of Example 10, the starting composition of the composition elements was Na:Ca:Al:Si:Mn=3:1:1:2.4:0.1 in terms of a molar ratio. An SEM-EDX chemical composition analysis of the phosphor of Example 10 performed in the same manner as in Example 9 confirmed that the phosphor of Example 10 had the composition Na:Ca:Al:Si=1.95:0.05:0.05:0.95.

Figure 19:
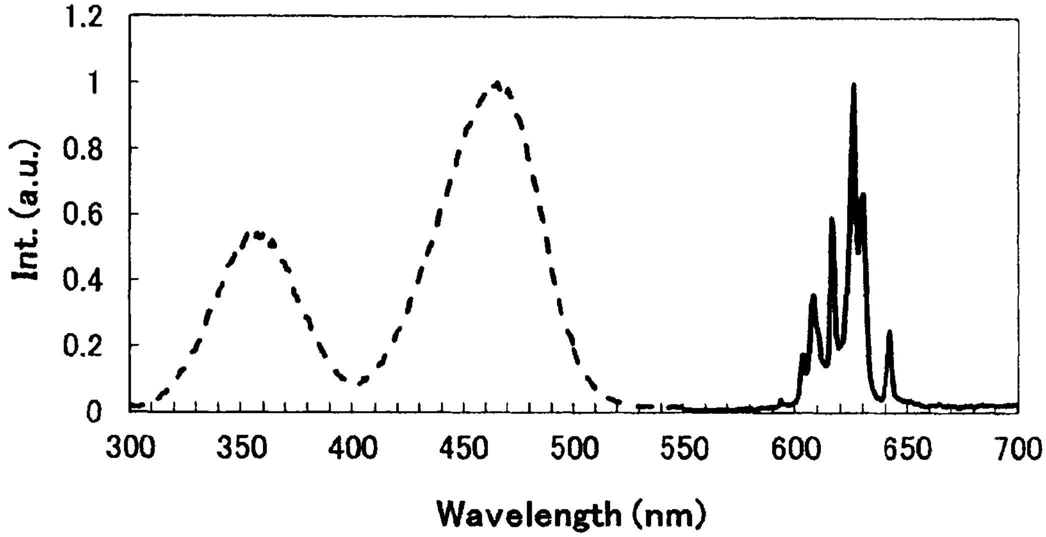
FIG. 19 represents the excitation spectrum (broken line) and the emission spectrum (solid line) of the phosphor of Example 10.

FIG. 19 represents the excitation spectrum (broken line) and the emission spectrum (solid line) of the phosphor of Example 10 measured at room temperature. As shown in FIG. 19, it can be seen from the excitation and fluorescence spectra that the phosphor of Example 10 was excited in a 300 to 500 nm wavelength region, and emitted red light with a 626 nm emission peak of a narrow half width occurring between 600 and 650 nm wavelengths.

Example 11

$GeO_2$, $(NH_4)_3AlF_6$, $CaCO_3$, and $K_2MnF_6$ were added to 10 ml of hydrofluoric acid (47.3 weight %) to obtain solution 16. Separately, $NaHF_2$ was added to 10 ml of hydrofluoric acid (47.3 weight %) to obtain solution 17. Solution 17 was then added to solution 16 to yield a precipitate.

The precipitate was filtered through a filter paper, and washed with ethanol (10 ml). After being refiltered with a filter paper, the solid was dried at 150° C. for 2 hours to obtain a phosphor of Example 11. In the synthesis of Example 11, the starting composition of the composition elements was Na:Ca:Al:Ge:Mn=2:0.1:0.1:0.95:0.05 in terms of a molar ratio. An SEM-EDX chemical composition analysis of the phosphor of Example 11 performed in the same manner as in Example 9 confirmed that the phosphor of Example 11 had the composition Na:Ca:Al:Ge=1.95:0.05:0.05:0.95.

Figure 20:
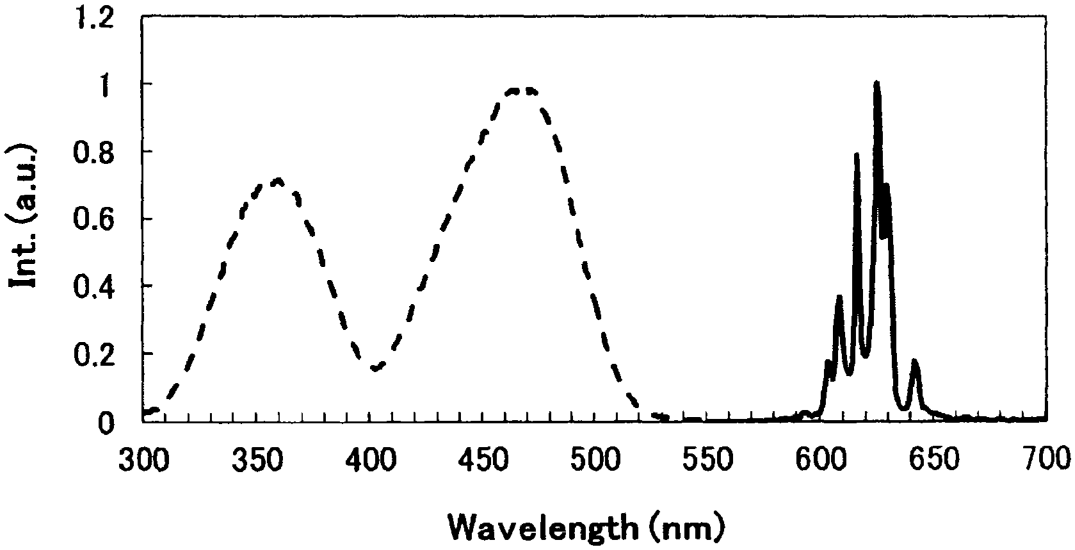
FIG. 20 represents the excitation spectrum (broken line) and the emission spectrum (solid line) of the phosphor of Example 11.

FIG. 20 represents the excitation spectrum (broken line) and the emission spectrum (solid line) of the phosphor of Example 11 measured at room temperature. As shown in FIG. 20, it can be seen from the excitation and fluorescence spectra that the phosphor of Example 11 was excited in a 300 to 500 nm wavelength region, and emitted red light with a 626 nm emission peak of a narrow half width occurring between 600 and 650 nm wavelengths.

Example 12

A phosphor of Example 12 was obtained in the same manner as in Example 11, except that $SrCO_3$ was used instead of $CaCO_3$. In the synthesis of Example 12, the starting composition of the composition elements was Na:Sr:Al:Ge:Mn=2:0.1:0.1:0.95:0.05 in terms of a molar ratio. An SEM-EDX chemical composition analysis of the phosphor of Example 12 performed in the same manner as in Example 9 confirmed that the phosphor of Example 12 had the composition Na:Sr:Al:Ge=1.95:0.05:0.05:0.95.

Figure 21:
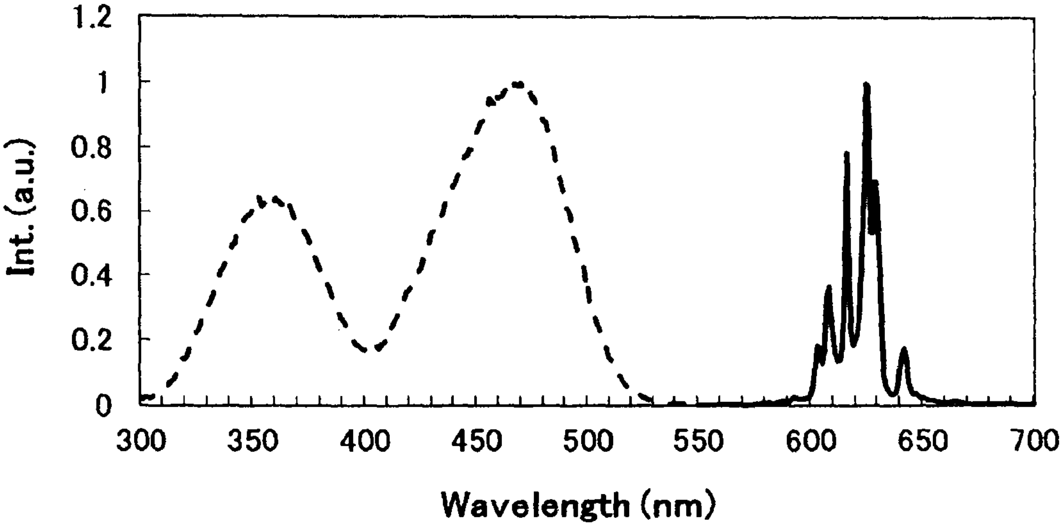
FIG. 21 represents the excitation spectrum (broken line) and the emission spectrum (solid line) of the phosphor of Example 12.

FIG. 21 represents the excitation spectrum (broken line) and the emission spectrum (solid line) of the phosphor of Example 12 measured at room temperature. As shown in FIG. 21, it can be seen from the excitation and fluorescence spectra that the phosphor of Example 12 was excited in a 300 to 500 nm wavelength region, and emitted red light with a 626 nm emission peak of a narrow half width occurring between 600 and 650 nm wavelengths.

Example 13

A $H_2TiF_6$ aqueous solution, $CaCO_3$, and $K_2MnF_6$ were added to 6 ml of hydrofluoric acid (47.3 weight %) to obtain solution 18. Powders of $NaHF_2$ and $(NH_4)_3AlF_6$ were then added to solution 18 to yield a precipitate. The precipitate was filtered through a filter paper, and washed with ethanol (10 ml). After being refiltered with a filter paper, the solid was dried at 150° C. for 2 hours to obtain a phosphor of Example 13. In the synthesis of Example 13, the starting composition of the composition elements was Na:Ca:Ti:Ge:Mn=2:0.1:0.1:0.95:0.05 in terms of a molar ratio. An SEM-EDX chemical composition analysis of the phosphor of Example 13 performed in the same manner as in Example 9 confirmed that the phosphor of Example 13 had the composition Na:Ca:Al:Ti=1.98:0.02:0.02:0.98.

Figure 22:
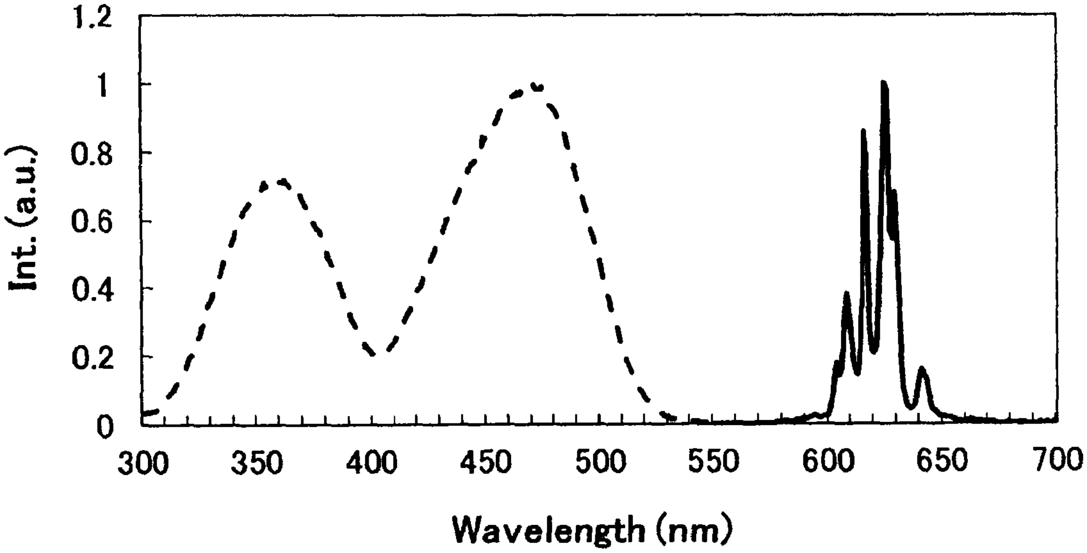
FIG. 22 represents the excitation spectrum (broken line) and the emission spectrum (solid line) of the phosphor of Example 13.

FIG. 22 represents the excitation spectrum (broken line) and the emission spectrum (solid line) of the phosphor of Example 13 measured at room temperature. As shown in FIG. 22, it can be seen from the excitation and fluorescence spectra that the phosphor of Example 13 was excited in a 300 to 500 nm wavelength region, and emitted red light with a 626 nm emission peak of a narrow half width occurring between 600 and 650 nm wavelengths.

Example 14

$SiO_2$, $Al(OH)_3$, $SrCO_3$, and $K_2MnF_6$ were added to 10 ml of hydrofluoric acid (47.3 weight %) to obtain solution 19. Separately, $KHF_2$ was added to 6 ml of hydrofluoric acid (47.3 weight %) to obtain solution 20. Solution 20 was then slowly added to solution 19 to yield a precipitate.

The precipitate was filtered through a filter paper, and washed with ethanol (10 ml). After being refiltered with a filter paper, the solid was fried at 150° C. for 2 hours to obtain a phosphor of Example 14. In the synthesis of Example 14, the starting composition of the composition elements was K:Sr:Al:Si:Mn=2:0.1:0.1:0.95:0.05 in terms of a molar ratio. An SEM-EDX chemical composition analysis of the phosphor of Example 14 performed in the same manner as in Example 9 confirmed that the phosphor of Example 14 had the composition K:Sr:Al:Si=1.98:0.02:0.02:0.98.

Figure 23:
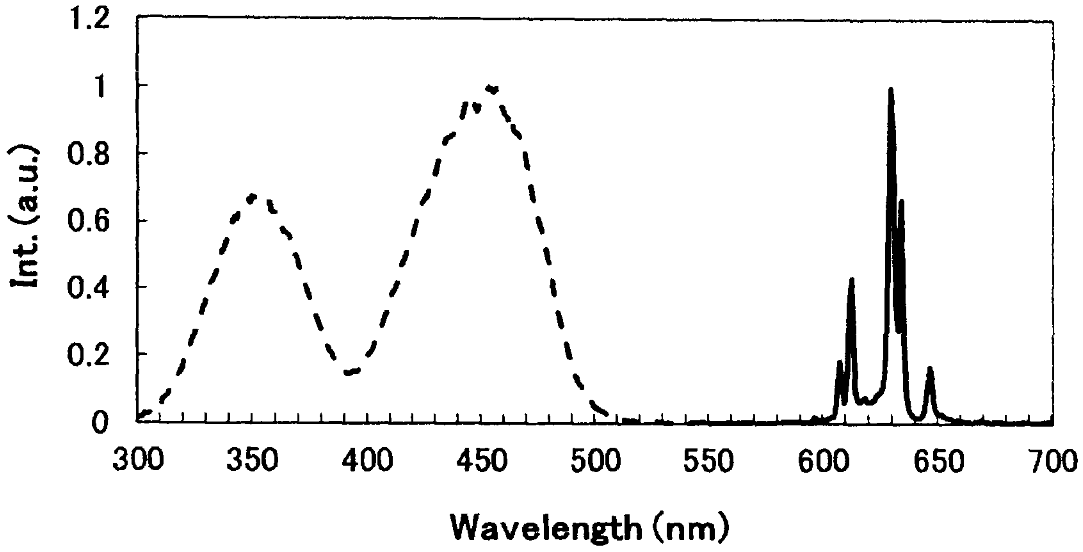
FIG. 23 represents the excitation spectrum (broken line) and the emission spectrum (solid line) of the phosphor of Example 14.

FIG. 23 represents the excitation spectrum (broken line) and the emission spectrum (solid line) of the phosphor of Example 14 measured at room temperature. As shown in FIG. 23, it can be seen from the excitation and fluorescence spectra that the phosphor of Example 14 was excited in a 300 to 500 nm wavelength region, and emitted red light with a 629 nm emission peak of a narrow half width occurring between 600 and 650 nm wavelengths.

Example 15

A $H_2TiF_6$ aqueous solution, $Al(OH)_3$, $SrCO_3$, and $K_2MnF_6$ were added to 10 ml of hydrofluoric acid (47.3 weight %) to obtain solution 21. Separately, $KHF_2$ was added to 6 ml of hydrofluoric acid (47.3 weight %) to obtain solution 22. Solution 22 was then slowly added to solution 21 to yield a precipitate.

The precipitate was filtered through a filter paper, and washed with ethanol (10 ml). After being refiltered with a filter paper, the solid was dried at 150° C. for 2 hours to obtain a phosphor of Example 15. In the synthesis of Example 15, the starting composition of the composition elements was K:Sr:Al:Ti:Mn=2:0.1:0.1:0.95:0.05 in terms of a molar ratio. An SEM-EDX chemical composition analysis of the phosphor of Example 15 performed in the same manner as in Example 9 confirmed that the phosphor of Example 15 had the composition K:Sr:Al:Ti=1.96:0.04:0.04:0.96.

Figure 24:
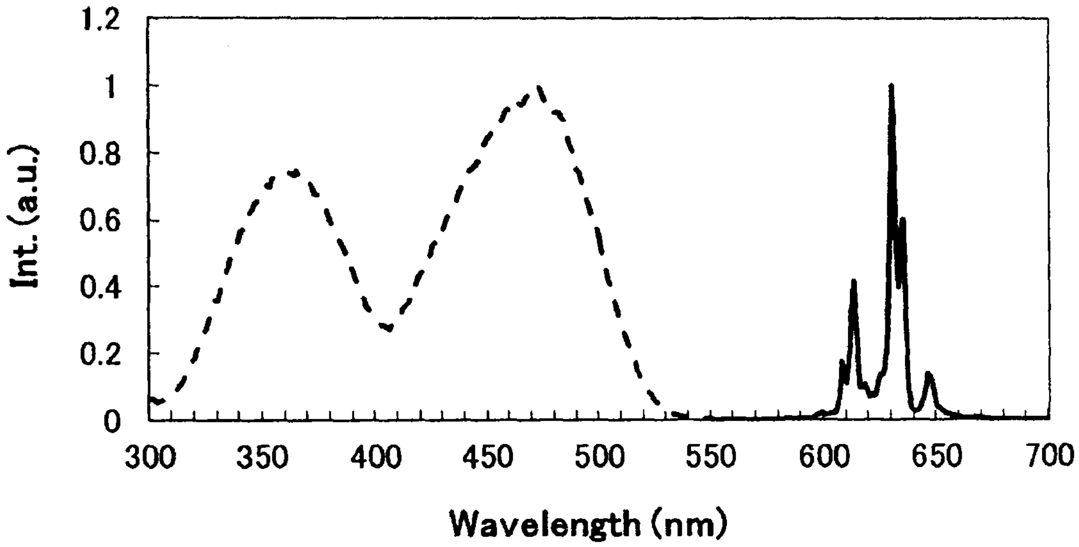
FIG. 24 represents the excitation spectrum (broken line) and the emission spectrum (solid line) of the phosphor of Example 15.

FIG. 24 represents the excitation spectrum (broken line) and the emission spectrum (solid line) of the phosphor of Example 15 measured at room temperature. As shown in FIG. 24, it can be seen from the excitation and fluorescence spectra that the phosphor of Example 15 was excited in a 300 to 500 nm wavelength region, and emitted red light with a 630 nm emission peak of a narrow half width occurring between 600 and 650 nm wavelengths.

Comparative Example 1

A Mn-activated $K_2TiF_6$ phosphor of Comparative Example 1 was obtained by using the method described in WO2009/099211.

Comparative Example 2

A Mn-activated $K_2SiF_6$ phosphor of Comparative Example 2 was obtained by using the method described in WO2009/099211.

Comparative Example 3

A Mn-activated $Na_3Li_2Al_3F_{12}$ phosphor of Comparative Example 3 was obtained by adding NaCl, $MgCl_2$, $AlCl_3$, LiCl, and $K_2MnF_6$ to hydrofluoric acid (47.3 weight %) by using the method described in WO2011/073871.

Figure 25:
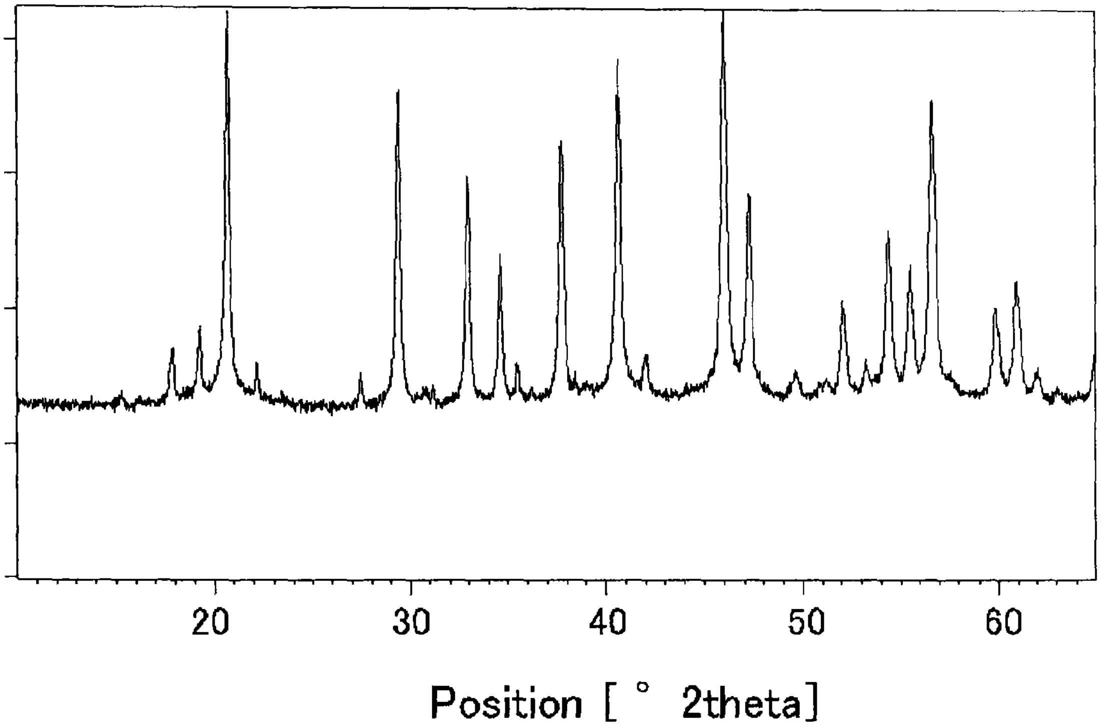
FIG. 25 represents the XRD pattern of the phosphor of Comparative Example 3.

FIG. 25 represents the XRD pattern of the phosphor of Comparative Example 3 after a powder X-ray diffraction measurement performed at room temperature.

The phosphors of Examples 1 to 3, and 7, and the phosphors of Comparative Examples 1 to 3 were measured for conductivity in the manner described below.

<Conductivity Measurement>

Table 9 summarizes the results of the conductivity measurements performed for the phosphors of the present invention.

The conductivity measurement was performed as follows.

The phosphor (0.1 g or more) was dispersed in 100 ml of water, and allowed to stand for at least 24 hours at room temperature to bring the eluted ions from the phosphor to saturation. A conductivity meter ES-12 (HORIBA) was used for the conductivity measurement.

The measurement was also performed with water that did not contain the phosphor.

TABLE 9

Conductivity in Dispersion of Phosphors of Examples and Comparative Examples in Water

| | Conductivity μS/cm |
|---|---|
| Phosphor-free water | 1.4 |
| Example 1 | 85 |
| Example 2 | 150 |
| Example 3 | 100 |
| Example 7 | 50 |
| Comparative Example 1 | 3500 |
| Comparative Example 2 | 1300 |
| Comparative Example 3 | 500 |

All measurements were preceded by conductivity measurement in phosphor-free water to ensure that conductivity would not be affected by water contamination or other such factors.

As shown in Table 9, the phosphors of the present invention have low conductivity values. This means that little elution had occurred in water. Specifically, the phosphors of the present invention were found to have high waterfastness.

Accordingly, a light-emitting unit containing the phosphor of the present invention has lower tendency to cause phosphor elution due to moisture, and the adverse effect on other materials as might occur because of deterioration of the phosphor itself, or generation of eluted materials due to phosphor deterioration can be reduced to provide high quality.

While the present invention has been described in detail through certain embodiments, it will be understood by a skilled person that various changes and modifications may be made thereto within the spirit and scope of the invention. This application is based on Japanese patent application No. 2012-283161 filed Dec. 26, 2012, No. 2013-045718 filed Mar. 7, 2013, and No. 2013-064724 filed Mar. 26, 2013, the entire contents of which are hereby incorporated by reference.

INDUSTRIAL APPLICABILITY

The present invention has use in any field where light is used. For example, the present invention may preferably be used in a wide range of applications from indoor and outdoor illuminations to cell phones, home electrical appliances, and image display devices of various electronic devices such as displays for outdoor use.

REFERENCE SIGNS LIST

1: Phosphor-containing portion (second illuminant)
2: Excitation light source (first illuminant; LD)
3: Substrate
4: Light-emitting unit
5: Mount lead
6: Inner lead
7: Excitation light source (first illuminant)
8: Phosphor-containing portion
9: Conductive wire
10: Molded member
11: Surface-emitting lighting device
12: Holding casing
13: Light-emitting unit
14: Diffusion plate
22: Excitation light source (first illuminant)
23: Phosphor-containing portion (second illuminant)
24: Frame
25: Conductive wire
26: Electrode
27: Electrode

The invention claimed is:

1. A phosphor, comprising a crystal phase having a chemical composition represented by the following formula [1], and having an emission peak in a wavelength range of 600 nm to 650 nm, $$A_aB_bC_cD_dX_x:R \quad \text{formula [1],}$$

wherein

A represents one or more alkali metal elements,

B represents one or more alkaline earth metal elements,

C represents one or more elements selected from the group consisting of Group 3 elements and Group 13 elements of the periodic table, D represents one or more elements selected from the group consisting of Group 4 elements and Group 14 elements of the periodic table, X represents one or more halogen elements that include at least F, R represents an element that includes at least a tetravalent Mn, and a, b, c, d, and x each represent a number that satisfies $$0<a<2,$$

$$0<b<1,$$

$$0<c<1,$$

$$0<d\leq 1,$$

$$0.8\leq c+d\leq 1.2,$$

and $$5.0\leq x\leq 7.0.$$

2. A phosphor, comprising a crystal phase having a chemical composition represented by the following formula [2], the crystal phase having no garnet structure, and the phosphor having an emission peak in a wavelength range of 600 nm to 650 nm by being activated by at least $Mn^{4+}$, $$A^2_{aii}B^2_{bii}C^2_{cii}D^2_{dii}X^2_{xii}tm \quad \text{formula [2]},$$

wherein $A^2$ represents one or more alkali metal elements, $B^2$ represents one or more alkaline earth metal elements, $C^2$ represents one or more elements selected from the group consisting of Group 3 elements and Group 13 elements of the periodic table, $D^2$ represents one or more elements selected from the group consisting of Group 4 elements and Group 14 elements of the periodic table, $X^2$ represents one or more halogen elements, and aii, bii, cii, dii, and xii each represent a number that satisfies $$0\leq aii<1,$$

$$0<bii<1,$$

$$0<cii<1,$$

$$0\leq dii<1,$$

$$0<xii<1,$$

and $$aii+bii+cii+dii+xii=1.$$

3. The phosphor according to claim 2, wherein the ratio (Z2/Z8) of the number (Z2) of the alkaline earth metal elements contained as $B^2$ with respect to the total number (Z8) of elements contained in the phosphor is 0.05 or more, and the ratio (Z3/Z8) of the number (Z3) of the elements $C^2$ with respect to the total number (Z8) of elements contained in the phosphor is 0.02 or more.

4. The phosphor according to claim 2, wherein $B^2$ is one or more elements selected from the group consisting of Mg, Ca, Sr, and Ba, $C^2$ is one or more elements selected from the group consisting of Al, Ga, In, Sc, and Y, and $X^2$ is one or more halogen elements that include at least F.

5. The phosphor according to claim 2, wherein $C^2$ is one or more elements that include at least Al, and the ratio (Z4/Z8) of the number (Z4) of Al elements contained as $C^2$ with respect to the total number (Z8) of elements contained in the phosphor is 0.01 or more.

6. A phosphor, comprising a crystal phase having a chemical composition represented by the following formula [3], the crystal phase having no garnet structure, and the phosphor having an emission peak in a wavelength range of 600 nm to 650 nm, $$A^3_{aiii}B^3_{biii}C^3_{ciii}D^3_{diii}X^3_{xiii}Y^3_{diii}:R^3 \quad \text{formula [3]},$$

wherein $A^3$ represents one or more alkali metal elements, $B^3$ represents one or more alkaline earth metal elements, $C^3$ represents one or more elements selected from the group consisting of Group 3 elements and Group 13 elements of the periodic table, $D^3$ represents one or more elements selected from the group consisting of Group 4 elements and Group 14 elements of the periodic table, $X^3$ represents one or more halogen elements that include at least F, $Y^3$ represents one or more Group 16 elements of the periodic table, $R^3$ represents an element that includes at least a tetravalent Mn, and aiii, biii, ciii, diii, and xiii each represent a number that satisfies $$0.8\leq aiii\leq 1.2,$$

$$0.8\leq biii\leq 1.2,$$

$$0\leq ciii\leq 1.2,$$

$$0\leq diii\leq 1,$$

$$0.8\leq ciii+diii\leq 1.2,$$

$$5.0\leq xiii\leq 7.0,$$

and $$5.0\leq xiii+diii\leq 7.0.$$

7. The phosphor according to claim 6, wherein $A^3$ is one or more elements selected from the group consisting of Li, Na, K, Rb, and Cs, $B^3$ is one or more elements selected from the group consisting of Mg, Ca, Sr, and Ba, $C^3$ is one or more elements selected from the group consisting of Al, Ga, ln, Sc, and Y, and $X^3$ is one or more halogen elements that include at least F.

8. The phosphor according to claim 6, wherein $D^3$ is one or more elements selected from the group consisting of Ti, Zr, Hf, Si, Ge, and Sn, and $Y^3$ includes at least O.

9. The phosphor according to claim 6, wherein the chemical composition represented by the formula [3]is represented by the following formula [4], $$(A^4_{aiv}B^4_{biv},)_2(C^4_{civ}D^4_{div}E^4_{eiv})_2(x^4_{xiv}\ Y^4_{yiv})_7:R^4 \quad \text{formula [4]}$$

wherein $A^4$ represents one or more alkali metal elements, $B^4$ represents one or more alkaline earth metal elements, $C^4$ represents one or more alkaline earth metal elements different from $B^4$, $D^4$ represents one or more elements selected from the group consisting of Group 3 elements and Group 13 elements of the periodic table, $E^4$ represents one or more elements selected from the group consisting of Group 4 elements and Group 14 elements of the periodic table, $X^4$ represents one or more halogen elements that include at least F, $Y^4$ represents one or more Group 16 elements of the periodic table, $R^4$ represents an element that includes at least a tetravalent Mn, and aiv, biv, civ, div, eiv, xiv, and yiv each represent a number that satisfies $0<aiv\leq 2.0,$ $0\leq biv\leq 1.0,$ $0<aiv+biv\leq 2.5,$ $0<civ\leq 2.0,$ $0<div\leq 2.0,$ $0\leq eiv\leq 1.0,$ $0.5\leq civ+div+eiv\leq 2.5,$ $0<xiv\leq 2.0,$ $0\leq yiv\leq 1.0,$ and $0.5\leq xiv+yiv\leq 2.5.$

10. The phosphor according to claim 9, wherein $A^4$ is one or more elements selected from the group consisting of Li, Na, K, Rb, and Cs, $B^4$ is an element that mainly includes one or more selected from the group consisting of Ca, Sr, and Ba, $C^4$ is an element that mainly includes Mg, $D^4$ is one or more elements selected from the group consisting of Al, Ga, In, Sc, and Y, and $X^4$ is one or more halogen elements that include at least F.

11. The phosphor according to claim 9, wherein $C^4$ is Mg.

12. The phosphor according to claim 9, wherein $E^4$ is one or more elements selected from the group consisting of Ti, Zr, Hf, Si, Ge, and Sn, and $Y^4$ includes at least O.

13. The phosphor according to claim 9, wherein the phosphor comprises a crystal phase having a pyrochlore structure.

14. A phosphor-containing composition, comprising the phosphor of claim 1, and a liquid medium.

15. A light-emitting unit, comprising a first illuminant, and a second illuminant that emits visible light upon exposure to light from the first illuminant, wherein the second illuminant comprises a first phosphor that includes one or more of the phosphor of claim 1.

16. The light-emitting unit according to claim 15, wherein the second illuminant comprises a second phosphor that includes one or more phosphors having an emission peak wavelength different from the emission peak wavelength of the first phosphor.

17. A lighting device, comprising the light-emitting unit of claim 15.

18. An image display device, comprising the light-emitting unit of claim 15.

* * * * *